US012750976B2

(12) United States Patent
Moon et al.

(10) Patent No.: US 12,750,976 B2
(45) Date of Patent: Sep. 29, 2026

(54) ELECTRONIC DEVICE INCLUDING THERMAL DIFFUSION MEMBER

(71) Applicant: SAMSUNG ELECTRONICS CO., LTD., Suwon-si (KR)

(72) Inventors: Heecheul Moon, Suwon-si (KR); Sangmin Kim, Suwon-si (KR); Moohyun Baek, Suwon-si (KR); Seunghoon Lee, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 208 days.

(21) Appl. No.: 18/740,128

(22) Filed: Jun. 11, 2024

(65) Prior Publication Data

US 2024/0365511 A1 Oct. 31, 2024

Related U.S. Application Data

(63) Continuation of application No. PCT/KR2024/005667, filed on Apr. 26, 2024.

(30) Foreign Application Priority Data

Apr. 26, 2023 (KR) ........................ 10-2023-0054844
May 31, 2023 (KR) ........................ 10-2023-0069890
Apr. 25, 2024 (KR) ........................ 10-2024-0055562

(51) Int. Cl.
*H05K 7/20* (2006.01)
*G06F 1/20* (2006.01)

(52) U.S. Cl.
CPC ......... *H05K 7/20336* (2013.01); *G06F 1/203* (2013.01)

(58) Field of Classification Search
CPC .................................................. H05K 7/20336
See application file for complete search history.

(56) References Cited

U.S. PATENT DOCUMENTS 9,693,444 B2 6/2017 Kim et al.
10,036,889 B2 7/2018 Border et al.
(Continued)

FOREIGN PATENT DOCUMENTS

CN 214627565 U 11/2021
EP 4099489 A1 12/2022
(Continued)

OTHER PUBLICATIONS

International Search Report (PCT/ISA/210) issued on Jul. 31, 2024 by the International Searching Authority in International Patent Application No. PCT/KR2024/005667.
(Continued)

*Primary Examiner* — Mukundbhai G Patel
(74) *Attorney, Agent, or Firm* — Sughrue Mion, PLLC

(57) ABSTRACT

An electronic device includes: a housing; a display disposed on one surface of the housing; a printed circuit board disposed in an interior of the housing; a battery disposed in one direction of the printed circuit board in the interior of the housing, the battery includes a first portion and a second portion located at an end facing the printed circuit board; and a thermal diffusion member between the printed circuit board and the display and between the battery and the display. The thermal diffusion member includes a first diffusion portion which at least a portion of overlaps with the printed circuit board and at least a portion extends in the first portion of the battery, and a second diffusion portion between the second portion of the battery and the first diffusion portion and extended to be overlapped with at least a portion of the second portion of the battery.

20 Claims, 29 Drawing Sheets

(56) References Cited

U.S. PATENT DOCUMENTS

| | | | | |
|---|---|---|---|---|
| 10,551,886 | B1 * | 2/2020 | de la Fuente | H05K 7/20963 |
| 10,616,387 | B2 | 4/2020 | Keen et al. | |
| 10,617,033 | B2 | 4/2020 | Min et al. | |
| 11,641,728 | B2 | 5/2023 | Jia | |
| 2015/0205334 | A1 * | 7/2015 | Chuang | G06F 1/1626 165/185 |
| 2015/0241935 | A1 | 8/2015 | Jang et al. | |
| 2016/0252937 | A1 * | 9/2016 | Yoshida | H04B 1/3833 361/679.26 |
| 2018/0261900 | A1 | 9/2018 | Kim et al. | |
| 2020/0084310 | A1 | 3/2020 | Keen et al. | |
| 2022/0253114 | A1 * | 8/2022 | Toyama | G06F 1/1626 |
| 2023/0026298 | A1 | 1/2023 | Ahn et al. | |
| 2023/0110427 | A1 | 4/2023 | Lee et al. | |
| 2023/0232587 | A1 | 7/2023 | Sun et al. | |

FOREIGN PATENT DOCUMENTS

| | | | |
|---|---|---|---|
| EP | 4231119 | A1 | 8/2023 |
| KR | 10-2013-0025671 | A | 3/2013 |
| KR | 10-2014-0031358 | A | 3/2014 |
| KR | 10-2018-0081272 | A | 7/2018 |
| KR | 10-1976180 | B1 | 5/2019 |
| KR | 10-2021-0156661 | A | 12/2021 |
| KR | 10-2362074 | B1 | 2/2022 |
| KR | 10-2022-0057206 | A | 5/2022 |
| KR | 10-2022-0068039 | A | 5/2022 |
| KR | 10-2022-0086263 | A | 6/2022 |
| KR | 10-2023-0013964 | A | 1/2023 |
| WO | 2022/065748 | A1 | 3/2022 |
| WO | 2022/131638 | A1 | 6/2022 |

OTHER PUBLICATIONS

Written Opinion (PCT/ISA/237) issued on Jul. 31, 2024 by the International Searching Authority in International Patent Application No. PCT/KR2024/005667.
Communication dated Dec. 3, 2025, issued by the European Patent Office in European Application No. 24797461.1.
Communication dated Dec. 3, 2025, issued by the European Patent Office in European Application No. 25180391.2.
Communication issued Jul. 14, 2025 by the European Patent Office in European Patent Application No. 24797461.1.
Communication issued Jul. 14, 2025 by the European Patent Office in European Patent Application No. 25180391.2.
Communication issued on May 15, 2026 by the United States Patent and Trademark Office (USPTO) in U.S. Appl. No. 18/785,959.

* cited by examiner

[C-C']

ELECTRONIC DEVICE INCLUDING THERMAL DIFFUSION MEMBER

CROSS-REFERENCE TO RELATED APPLICATIONS

This application is a continuation of International Application No. PCT/KR2024/005667, filed on Apr. 26, 2024, which based on and claims priority to Korean Patent Application No. 10-2023-0054844, filed on Apr. 26, 2023, in the Korean Intellectual Property Office, Korean Patent Application No. 10-2023-0069890, filed on May 31, 2023, in the Korean Intellectual Property Office, and Korean Patent Application No. 10-2024-0055562, filed on Apr. 25, 2024, in the Korean Intellectual Property Office, the disclosures of which are incorporated by reference herein in their entireties.

BACKGROUND

1. Field

The disclosure relates to an electronic device including a thermal diffusion member.

2. Description of the Related Art

Electronic devices (e.g., portable electronic devices) may include structures for thermal diffusion within them. An electronic device may diffuse heat generated by a printed circuit board to an area where a battery is positioned using a thermal diffusion member.

The thermal diffusion member may be disposed between internal components of the electronic device. The thermal diffusion member may be disposed to be extended between the printed circuit board and the display and between the battery and the display with a predetermined thickness.

Because of the miniaturization of electronic devices, electronic devices may only include a thermal diffusion member with a predetermined thickness. However, a thermal diffusion member with a predetermined thickness may not be sufficient to improve the thermal diffusion performance of an electronic device.

Therefore, there may be a need for thermal diffusion structures that can improve the thermal diffusion performance of electronic devices.

SUMMARY

Additional aspects will be set forth in part in the description which follows and, in part, will be apparent from the description, or may be learned by practice of the presented embodiments.

According to an aspect of the disclosure, an electronic device includes: a housing; a display disposed on one surface of the housing; a printed circuit board disposed in an interior of the housing; a battery disposed in one direction of the printed circuit board in an interior of the housing, the battery includes a first portion and a second portion, the second portion having a thickness less than a thickness of the first portion and the second portion being located at an end of the battery which faces the printed circuit board; and a thermal diffusion member disposed between the printed circuit board and the display and between the battery and the display, wherein the thermal diffusion member includes a first diffusion portion which at least a portion of overlaps with the printed circuit board and which at least a portion of extends to in the first portion of the battery, and a second diffusion portion disposed between the second portion of the battery and the first diffusion portion and extended to be overlapping with at least a portion of the second portion of the battery.

The first diffusion portion may be extended along a length direction of the electronic device, and the second diffusion portion may be extended along a width direction of the electronic device.

The housing may include a support portion in which the second diffusion portion of the thermal diffusion member may be disposed therein, the second portion of the battery may be disposed on one surface of the support portion of the housing, and the second diffusion portion of the thermal diffusion member may be disposed on another surface of the support portion of the housing.

The support portion of the housing may include a first support portion disposed between the second diffusion portion of the thermal diffusion member and the second portion of the battery, and a second support portion including a first-second support portion and a second-second support portion, both being connected perpendicularly to the first support portion, the first-second support portion being disposed on one side of the first support portion and the second diffusion portion, and the second-second support portion being disposed on another side of the first support portion and the second diffusion portion that is different from the side of which the first-second support portion is disposed.

The support portion of the housing may further include a third support portion which may be extended in a direction opposite of the second support portion and face the second portion of the battery.

The electronic device may further include at least one flexible printed circuit board which may be disposed at least partially in the second portion of the battery.

The at least one flexible printed circuit board may be disposed in one direction of the second portion of the battery, and the second portion of the thermal diffusion member may be disposed in a direction opposite to the direction of the second portion of the battery which the at least one flexible printed circuit board is disposed.

The at least one flexible printed circuit board may include a flexible printed circuit board which may be configured to electrically connect the battery and the printed circuit board.

The thermal diffusion member may be integrally formed from the first diffusion portion and the second diffusion portion.

The housing may further include a placement space having a shape corresponding to at least a portion of the thermal diffusion member, and the portion of the thermal diffusion member may be disposed in the placement space.

The thermal diffusion member may be a first thermal diffusion member, the first thermal diffusion member may be disposed in the one direction of the printed circuit board, and the thermal diffusion member may further include a second thermal diffusion member, the second thermal diffusion member may have a first end in contact with the first thermal diffusion member and a second end opposite of the first end disposed in a direction opposite to the one direction of the printed circuit board.

According to an aspect of the disclosure, an electronic device includes: a display; a rear cover; a housing at least partially disposed between the display and the rear cover such that a first surface of the housing faces the display and a second surface, opposite to the first surface, faces the rear cover, the housing includes a placement space formed therein and a support portion formed on the second surface, the support portion includes a first support portion extended in a first direction perpendicular to the second surface and a second support portion extended from the first support portion in a second direction perpendicular to the first direction; a thermal diffusion member at least partially disposed in the placement space; a printed circuit board at least partially disposed in an interior of the housing at a first side facing a third direction between a first diffusion portion of the thermal diffusion member and the rear cover, the third direction being opposite to the second direction with respect to the first support portion; and a battery at least partially disposed at a second side facing the second direction with respect to the first support portion between a second diffusion portion of the thermal diffusion member and the rear cover, the battery includes a first battery portion having a first thickness and a second battery portion extended from the first battery portion in the third direction, the second battery portion having a second thickness less than the first thickness, the second battery portion is at least partially disposed between the second support portion and the rear cover, and the second support portion is at least partially disposed between the second diffusion portion of the thermal diffusion member and the second battery portion.

When viewed in the first direction, the thermal diffusion member may overlap with the first battery portion, the second battery portion, the first support portion, the second support portion, and the printed circuit board.

The first support portion may be at least partially disposed between a third diffusion portion and the rear cover, the third diffusion portion being between the first diffusion portion and the second diffusion portion of the thermal diffusion member.

At least a part of the first support portion may protrude in the third direction.

The thermal diffusion member may include a vapor chamber.

The second battery portion may include a protection circuit module (PCM) configured to protect the battery from overcharge, over-discharge, and overcurrent.

The first battery portion may include a plurality of cells.

The electronic device may further include a flexible printed circuit board configured to electrically connect the printed circuit board and the second battery portion, the flexible printed circuit board may be at least partially disposed between the support portion and the rear cover.

The first diffusion portion and the second diffusion portion may be configured to diffuse heat generated by the printed circuit board to other areas of the electronic device.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
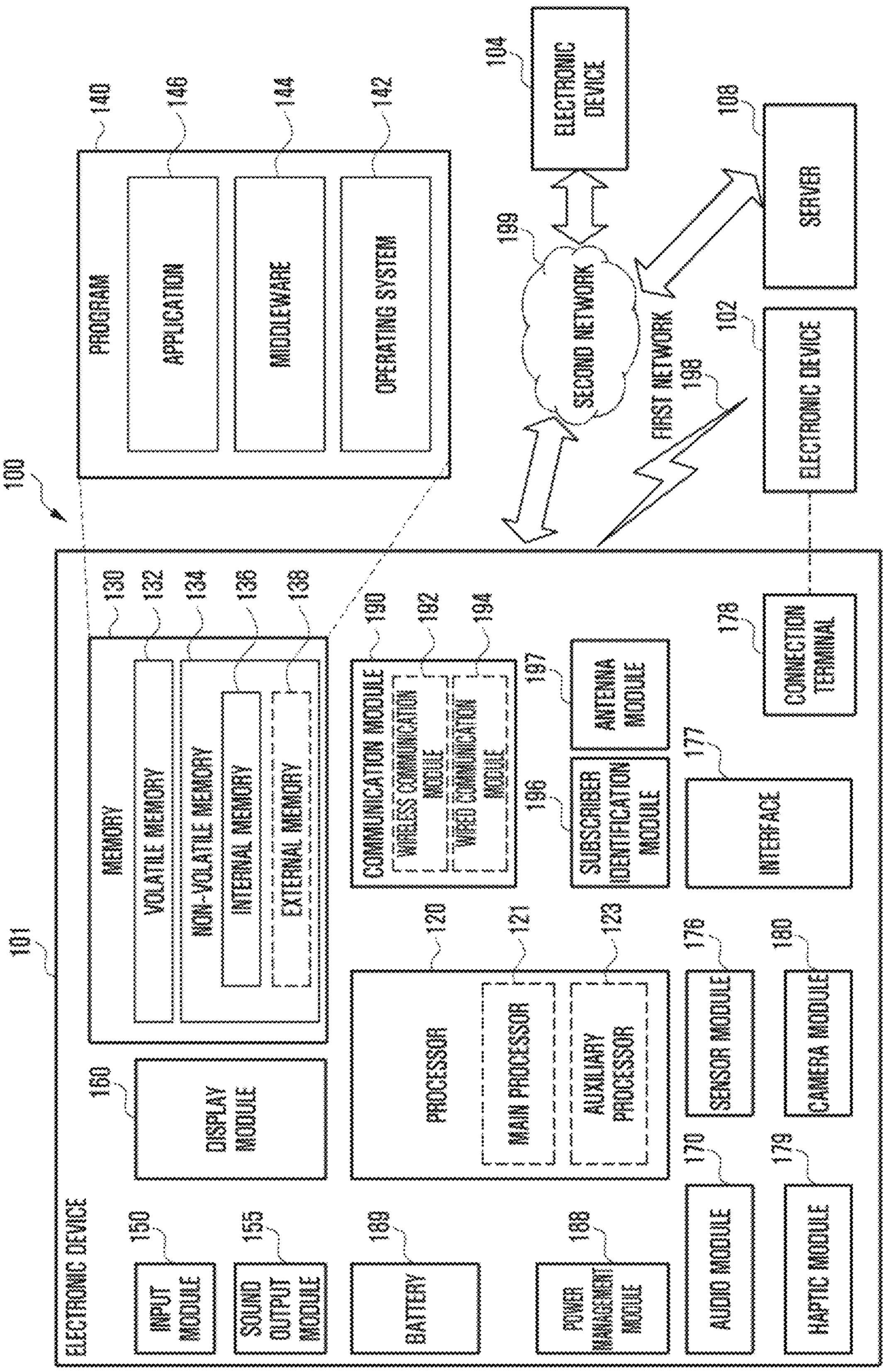
FIG. 1 is a block diagram of an electronic device in a networked environment according one or more embodiments.

FIG. 1 is a block diagram of an electronic device 101 in a network environment 100 according to one or more embodiments. With reference to FIG. 1, the electronic device 101 in the network environment 100 may communicate with an external electronic device 102 via a first network 198 (e.g., a short-range wireless communication network), or at least one of an external electronic device 104 or a server 108 via a second network 199 (e.g., a long-range wireless communication network). The electronic device 101 may communicate with the external electronic device 104 via the server 108. The electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, and/or an antenna module 197. According to one or more embodiments, at least one (e.g., the connection terminal 178) of the components may be omitted from the electronic device 101, or one or more other components may be added in the electronic device 101. According to one or more embodiments, some of the components may be implemented as single integrated circuitry. According to one or more embodiments, the sensor module 176, the camera module 180, or the antenna module 197 may be implemented as embedded in single component (e.g., the display module 160).

The processor 120 may execute software (e.g., a program 140) to control at least one other component (e.g., a hardware or software component) of the electronic device 101 coupled with the processor 120, and may perform various data processing or computation. As at least part of the data processing or computation, the processor 120 may load a command or data received from another component (e.g., the sensor module 176 or the communication module 190) in a volatile memory 132, process the command or the data stored in the volatile memory 132, and store resulting data in a non-volatile memory 134. The processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. The auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., a sleep) state, or together with the main processor 121 while the main processor 121 is in an active state (e.g., executing an application). The auxiliary processor 123 (e.g., an ISP or a CP) may be implemented as part of another component (e.g., the camera module 180 or the communication module 190) functionally related to the auxiliary processor 123. According to one or more embodiments, the auxiliary processor 123 (e.g., a neural network processing device) may include a hardware structure specified for processing an artificial intelligence model. The artificial intelligence model may be created through machine learning. Such learning may be performed in the electronic device 101 itself on which the artificial intelligence model is performed, or may be performed through a separate server (e.g., the server 108). The learning algorithms may include supervised learning, unsupervised learning, semi-supervised learning, or reinforcement learning, but is not limited thereto. The artificial intelligence model may include a plurality of artificial neural network layers. The artificial neural network may be any of a deep neural network (DNN), a convolutional neural network (CNN), a recurrent neural network (RNN), a restricted Boltzmann machine (RBM), a deep belief network (DBN), a bidirectional recurrent DNN (BRDNN), a deep Q-network, or a combination of two or more of the above-mentioned networks, but is not limited the above-mentioned configurations. In addition to the hardware structure, the artificial intelligence model may additionally or alternatively include a software structure.

The memory 130 may store various data used by at least one component (e.g., the processor 120 or the sensor module 176) of the electronic device 101. The various data may include software (e.g., the program 140) and input data or output data for a command related thereto. The memory 130 may include the volatile memory 132 or the non-volatile memory 134 or both volatile memory 132 and the non-volatile memory 134.

The program 140 may be stored in the memory 130 as software, and may include an operating system (OS) 142, middleware 144, and/or an application 146.

The input module 150 may receive a command or data to be used by another component (e.g., the processor 120) of the electronic device 101, from the outside (e.g., a user) of the electronic device 101. The input module 150 may include, a microphone, a mouse, a keyboard, a key (e.g., a button), or a digital pen (e.g., a stylus pen).

The sound output module 155 may output sound signals to the outside of the electronic device 101. The sound output module 155 may include a speaker or a receiver. The speaker may be used for general purposes, such as playing multimedia or playing record, and the receiver may be used for slide-in calls. The receiver may be implemented as separate from, or as part of the speaker.

The display module 160 may visually provide information to the outside (e.g., a user) of the electronic device 101. The display module 160 may include a display, a hologram device, or a projector and control circuitry to control a corresponding one of the display, hologram device, and projector. The display module 160 may include touch circuitry (e.g., a touch sensor) adapted to detect a touch, or sensor circuitry (e.g., a pressure sensor) adapted to measure the intensity of force incurred by the touch.

The audio module 170 may convert a sound into an electrical signal and vice versa. The audio module 170 may obtain the sound via the input module 150, or output the sound via the sound output module 155 or a headphone of an external electronic device (e.g., the external electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. The sensor module 176 may include a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the external electronic device 102) directly (e.g., wiredly) or wirelessly. The interface 177 may include a high-definition multimedia interface (HDMI), a universal serial bus (USB) interface, a secure digital (SD) card interface, and/or an audio interface.

The connecting terminal 178 may include a connector via which the electronic device 101 may be physically connected with the external electronic device (e.g., the external electronic device 102). The connecting terminal 178 may include an HDMI connector, a USB connector, an SD card connector, and/or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. The haptic module 179 may include a motor, a piezoelectric element, or an electric stimulator.

The camera module 180 may capture a still image or moving images. The camera module 180 may include one or more lenses, image sensors, ISPs, or flashes.

The power management module 188 may manage power supplied to or consumed by the electronic device 101. The power management module 188 may be implemented as at least part of a power management integrated circuit (PMIC).

The battery 189 may supply power to at least one component of the electronic device 101. The battery 189 may include a primary cell which is not rechargeable, a secondary cell which is rechargeable, and a fuel cell.

The communication module 190 may support establishing a direct (e.g., wired) communication channel or a wireless communication channel between the electronic device 101 and the external electronic device (e.g., the external electronic device 102, the external electronic device 104, or the server 108) and performing communication via the established communication channel. The communication module 190 may include one or more CPs that are operable independently from the processor 120 (e.g., the AP) and supports a direct (e.g., wired) communication or a wireless communication. The communication module 190 may include a wireless communication module 192 (e.g., a cellular communication module, a short-range wireless communication module, or a global navigation satellite system (GNSS) communication module) or a wired communication module 194 (e.g., a local portion network (LAN) communication module or a power line communication (PLC) module). A corresponding one of these communication modules may communicate with the external electronic device via the first network 198 (e.g., a short-range communication network, such as BLUETOOTH, wireless-fidelity (Wi-Fi) direct, or IR data association (IrDA)) or the second network 199 (e.g., a long-range communication network, such as a legacy cellular network, a $5^{th}$ generation (5G) network, a next generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network, after a $4^{th}$ generation (4G) network, and next-generation communication technology, e.g., new radio (NR) access technology. The NR access technology may support high-speed transmission of high-capacity data (i.e., enhanced mobile broadband (eMBB)), minimization of terminal power and connection of multiple terminals (massive machine type communications (mMTC)), or high reliability and low latency (ultra-reliable and low-latency communications (URLLC)). The wireless communication module 192 may support a high-frequency band (e.g., a mmWave band) to achieve a high data transmission rate. The wireless communication module 192 may support various technologies for securing performance in a high-frequency band, such as beamforming, massive multiple-input and multiple-output (MIMO), full-dimensional MIMO (FD-MIMO), array antenna, analog beam-forming, or large-scale antenna. The wireless communication module 192 may support various requirements specified in the electronic device 101, an external electronic device (e.g., external the electronic device 104), or a network system (e.g., the second network 199). According to one or more embodiments, the wireless communication module 192 may support a peak data rate for implementing eMBB (e.g., 20 Gbps or more), loss coverage for implementing mMTC (e.g., 164 dB or less), or U-plane latency for realizing URLLC (e.g., 0.5 ms or less for each of downlink (DL) and uplink (UL) or 1 ms or less for round trip).

The antenna module 197 may transmit or receive a signal or power to or from the outside (e.g., the external electronic device) of the electronic device 101. The antenna module 197 may include an antenna including a radiating element including a conductive material or a conductive pattern formed in or on a substrate (e.g., a printed circuit board (PCB)). The antenna module 197 may include a plurality of antennas (e.g., an antenna array). According to one or more embodiments, at least one antenna appropriate for a communication scheme used in the communication network, such as the first network 198 or the second network 199, may be selected by the communication module 190 (e.g., the wireless communication module 192) from the plurality of antennas. The signal or the power may then be transmitted or received between the communication module 190 and the external electronic device via the selected at least one antenna. Another component (e.g., a radio frequency integrated circuit (RFIC)) other than the radiating element may be additionally formed as part of the antenna module 197.

According to one or more embodiments, the antenna module 197 may form a mmWave antenna module. According to one or more embodiments, the mmWave antenna module may include a PCB, an RFIC that is disposed on or adjacent to a first surface (e.g., the bottom surface) of the PCB and is capable of supporting a predetermined high-frequency band (e.g., a mmWave band), and a plurality of antennas (e.g., array antennas) that is disposed on or adjacent to a second surface (e.g., the top surface or the side surface) of the PCB and is capable of transmitting or receiving a signal of the predetermined high-frequency band.

At least some of the above-described components may be coupled mutually and communicate signals (e.g., commands or data) therebetween via an inter-peripheral communication scheme (e.g., a bus, general purpose input/output (GPIO), serial peripheral interface (SPI), or mobile industry processor interface (MIPI)).

Commands or data may be transmitted or received between the electronic device 101 and the external electronic device 104 via the server 108 coupled with the second network 199. Each of the external electronic devices 102 or 104 may be a device of a same type as, or a different type, from the electronic device 101. All or some of operations to be executed at the electronic device 101 may be executed at one or more of the external electronic devices 102, 104, or 108. According to one or more embodiments, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used. The electronic device 101 may provide an ultra-low delay service using distributed computing or MEC. In an embodiment of the disclosure, the external electronic device 104 may include an internet of things (IoT) device. The server 108 may be an intelligent server using machine learning and neural networks. According to one or more embodiments, the external electronic device 104 or the server 108 may be included in the second network 199. The electronic device 101 may be applied to an intelligent service (e.g., smart home, smart city, smart car, or healthcare) based on 5G communication technology or IoT-related technology.

Figure 2A:
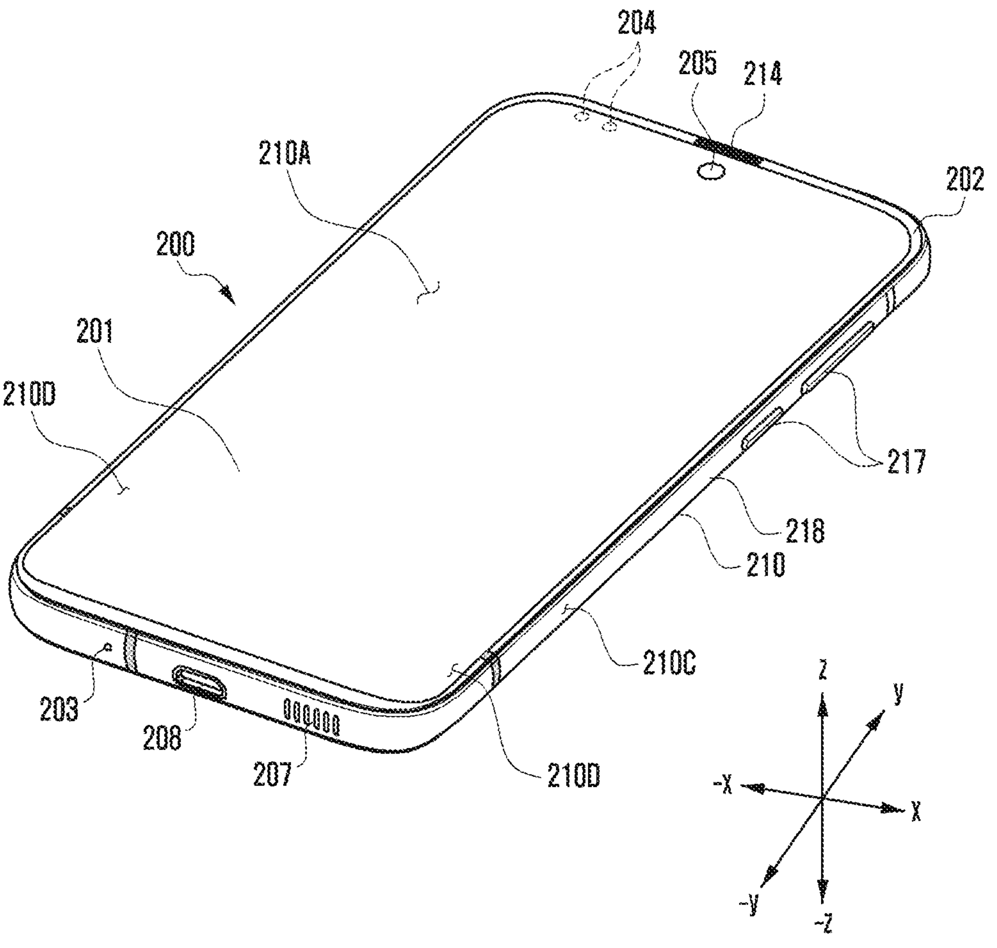
FIG. 2A is a perspective view of an electronic device according to one or more embodiments.
Figure 2B:
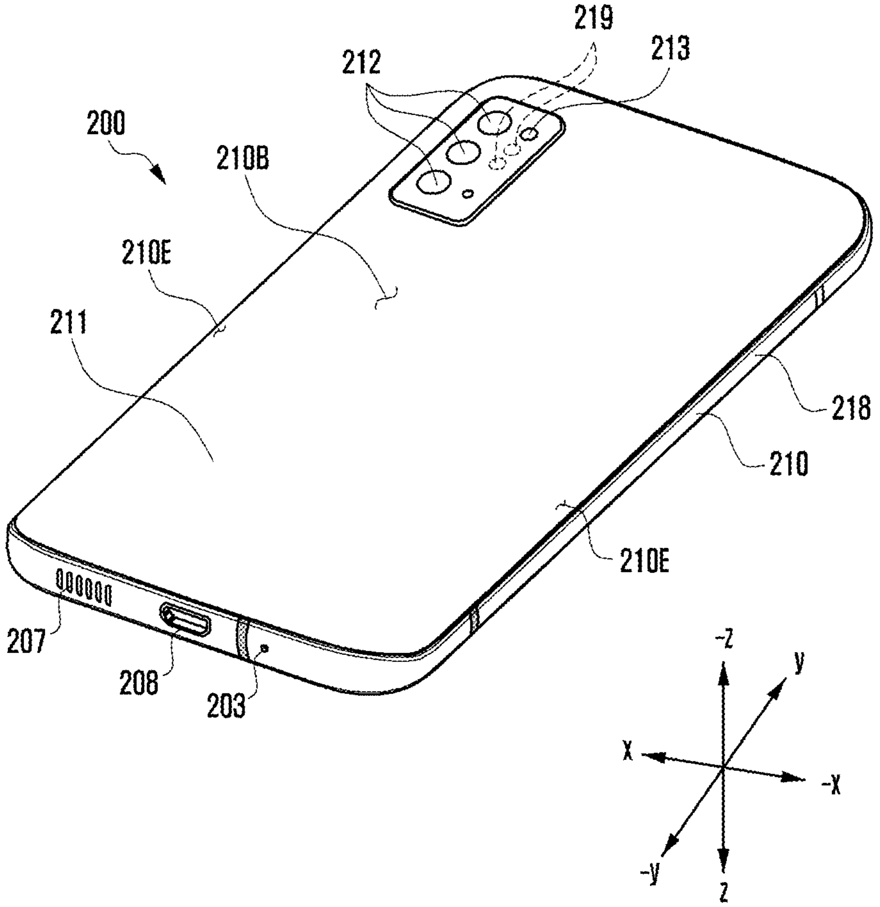
FIG. 2B is a perspective view of an electronic device according to one or more embodiments.

FIG. 2A is a perspective view of the front surface of an electronic device 200 according to one or more embodiments. FIG. 2B is a perspective view of the rear surface of the electronic device 200 of FIG. 2A according to one or more embodiments.

The electronic device 200 of FIGS. 2A and 2B may be at least partially similar to the electronic device 101 of FIG. 1 or may include one or more embodiments of the electronic device.

With reference to FIGS. 2A and 2B, the electronic device 200 according to one or more embodiments may include a housing 210 including the first surface (or the front surface) 210A, the second surface (or the rear surface) 210B, and the side surface 210C surrounding the space between the first surface 210A and the second surface 210B. According to one or more embodiments, The electronic device 200 may include a rear cover. The housing 210 may at least partially disposed between the display 201 and the rear cover. According to one or more embodiments, the housing 210 may refer to a structure forming a portion of the first surface 210A, the second surface 210B, and the side surface 210C of FIG. 2A. According to one or more embodiments, the first surface 210A may be formed by at least a partially transparent front plate 202 (e.g., a glass plate or a polymer plate comprising various coating layers). The second surface 210B may be formed by a substantially opaque rear plate 211. The rear plate 211 may be formed by a coated or colored glass, a ceramic, a polymer, a metal (e.g., an aluminum, a stainless steel (STS), or a magnesium), or a combination of at least two of the above materials. The second surface 210B may be opposite the first surface 210A. The side surface 210C may be coupled with the front plate 202 and the rear plate 211 and may be formed by a side bezel structure 218 (or the "lateral member") including a metal or a polymer, or both. According to one or more embodiments, the rear plate 211 and the side bezel structure 218 may be integrally formed and may contain the same material (e.g., a metal material such as an aluminum).

According to one or more embodiments, the front plate 202 may include a seamlessly extended first portion 210D that is curved from the first surface **210*a* to the rear plate 211 to include both ends of the long edge of the front plate 202. According to one or more embodiments (e.g., refer to FIG. 2B), the rear plate 211 may include a second portion 210E curved from the second surface 210B to the front plate 202 and extended seamlessly. According to one or more embodiments, the front plate 202 or the rear plate 211 may include only one of the first portion 210D or the second portion 210E. According to one or more embodiments, the front plate 202 may not include the first portion and the second portion but may include only a flat plane parallel to the second surface 210B. According to one or more embodiments, when viewed from the side of the electronic device, the side bezel structure 218 may have a first thickness (or width) on the side surface that does not include the first portion 210D or the second portion 210E as described above, and it may have a second thickness thinner than the first thickness on the side surface that includes the first portion 210D or the second portion 210**E.

According to one or more embodiments, the electronic device 200 may include at least one of a display 201, an input device 203, a sound output device 207 and 214, a sensor module 204 and 219, a camera module 205 and 212, a key input device 217, an indicator, and a connector 208. According to one or more embodiments, the electronic device 200 may omit at least one of the components (e.g., a key input device 217 or an indicator) or may additionally include other components.

According to one or more embodiments, the display 201 may be exposed through a substantial portion of the front plate 202. According to one or more embodiments, at least a portion of the display 201 may be exposed through the first surface 210A and the front plate 202 forming the first area 210D of the side surface 210C. The display 201 may be disposed by being combined with or adjacent to a touch sensing circuit, a pressure sensor capable of measuring the intensity (e.g., the pressure) of the touch, and a digitizer detecting a stylus pen of a magnetic field type. According to one or more embodiments, at least a portion of the sensor modules 204 and 219 and at least a portion of the key input device 217 may be disposed in the first area 210D and the second area 210E.

The input device 203 may include a microphone 203. According to one or more embodiments, the input device 203 may include a plurality of microphones 203 disposed to sense the direction of sound. The sound output devices 207 and 214 may include speakers 207 and 214. The speakers 207 and 214 may include an external speaker 207 and a call receiver 214. According to one or more embodiments, the microphone 203, speakers 207 and 214, and connector 208 may be disposed in the space above the electronic device 200 and may be exposed to the external environment through at least one hole formed in the housing 210. According to one or more embodiments, the holes formed in the housing 210 may be used in common for microphone 203 and speakers 207 and 214. According to one or more embodiments, the sound output devices 207 and 214 may include a speaker (e.g., piezo speaker) operating while excluding the hole formed in the housing 210.

The sensor modules 204 and 219 may generate an electrical signal or data value corresponding to the internal operating state of the electronic device 200 or an external environmental state. The sensor modules 204 and 219 may include, a first sensor module 204 (e.g., a proximity sensor) and a second sensor module (e.g., a fingerprint sensor) disposed on the first surface 210A of the housing 210, and a third sensor module 219 (e.g., an HRM sensor) disposed on the second surface 210B of the housing 210. The fingerprint sensor may be disposed on the first surface 210A (e.g., a home key button) of the housing 210, a partial area of the second surface 210B, and below the display 201. The electronic device 200 may further include a sensor module, such as at least one of a gesture sensor, a gyro sensor, a barometric pressure sensor, a magnetic sensor, an acceleration sensor, a grip sensor, a color sensor, an infrared (IR) sensor, a biometric sensor, a temperature sensor, a humidity sensor, or an illuminance sensor.

The camera module 205 and 212 may include a first camera device 205 disposed on the first surface 210A of the electronic device 200, a second camera device 212 disposed on the second surface 210B, and a flash 213. The camera module 205 and 212 may include one or a plurality of lenses, an image sensor, and an image signal processor. The flash 213 may include a light-emitting diode or a xenon lamp. According to one or more embodiments, two or more lenses (e.g., wide-angle, ultra-wide-angle and telephoto lenses) and image sensors may be disposed on one side of the electronic device 200.

The key input device 217 may be disposed on the side surface 210C of the housing 210. According to one or more embodiments, the electronic device 200 may not include some or all of the above-mentioned key input devices 217, and the un-included key input device 217 may be implemented in another form, such as a soft key, on the display 201. According to one or more embodiments, the key input device 217 may be implemented using a pressure sensor included in the display 201.

The indicator may be disposed on the first surface 210A of housing 210. The indicator may provide state information of the electronic device 200 optical form (e.g., an light-emitting element). According to one or more embodiments, the light-emitting element may provide a light source that is interworked with the operation of the camera module 205. The indicator may include an LED, an IR LED, and a xenon lamp.

The connector hole 208 may include a first connector hole accommodating a connector (e.g., a universal serial bus (USB) connector) for transmitting and receiving power and data to/from an external electronic device and a second connector hole (or earphone jack) accommodating a connector transmitting and receiving an audio signal to/from the external electronic device.

Some of the camera modules 205 of the camera modules 205 and 212, some of the sensor modules 204 of the sensor modules 204 and 219, or indicator may be disposed to be exposed through the display 201. According to one or more embodiments, the camera module 205, the sensor module 204, or the indicator may be disposed so that it can be in contact with the external environment through an opening perforated to the front plate 202 or the transmission area of the display in the internal space of the electronic device 200. According to one or more embodiments, the area facing the display 201 and the camera module 205 may be formed as a transmission area having a certain transmittance as part of the area displaying content. According to one or more embodiments, the transmission area may be formed to have a transmittance in the range of about 5% to 20%. This transmission area may include an area that overlaps with an effective area (e.g., field of view area) of the camera module 205 through which light passes for generating an image using an image sensor. According to one or more embodiments, the transmission area of the display 201 may include an area with a lower pixel density than the surrounding area. According to one or more embodiments, the transmission area may replace the opening. According to one or more embodiments, the camera module 205 may include an under display camera (UDC). According to one or more embodiments, some sensor module 204 may be disposed to perform its function in the internal space of the electronic device 200 without being visually exposed through the front plate 202. According to one or more embodiments, in this case, the area facing the sensor module 204 of the display 201 may not require a perforated opening.

Figure 3:
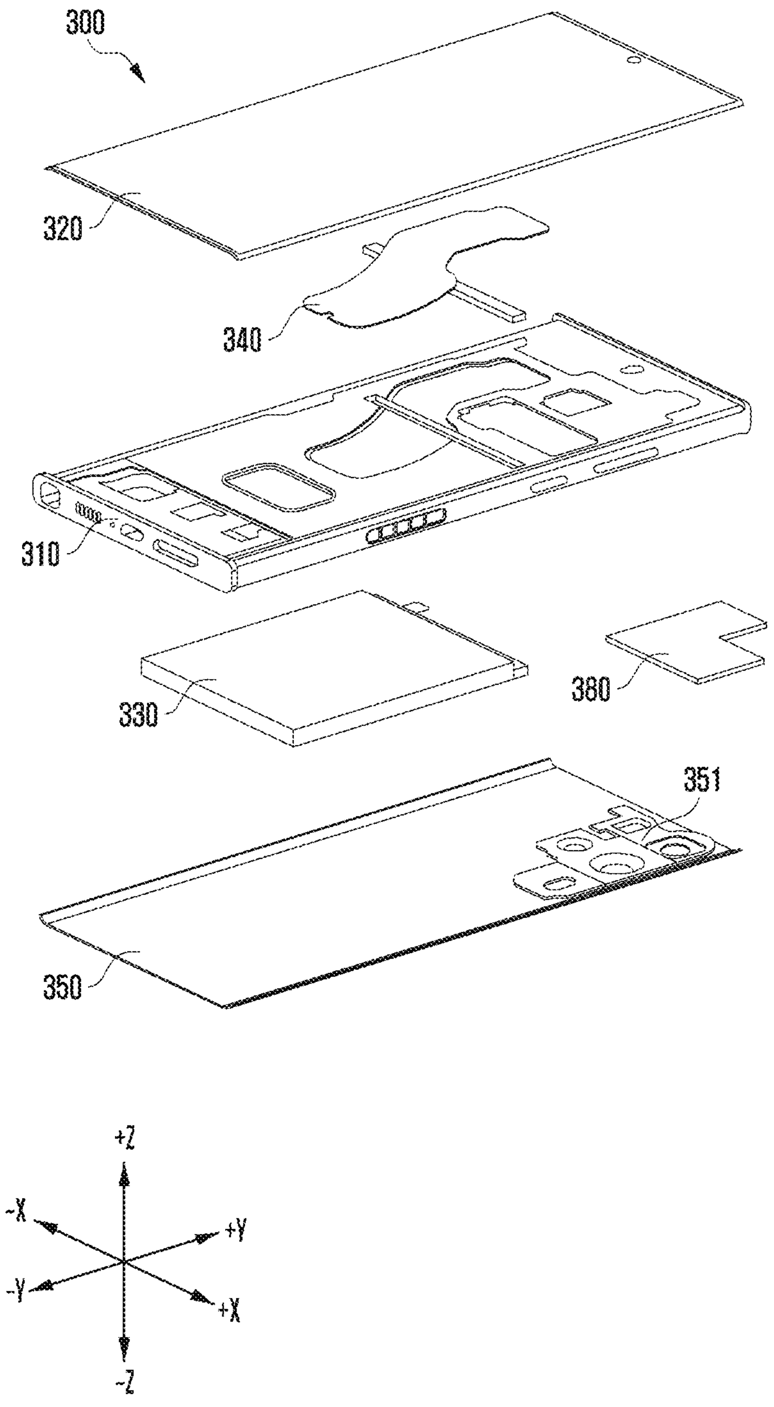
FIG. 3 is an exploded perspective view of an electronic device according to one or more embodiments.

FIG. 3 is an exploded perspective view of an electronic device 300 according to one or more embodiments.

The electronic device 300 shown in FIG. 3 may refer to the electronic device 101 of FIG. 1 or may include at least a portion of the electronic device 101 of FIG. 1.

The electronic device 300 shown in FIG. 3 may refer to the electronic device 200 of FIG. 2 or may include at least a portion of the electronic device 200 of FIG. 2.

In describing the electronic device 300 according to one or more embodiments, a width direction of the electronic device 300 may mean an x-axis direction, and a length direction of the electronic device 300 may mean a y-axis direction. A height direction of the electronic device 300 may mean a z-axis direction.

The electronic device 300 according to one or more embodiments may include a housing 310, a display 320, a battery 330, a thermal diffusion member 340, a rear cover 350, and a printed circuit board 380.

According to one or more embodiments, the housing 310 may form the exterior of the electronic device 300. With reference to FIG. 3, the housing 310 may include spaces within which different configurations of electronic device 300 may be disposed.

According to one or more embodiments, components of the electronic device 300 may be disposed in the housing 310. According to one or more embodiments, a display 320, a battery 330, a thermal diffusion member 340, a rear cover 350, and a printed circuit board 380 may be disposed in the housing 310.

According to one or more embodiments, the battery 330 may provide power to at least one component of the electronic device 300.

According to one or more embodiments, the display 320 may be disposed on one surface of the housing 310. The rear cover 350 according to one or more embodiments may be disposed on the other surface, which is the opposite surface of the one surface of the housing 310.

According to one or more embodiments, the rear cover 350 may include a deco 351. The deco 351 may be configured to cover at least a portion of the camera module 180 (see FIG. 1).

According to one or more embodiments, the thermal diffusion member 340 may be disposed between the battery 330 and the display 320, and between the printed circuit board 380 and the display 320. According to one or more embodiments, the thermal diffusion member 340 may be disposed in a direction (e.g., a negative z-axis direction) that faces away from the display 320 toward the interior of the electronic device 300.

According to one or more embodiments, the thermal diffusion member 340 may serve to diffuse heat generated by a heat source to other areas. According to one or more embodiments, the thermal diffusion member 340 may diffuse heat generated by the printed circuit board 380 to other areas of the electronic device 300. The thermal diffusion member 340 according to one or more embodiments may have one end in contact with the printed circuit board 380 and the other end in contact with the battery 330.

To improve the thermal diffusion performance of the thermal diffusion member 340, the thermal diffusion member 340 may be extended to have a non-curved plane. According to one or more embodiments, the thermal diffusion member 340 may be extended so that at least a portion of the thermal diffusion member 340 has a plane substantially perpendicular to the height direction of the electronic device 300. Since the display 320 has a plane substantially perpendicular to the height direction of the electronic device 300, the thermal diffusion member 340 may be disposed on one surface of the display 320 (e.g., a surface facing a negative z-axis direction from the display 320).

According to one or more embodiments, the thermal diffusion member 340 may include a planar shape and may be disposed on one surface of the display 320 extended into the plane. The thermal diffusion member 340 according to one or more embodiments may include a planar shape, which may make manufacturing of the thermal diffusion member 340 easier.

FIGS. 4A, 4B, 4C, and 4D are diagrams illustrating a housing 310, a battery 330, a thermal diffusion member 340, and a flexible printed circuit board 360 according to one or more embodiments.

Figure 4A:
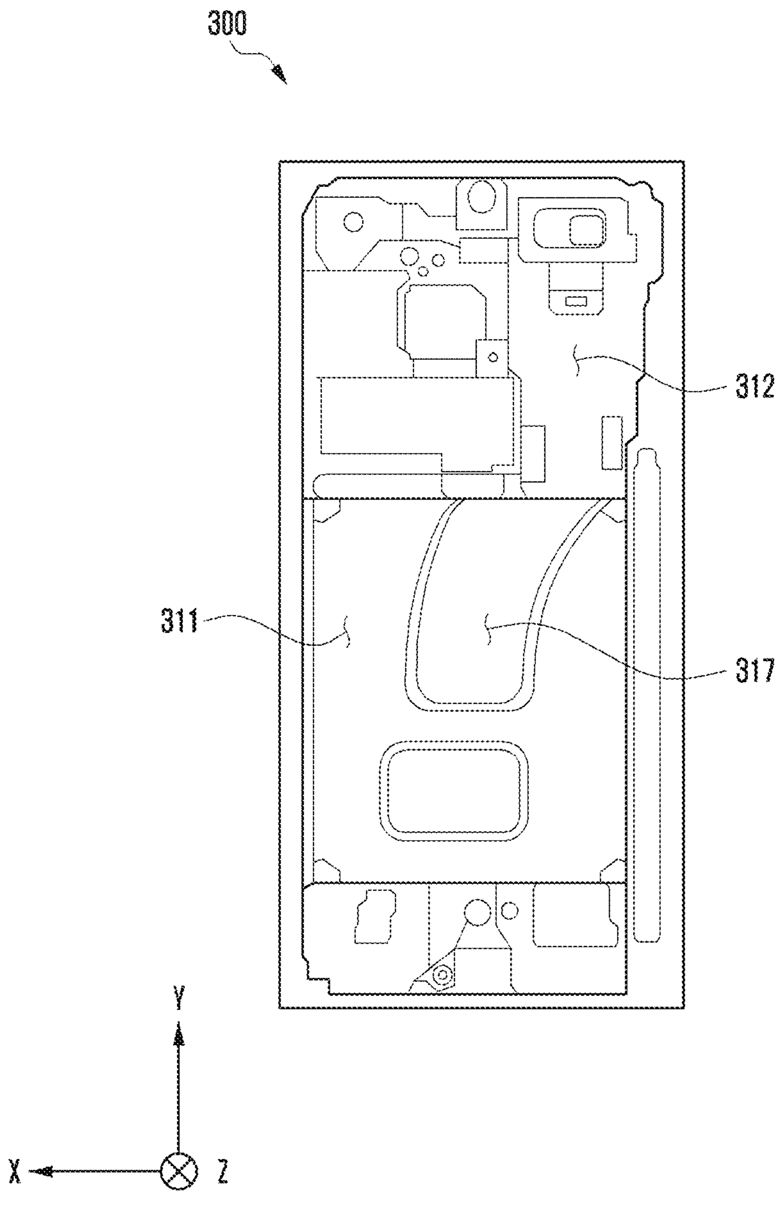
FIG. 4A is a diagram illustrating a housing, a battery, a thermal diffusion member, and a flexible printed circuit board according to one or more embodiments.
Figure 4B:
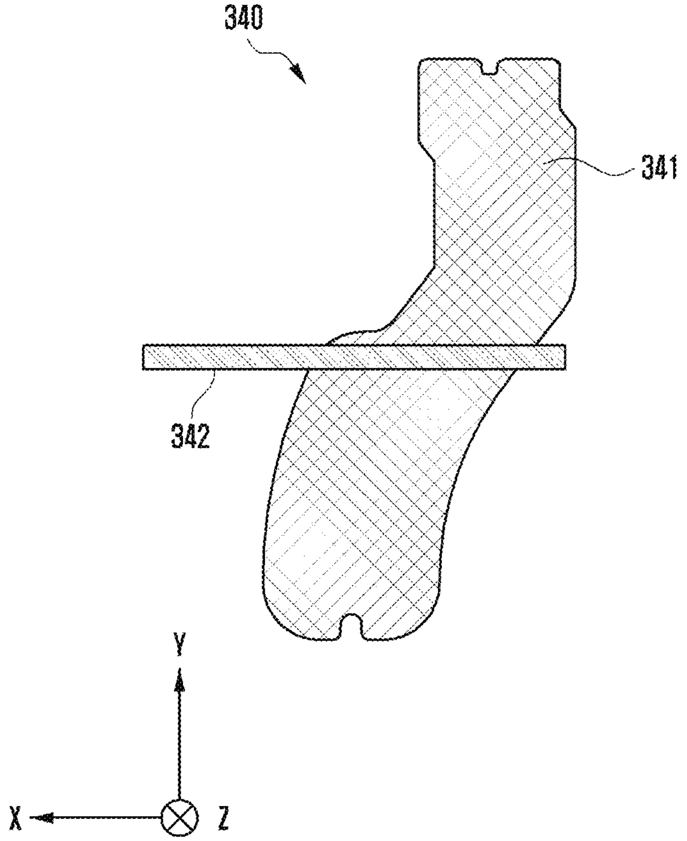
FIG. 4B is a diagram illustrating a housing, a battery, a thermal diffusion member, and a flexible printed circuit board according to one or more embodiments.
Figure 4C:
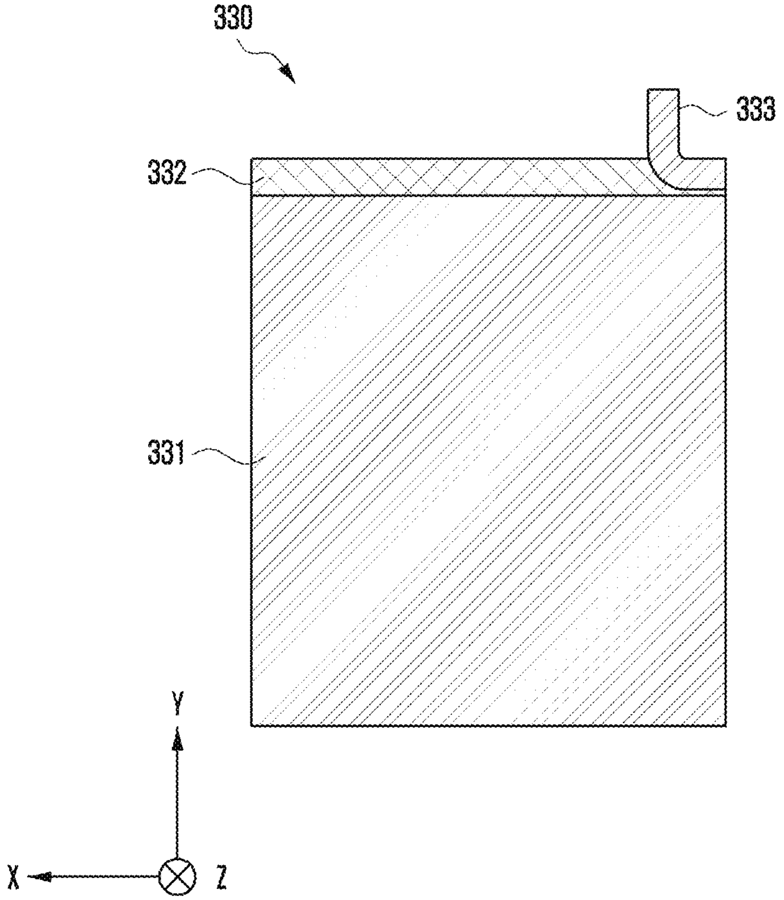
FIG. 4C is a diagram illustrating a housing, a battery, a thermal diffusion member, and a flexible printed circuit board according to one or more embodiments.
Figure 4D:
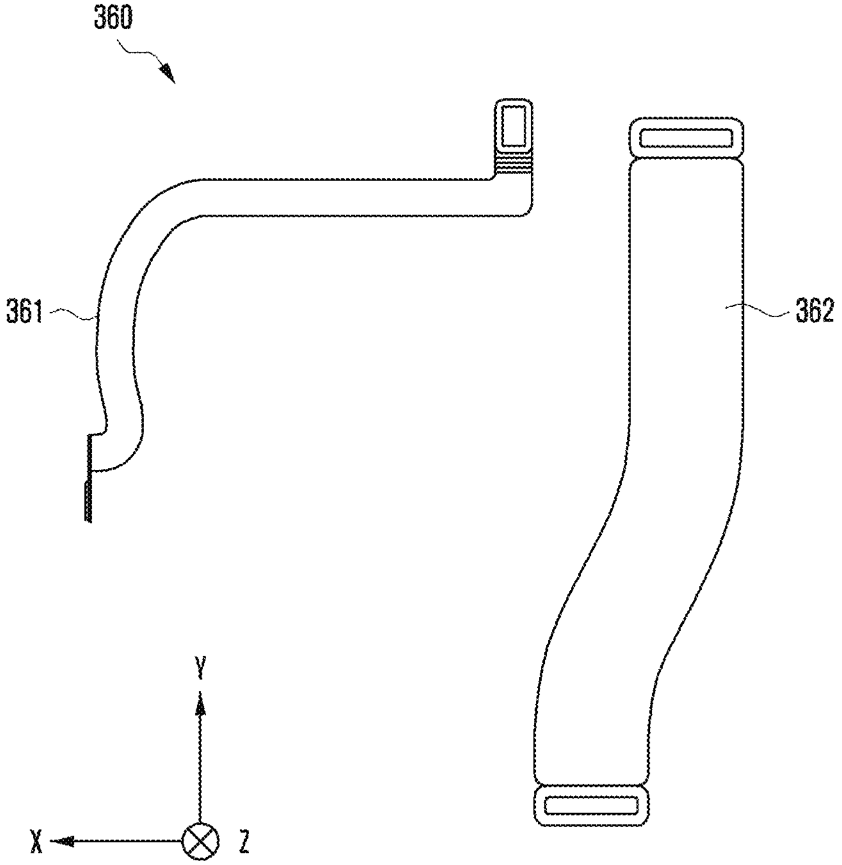
FIG. 4D is a diagram illustrating a housing, a battery, a thermal diffusion member, and a flexible printed circuit board according to one or more embodiments.

FIG. 4A is a diagram illustrating a housing 310 according to one or more embodiments. FIG. 4B is a diagram illustrating a thermal diffusion member 340 according to one or more embodiments. FIG. 4C is a diagram illustrating a battery 330 according to one or more embodiments. FIG. 4D is a diagram illustrating a flexible printed circuit board 360 according to one or more embodiments.

With reference to FIG. 4*a*, the housing 310 according to one or more embodiments may include a first space 311, a second space 312, and a placement space 317. Different configurations of the electronic device 300 may be disposed in the first space 311 and second space 312 of the housing 310.

According to one or more embodiments, the placement space 317 of the housing 310 may be a space in which at least a portion of the thermal diffusion member 340 is seated. The placement space 317 may be formed with a shape corresponding to at least a portion of the thermal diffusion member 340.

With reference to FIG. 4B, the thermal diffusion member 340 according to one or more embodiments may include a first diffusion portion 341 and a second diffusion portion 342.

According to one or more embodiments, the first diffusion portion 341 may be extended and bended in at least a portion. According to one or more embodiments, the first diffusion portion 341 may be extended in the length direction of the electronic device 300 and then bended and extended in at least a portion in the width direction (e.g., the x-axis direction) of the electronic device 300. According to one or more embodiments, the first diffusion portion 341 may include a vapor chamber, a heat pipe, and a heat sink.

According to one or more embodiments, the second diffusion portion 342 may be extended in a direction substantially perpendicular to the first diffusion portion 341. According to one or more embodiments, the second diffusion portion 342 may be extended along the width direction (e.g., the x-axis direction) of the electronic device 300. In an embodiment, the second diffusion portion 342 may include a vapor chamber, a heat pipe, and a heat radiation fin.

According to one or more embodiments, the may be printed circuit board at least partially disposed at a first side facing a third direction between a first diffusion portion 341 of the thermal diffusion member 340 and the rear cover, the third direction being opposite to the second direction with respect to the first support portion 3151.

With reference to FIG. 4C, the battery 330 according to one or more embodiments may include a first portion 331, a second portion 332, and a connection portion 333.

According to one or more embodiments, the first portion 331 may be an portion where a plurality of cells of the battery 330 are positioned. The second portion 332 may be an portion where a protection circuit module (PCM) of the battery 330 is positioned. According to one or more embodiments, the second portion 332 may be an portion where protection elements (e.g., protection ICs, and MOSFETs) are disposed to protect the battery 330 by cutting off or reducing overcharge, over-discharge, and overcurrent in the battery 330. The PCM of the battery 330 may be configured to protect the battery 330 from overcharge, over-discharge, and overcurrent.

According to one or more embodiments, the second portion 332 may be disposed at an end of the first portion 331. The end of the first portion 331 may refer to an end located in the positive y-axis direction of the first portion 331. The second portion 332 may be extended from the end of the first portion 331 in a width direction (e.g., an x-axis direction) of the electronic device 300.

According to one or more embodiments, the second diffusion portion 342 of the thermal diffusion member 340 may be extended along a direction in which the second portion 332 of the battery 330 is extended. The second diffusion portion 342 of the thermal diffusion member 340 may be disposed to be overlapped with at least a portion of the second portion 332 of the battery 330. According to one or more embodiments, the second diffusion portion 342 of the thermal diffusion member 340 may be disposed to be overlapped with at least a portion of a protection element (e.g., a protection IC, and/or a MOSFET) for protecting the battery 330.

According to one or more embodiments, the battery 330 may be electrically connected to the printed circuit board 380 at a connection portion 333. The connection portion 333 may be an portion that is extended at least partially in a length direction (e.g., the y-axis direction) relative to the battery 330.

FIG. 4D is a diagram illustrating a flexible printed circuit board 360 according to one or more embodiments.

The electronic device 300 according to one or more embodiments may include at least one flexible printed circuit board 360. The flexible printed circuit board 360 may include a first flexible printed circuit board 361 and a second flexible printed circuit board 362.

According to one or more embodiments, the flexible printed circuit boards 360 may serve to electrically connect the printed circuit boards 380 and other components of the electronic device 300. According to one or more embodiments, the first flexible printed circuit board 361 may electrically connect an antenna (e.g., the antenna module 197 of FIG. 1) and the printed circuit board 380. The second flexible printed circuit board 362 may electrically connect a display module (e.g., the display module 160 in FIG. 1) and the printed circuit board 380.

According to one or more embodiments, the flexible printed circuit board 360 may be extended and bended in at least a portion. According to one or more embodiments, the flexible printed circuit board 360 may be extended in a length direction (e.g., a y-axis direction) of the electronic device 300 and then bended in at least a portion and extended in a width direction (e.g., an x-axis direction) of the electronic device 300.

Figure 5:
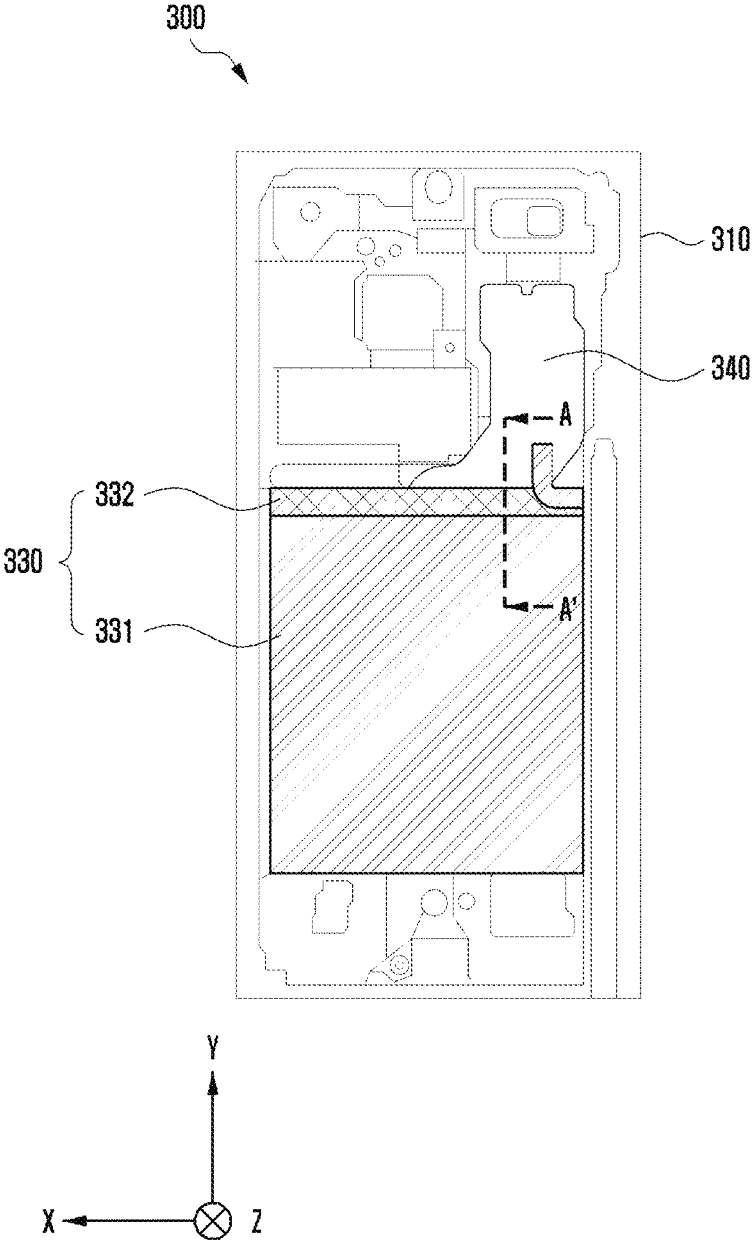
FIG. 5 is a diagram illustrating a battery and a thermal diffusion member disposed in a housing according one or more embodiments.

FIG. 5 is a diagram illustrating a battery 330 and a thermal diffusion member 340 disposed in a housing 310 according to one or more embodiments.

FIG. 5 may be a diagram illustrating a housing 310, a battery 330, and a thermal diffusion member 340 omitting other configurations in an electronic device 300 according to one or more embodiments.

With reference to FIG. 5, the battery 330 and thermal diffusion member 340 according to one or more embodiments may be disposed in the housing 310.

According to one or more embodiments, the thermal diffusion member 340 may be disposed so that at least a portion of the thermal diffusion member 340 is overlapped with the battery 330. According to one or more embodiments, the thermal diffusion member 340 may be overlapped with at least a portion of the first portion 331 and the second portion 332 of the battery 330.

Figure 6A:
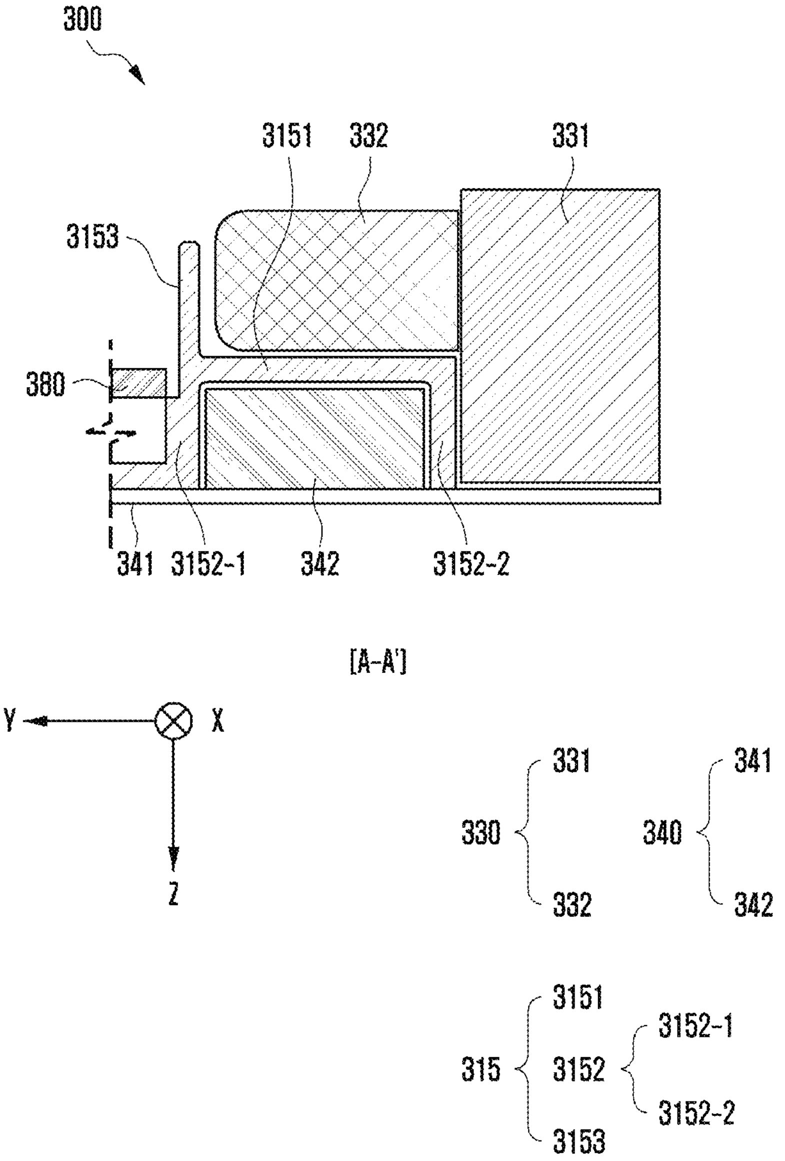
FIG. 6A is a diagram illustrating the electronic device as viewed from the A-A' cross-section shown in FIG. 5 according to one or more embodiments.
Figure 6B:
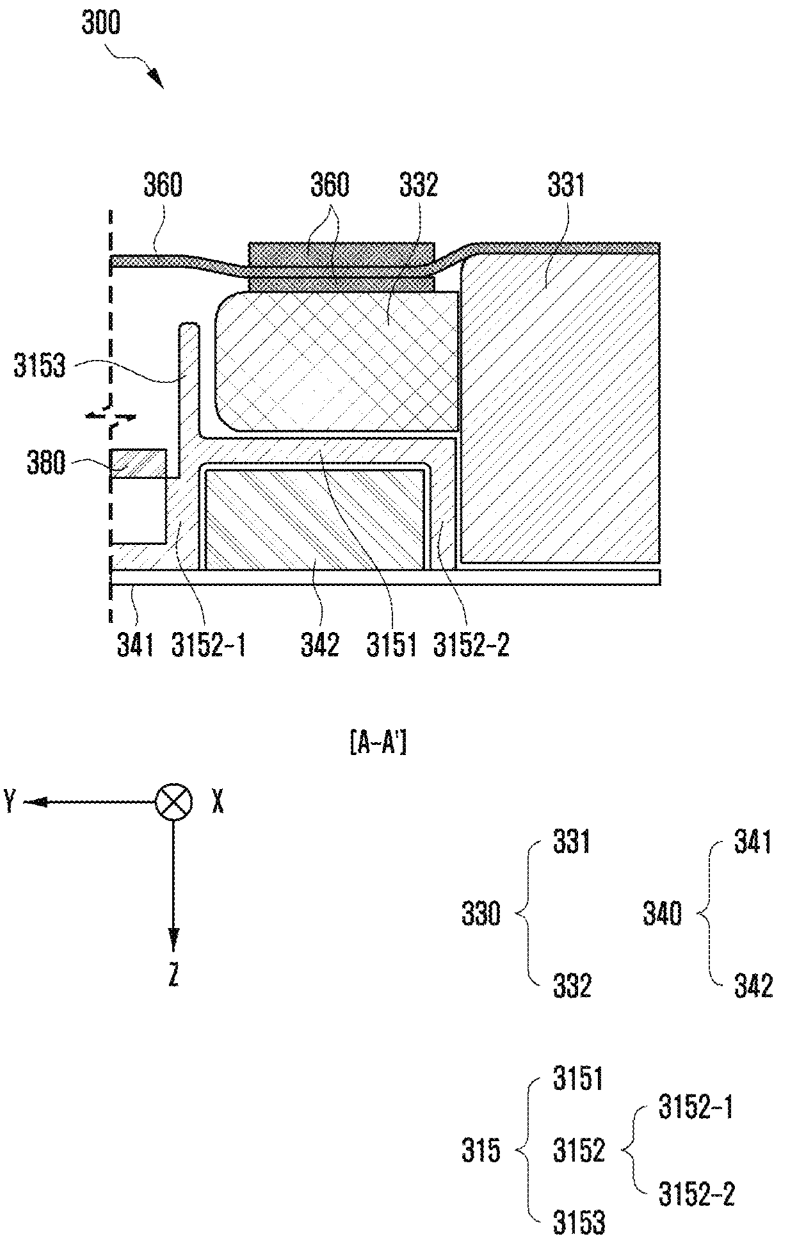
FIG. 6B is a diagram illustrating the electronic device as viewed from the A-A' cross-section shown in FIG. 5 according to one or more embodiments.

FIGS. 6A and 6B are diagrams illustrating the electronic device 300 as viewed from the A-A' cross-section shown in FIG. 5.

FIG. 6A is a diagram illustrating a battery 330 and a thermal diffusion member 340 according to one or more embodiments. FIG. 6B is a diagram illustrating a battery 330, a thermal diffusion member 340, and a flexible printed circuit board 360 according to one or more embodiments.

According to one or more embodiments, a first diffusion portion 341 of the thermal diffusion member 340 may be extended along a length direction (e.g., a y-axis direction) of the electronic device 300. A second diffusion portion 342 and battery 330 may be disposed in one direction (e.g., a negative z-axis direction) of the first diffusion portion 341.

According to one or more embodiments, the first diffusion portion 341 may be extended so that at least a portion is disposed being overlapped with the printed circuit board 380, and at least a portion is disposed in the first portion 331 of the battery 330. According to one or more embodiments, one end of the first diffusion portion 341 may be disposed being overlapped with the printed circuit board 380 and the other end may be disposed in the first portion 331 of the battery 330. One end of the first diffusion portion 341 may refer to an end located in the positive y-axis direction of the first diffusion portion 341, and the other end of the first diffusion portion 341 may refer to an end located in the negative y-axis direction of the first diffusion portion 341.

According to one or more embodiments, the second diffusion portion 342 of the thermal diffusion member 340 may be disposed in a position that is overlapped with the second portion 332 of the battery 330. According to one or more embodiments, with reference to FIGS. 6A and 6B, the second portion 332 of the battery 330 may be disposed in a height direction (e.g., a negative z-axis direction) relative to the second diffusion portion 342.

According to one or more embodiments, at least a portion of the battery 330 may have a different thickness than the remainder. The thickness of the battery 330 may refer to the length that the battery 330 is extended in the height direction (e.g., the z-axis direction) of the electronic device 300. The thickness of the second portion 332 of the battery 330 may be formed to be thinner than the thickness of the first portion 331 of the battery 330.

According to one or more embodiments, the second diffusion portion 342 may be positioned between the first diffusion portion 341 and the second portion 332 of the battery 330. The battery 330 may be formed so that the thickness of the second portion 332 is thinner than the thickness of the first portion 331, thereby providing space for the second diffusion portion 342 of the thermal diffusion member 340 to be disposed.

According to one or more embodiments, the printed circuit board 380 may be positioned in one direction of the battery 330. According to one or more embodiments, with reference to FIGS. 6A and 6B, the printed circuit board 380 may be positioned in a positive y-axis direction relative to battery 330.

According to one or more embodiments, the housing 310 (see FIG. 4A) may include a support portion 315. The support portion 315 may be a structure formed by at least a portion of the housing 310 extended to surround the second diffusion portion 342. The second diffusion portion 342 according to one or more embodiments may be disposed in the support portion 315. The support portion 315 may be formed on the second surface 210B of the housing 210 facing the first surface 210A of the housing 210. The flexible printed circuit board may be at least partially disposed between the support portion 315 and the rear cover.

According to one or more embodiments, the support portion 315 may include a first support portion 3151, a second support portion 3152, and a third support portion 3153. The first support portion 3151 may be extended in a direction substantially perpendicular to the second support portion 3152 and the third support portion 3153.

According to one or more embodiments, two second support portions 3152 may be formed. According to one or more embodiments, the second support portion 3152 may include a first-second support portion 3152-1 and a second-second support portion 3152-2. The first-second support portion 3152-1 may be extended in a direction substantially perpendicular to the first support portion 3151 on one side of the first support portion 3151. The second-second support portion 3152-2 may be extended in a direction substantially perpendicular to the first support portion 3151 on the other side of the first support portion 3151.

According to one or more embodiments, the first-second support portion 3152-1 may be positioned in one direction (e.g., a positive y-axis direction) of the second diffusion portion 342 and may support the second diffusion portion 342. The second-second support portion 3152-2 may be positioned in the other direction (e.g., a negative y-axis direction) of the second diffusion portion 342 and may support the second diffusion portion 342.

With reference to FIGS. 6A and 6B, the first support portion 3151 may be disposed between the second diffusion portion 342 and the second portion 332 of the battery 330 according to one or more embodiments. The second support portion 3152 may be disposed on one side and the other side of the second diffusion portion 342.

According to one or more embodiments, the second diffusion portion 342 of the thermal diffusion member 340 may be supported by the first support portion 3151 and the second support portion 3152 to maintain a predetermined position within the electronic device 300.

According to one or more embodiments, the third support portion 3153 may be positioned in one direction of the battery 330. According to one or more embodiments, the third support portion 3153 may be extended in the opposite direction of the second support portion 3152 and may be positioned in a positive y-axis direction relative to the second portion 332 of the battery 330. The third support portion 3153 may be disposed to face the second portion 332 of the battery 330.

According to one or more embodiments, the battery 330 may be supported by the first support portion 3151, the second support portion 3152, and the third support portion 3153 to maintain a predetermined position within the electronic device 300.

The electronic device 300 according to one or more embodiments may include at least one flexible printed circuit board 360. The flexible printed circuit board 360 may be electrically connected between internal components of the electronic device 300. According to one or more embodiments, the flexible printed circuit board 360 may be electrically connected between the battery 330 and the printed circuit board 380.

With reference to FIG. 6B, at least a portion of the flexible printed circuit board 360 according to one or more embodiments may be disposed in the second portion 332 of the battery 330. The battery 330 may be formed such that the second portion 332 is thinner than the first portion 331 so that there is room for the flexible printed circuit board 360 to be disposed. The flexible printed circuit board 360 may be disposed in a direction opposite to the direction in which the second diffusion portion 342 is positioned relative to the second portion 332 of the battery 330.

According to one or more embodiments, the electronic device 300 may utilize the second portion 332 of the battery 330 as a space where the flexible printed circuit board 360 is disposed. The electronic device 300 according to one or more embodiments may not require a separate space on the printed circuit board 380 for placement of the flexible printed circuit board 360 because the second portion 332 of the battery 330 provides space for the flexible printed circuit board 360 to be disposed. Thus, the electronic device 300 according to one or more embodiments may be formed by cutting a portion of the printed circuit board 380 (e.g., the space where the flexible printed circuit board 360 is disposed) and extending the battery 330 in a direction facing the printed circuit board 380.

Figure 7:
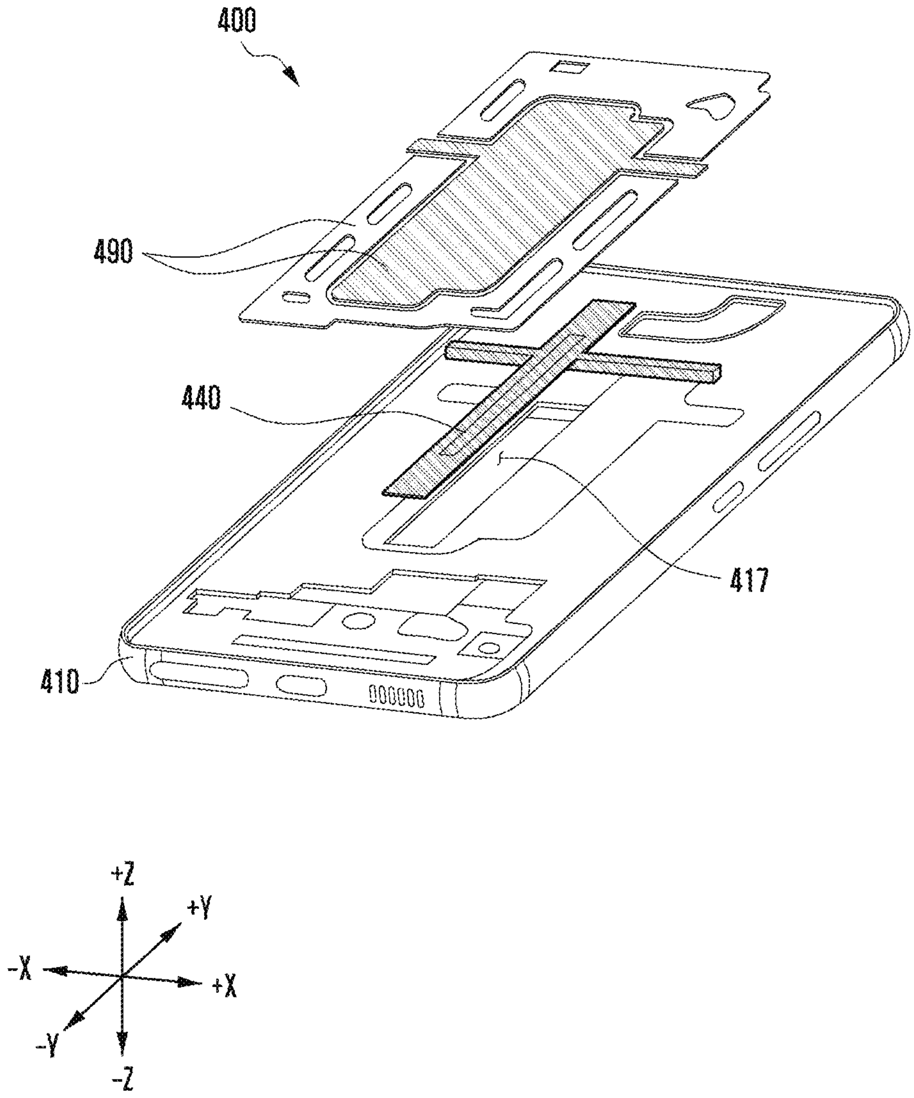
FIG. 7 is an exploded perspective view of an electronic device according to one or more embodiments.

FIG. 7 is an exploded perspective view of an electronic device 400 according to one or more embodiments.

The electronic device 400 shown in FIG. 7 may refer to the electronic device 101 of FIG. 1 or may include at least a portion of the electronic device 101 of FIG. 1.

The electronic device 400 shown in FIG. 7 may include at least a portion of the electronic devices 200 and 300 of FIGS. 2A, 2B, and 3.

In describing the electronic device 400 of FIG. 7, a width direction of the electronic device 400 may mean an x-axis direction, and a length direction of the electronic device 400 may mean a y-axis direction. A height direction of the electronic device 400 may mean a z-axis direction.

The electronic device 400 according to one or more embodiments may include a housing 410, a thermal diffusion member 440, and a thermal diffusion sheet 490.

According to one or more embodiments, the thermal diffusion member 440 and the thermal diffusion sheet 490 may be disposed in the housing 410.

According to one or more embodiments, the housing 410 may include a placement space 417 in which the thermal diffusion member 440 may be disposed. According to one or more embodiments, the thermal diffusion member 440 may be partially disposed in the placement space 417. The placement space 417 may be formed with an opening having a shape corresponding to the shape of the thermal diffusion member 440.

According to one or more embodiments, the thermal diffusion sheet 490 may be disposed to cover one surface of the housing 410 and at least a portion of the thermal diffusion member 440. The thermal diffusion sheet 490 according to one or more embodiments may include a graphite sheet having heat diffusion capabilities.

According to one or more embodiments, the thermal diffusion sheet 490 may be extended along a width direction (e.g., an x-axis direction) and a length direction (e.g., a y-axis direction) of the electronic device 400.

Figure 8:
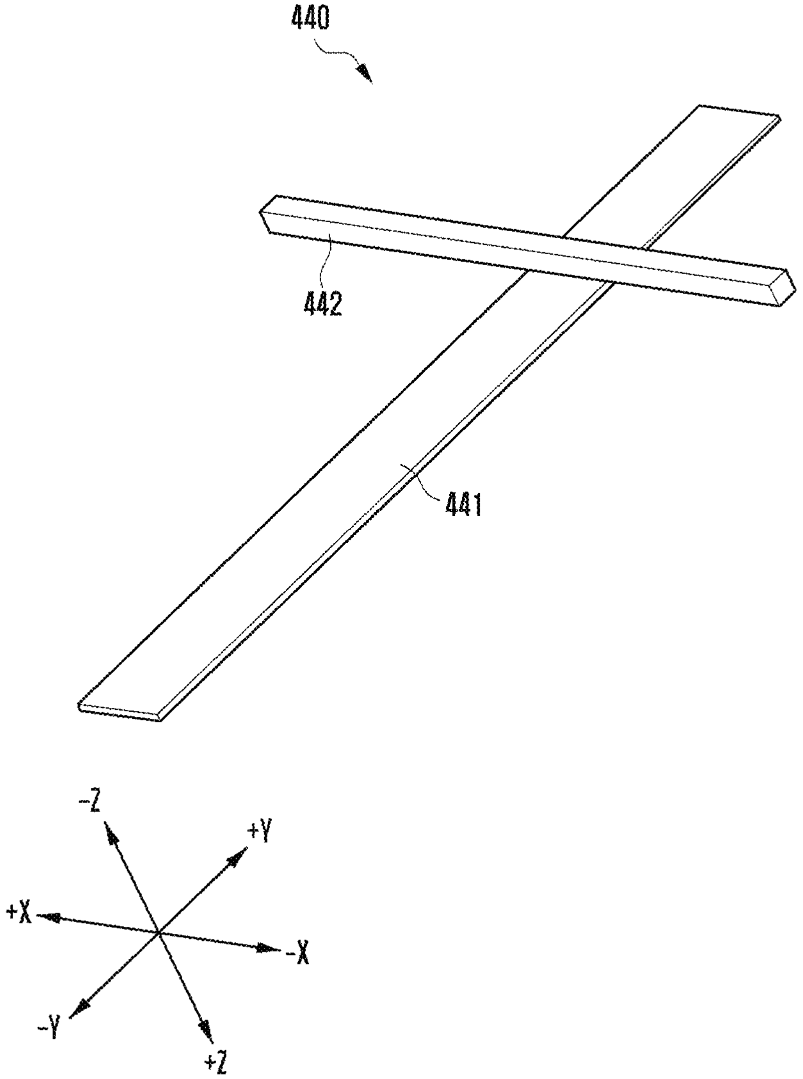
FIG. 8 is a diagram illustrating a thermal diffusion member according to one or more embodiments.

FIG. 8 is a diagram illustrating a thermal diffusion member 440 according to one or more embodiments.

According to one or more embodiments, the thermal diffusion member 440 may include a first diffusion portion 441 and a second diffusion portion 442.

According to one or more embodiments, the first diffusion portion 441 may be extended in a direction substantially perpendicular to the second diffusion portion 442. According to one or more embodiments, the first diffusion portion 441 may be extended along a length direction of the electronic device 400 and the second diffusion portion 442 may be extended along a width direction of the electronic device 400.

According to one or more embodiments, at least a portion of the second diffusion portion 442 may be disposed on one surface of the first diffusion portion 441. According to one or more embodiments, at least a portion of the second diffusion portion 442 may be disposed in a direction facing away from the first diffusion portion 441 in a negative z-axis direction. The direction in which the second diffusion portion 442 is disposed relative to the first diffusion portion 441 may be an opposite direction in which the thermal diffusion sheet 490 (see FIG. 7) is disposed.

According to one or more embodiments, the thermal diffusion member 440 may serve to diffuse heat generated by a heat source in the electronic device 400 to other areas of the electronic device 400.

According to one or more embodiments, the first diffusion portion 441 and the second diffusion portion 442 may be integrally formed. According to one or more embodiments, rather than having a second diffusion portion 442 formed separately from the first diffusion portion 441 and disposed in the first diffusion portion 441, the first diffusion portion 441 and the second diffusion portion 442 may be processed integrally to form the thermal diffusion member 440.

According to one or more embodiments, the first diffusion portion 441 may be formed in the shape of a rectangular plate. According to one or more embodiments, the second diffusion portion 442 may be formed in a cuboidal bar shape. If the thermal diffusion member 440 is formed in a plate or rod shape, the thermal diffusion member 440 may be easier to manufacture. If the thermal diffusion member 440 is formed in a plate or rod shape, it may be easy to form the first diffusion portion 441 and the second diffusion portion 442 integrally.

Figure 9:
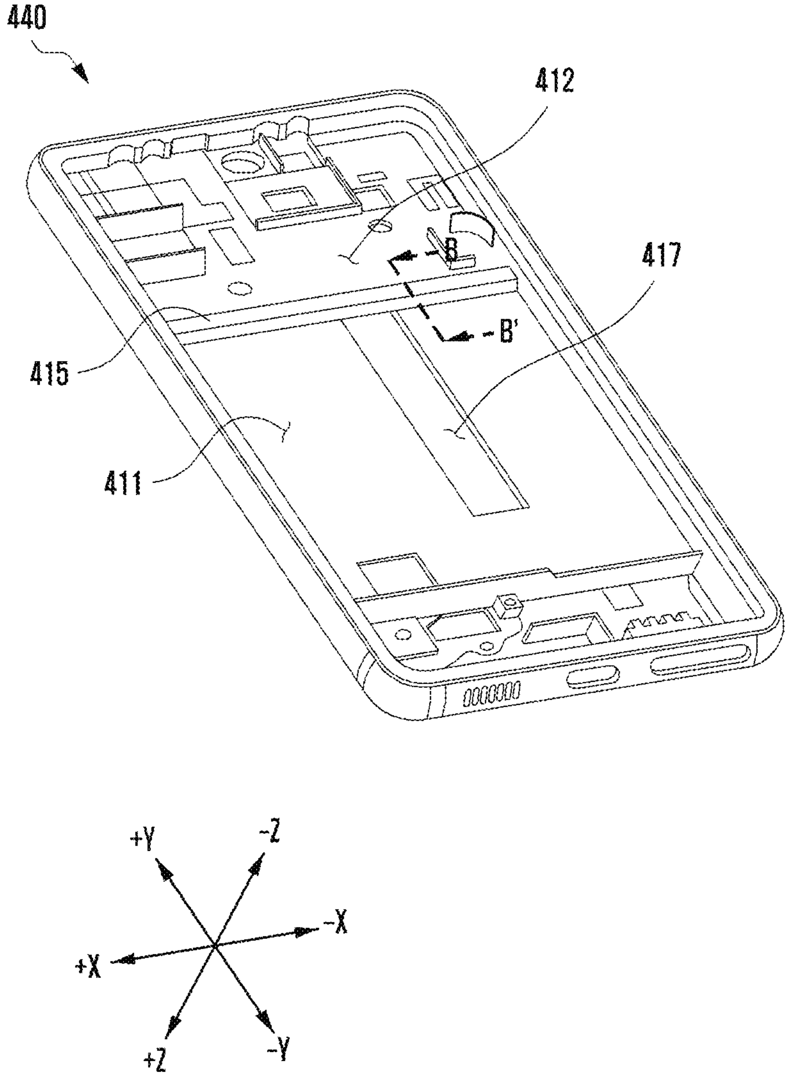
FIG. 9 is a diagram illustrating a housing according to one or more embodiments.

FIG. 9 is a diagram illustrating a housing 410 according to one or more embodiments.

The housing 410 according to one or more embodiments may include a first space 411, a second space 412, a support portion 415, and a placement space 417.

According to one or more embodiments, the first space 411 may be a space where the battery 330 (see FIG. 3) is disposed. The second space 412 may be a space where the printed circuit board 380 (see FIG. 3) is disposed.

According to one or more embodiments, the support portion 415 may be formed between the first space 411 and the second space 412. According to one or more embodiments, the first space 411 and the second space 412 may be separated by the support portion 415. The support portion 415 may be extended along a width direction (e.g., an x-axis direction) of the electronic device 400.

According to one or more embodiments, the housing 410 may increase the rigidity by including a support portion 415. The support portion 415 may be disposed to support at least a portion of the housing 410 within the housing 410 to improve the rigidity of the housing 410. According to one or more embodiments, the housing 410 including the support portion 415 may increase the resistance to bending.

According to one or more embodiments, the placement space 417 may be formed at least in part in the first space 411. The placement space 417 may be an opening formed in a shape corresponding to at least a portion of the thermal diffusion member 440. According to one or more embodiments, the placement space 417 may be formed in a rectangular opening shape that corresponds to a first diffusion portion 441 (see FIG. 8) of the thermal diffusion member 440 (see FIG. 8).

Figure 10:
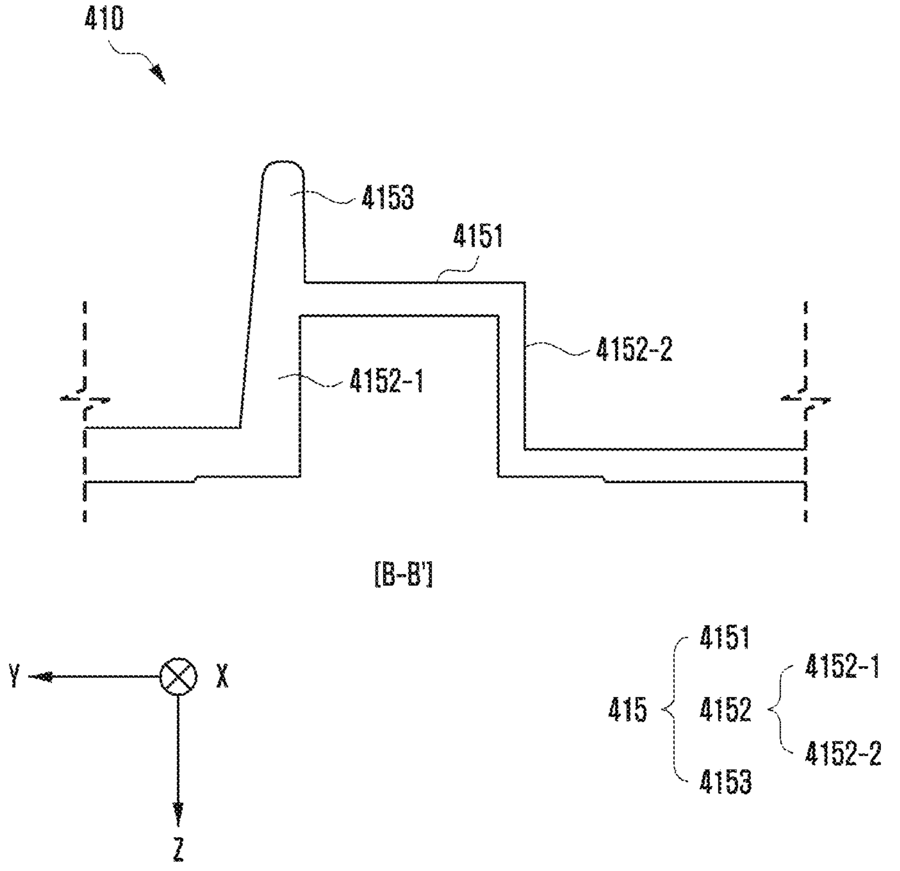
FIG. 10 is a diagram illustrating a support portion of a housing according to one or more embodiments.

FIG. 10 is a diagram illustrating a support portion 415 of a housing 410 according to one or more embodiments.

FIG. 10 may be a diagram illustrating a support portion 415 of the housing 410 as viewed from the B-B' cross-section shown in FIG. 9.

According to one or more embodiments, the support portion 415 may include a first support portion 4151, a second support portion 4152, and a third support portion 4153.

According to one or more embodiments, the first support portion 4151 may be extended in a direction substantially perpendicular to the second support portion 4152 and the third support portion 4153.

According to one or more embodiments, there may be two second support portions 4152. According to one or more embodiments, the second support portion 4152 may include a first-second support portion 4152-1 and a second-second support portion 4152-2. The first-second support portion 4152-1 may be extended in a direction substantially perpendicular to the first support portion 4151 on one side of the first support portion 4151. The second-second support portion 4152-2 may be extended in a direction substantially perpendicular to the first support portion 4151 on the other side of the first support portion 4151.

According to one or more embodiments, a second diffusion portion 442 (see FIG. 8) of the thermal diffusion member 440 (see FIG. 8) may be disposed between the space surrounded by the first support portion 4151 and the second support portion 4152.

According to one or more embodiments, the second diffusion portion 442 (see FIG. 8) of the thermal diffusion member 440 (see FIG. 8) may maintain a predetermined position within the electronic device 400 by being supported by the first support portion 4151 and the second support portion 4152.

According to one or more embodiments, the first support portion 4151 may be disposed between the second diffusion portion 442 (see FIG. 8) and the second portion 332 (see FIG. 6A) of the battery 330 (see FIG. 6B).

According to one or more embodiments, the third support portion 4153 may be positioned in one direction of the battery 330 (see FIG. 6A). According to one or more embodiments, the third support portion 4153 may be extended in the opposite direction of the second support portion 4152 and may be positioned in a positive y-axis direction relative to the second portion 332 (see FIG. 6A) of the battery 330 (see FIG. 6A). The third support portion 4153 may be disposed to face the second portion 332 (see FIG. 6A) of the battery 330 (see FIG. 6A).

According to one or more embodiments, the battery 330 (see FIG. 6A) may maintain a predetermined position within the electronic device 400 by being supported by a first support portion 4151, a second support portion 4152, and a third support portion 4153.

Figure 11:
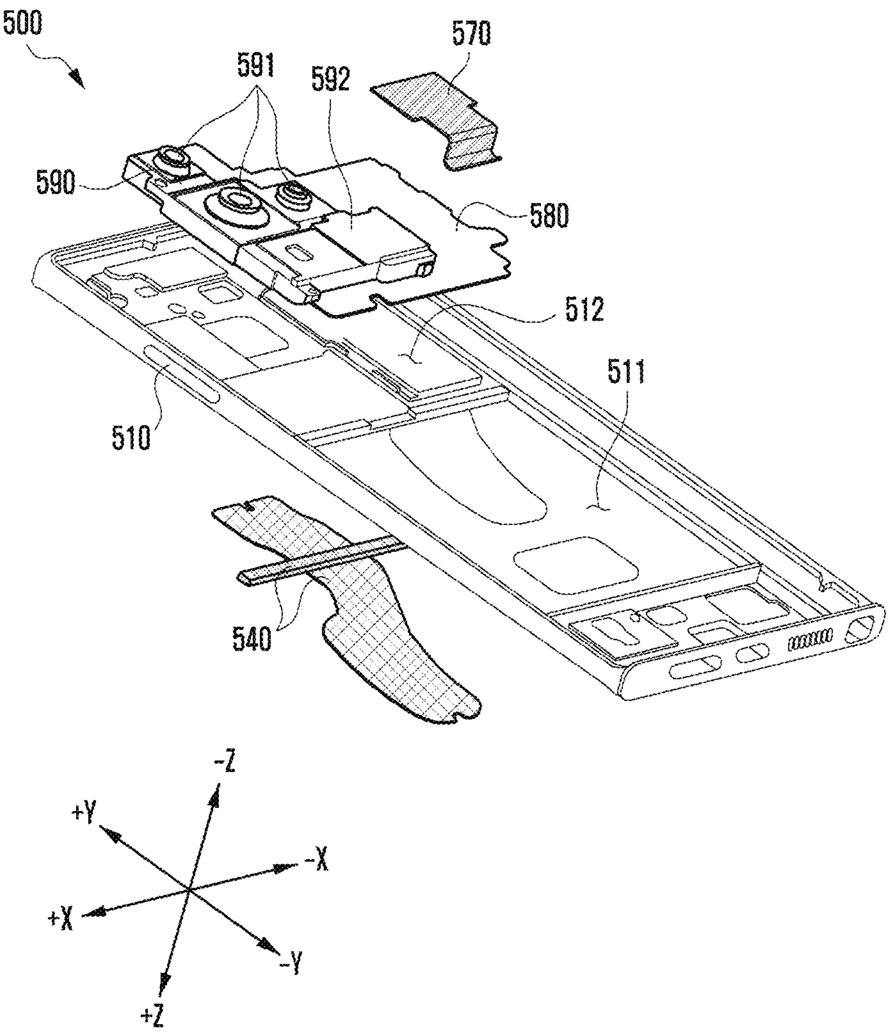
FIG. 11 is an exploded perspective view of an electronic device according to one or more embodiments.

FIG. 11 is an exploded perspective view of an electronic device 500 according to one or more embodiments.

The electronic device 500 shown in FIG. 11 may refer to the electronic device 101 of FIG. 1 or may include at least a portion of the electronic device 101 of FIG. 1.

The electronic device 500 shown in FIG. 11 may include at least a portion of the electronic devices 200 and 300 of FIGS. 2 and 3.

In describing the electronic device 500 of FIG. 11, a width direction of the electronic device 500 may mean an x-axis direction, and a length direction of the electronic device 500 may mean a y-axis direction. A height direction of the electronic device 500 may mean a z-axis direction.

An electronic device 500 according to one or more embodiments may include a housing 510, a first thermal diffusion member 540, a second thermal diffusion member 570, a printed circuit board 580, and a camera module 590.

According to one or more embodiments, the housing 510 may form the exterior of the electronic device 500. With reference to FIG. 3, the housing 510 may include a first space 511 and a second space 512 within which different configurations of electronic device 500 may be disposed. The first space 511 may be a space where the battery 330 (see FIG. 3) is disposed. The second space 512 may be a space where the printed circuit board 580 and the camera module 590 are disposed.

According to one or more embodiments, the camera module 590 may include at least one camera 591 and a camera deco 592. The camera deco 592 may be disposed to cover or surround at least a portion of the camera 591.

The thermal diffusion member 540 according to one or more embodiments shown in FIG. 11 may be substantially the same as the thermal diffusion member 340 shown in FIG. 3. The thermal diffusion member 540 of FIG. 11 may have substantially the same shape and function as the thermal diffusion member 340 of FIG. 3.

According to one or more embodiments, the thermal diffusion member 540 may include a first diffusion portion 541 and a second diffusion portion 542.

According to one or more embodiments, the second thermal diffusion member 570 may be extended at least partially in the height direction of the electronic device 500. The second thermal diffusion member 570 may serve to diffuse heat within the electronic device 500 in the height direction of the electronic device 500.

The electronic device 500 according to one or more embodiments may include a second thermal diffusion member 570, which can diffuse heat inside the electronic device 500 in the height direction of the electronic device 500, thereby improving the thermal diffusion performance of the electronic device 500.

Figure 12:
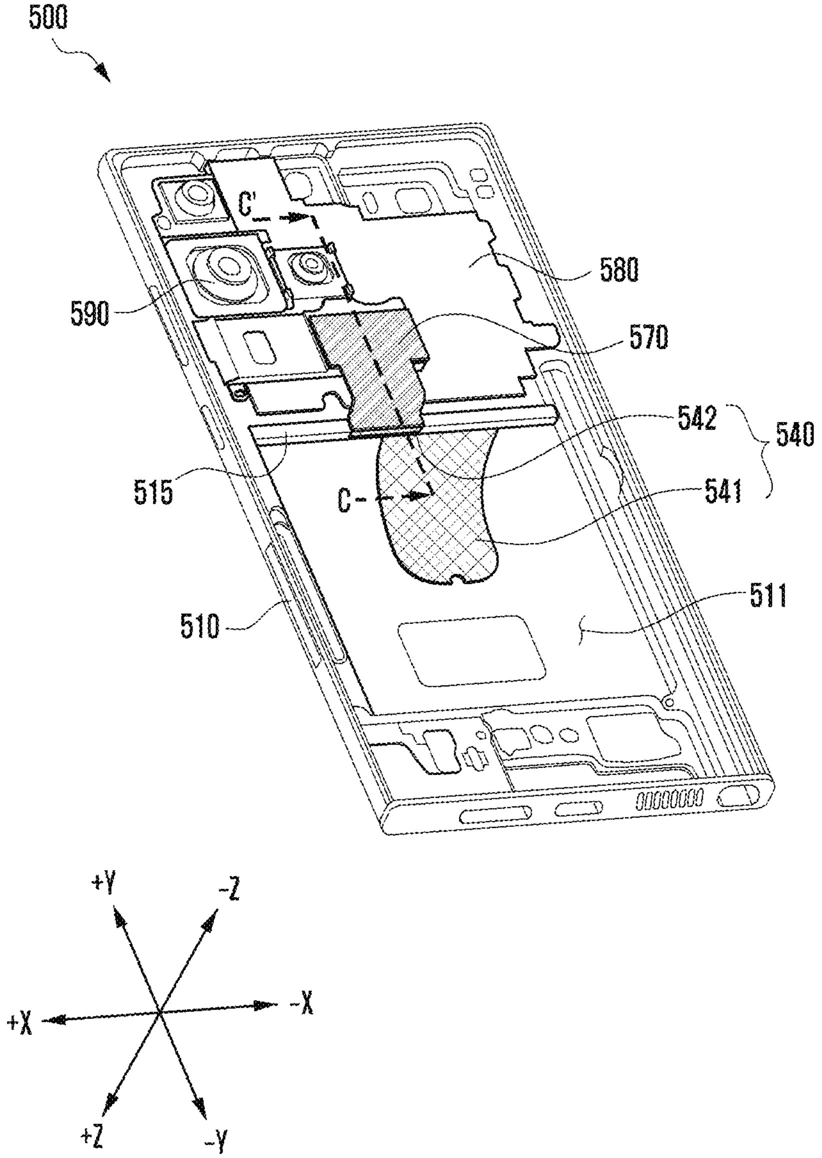
FIG. 12 is a diagram illustrating an electronic device according to one or more embodiments.

FIG. 12 is a diagram illustrating an electronic device 500 according to one or more embodiments.

With reference to FIG. 12, an electronic device 500 according to one or more embodiments may include a housing 510, a first thermal diffusion member 540, a second thermal diffusion member 570, a printed circuit board 580, and a camera module 590.

According to one or more embodiments, the printed circuit board 580 and the camera module 590 may be disposed in the second space 512 of the housing 510. The camera module 590 may be disposed on one side of the printed circuit board 580.

According to one or more embodiments, the housing 510 may include a support portion 515. The support portion 515 may be extended along a width direction (e.g., an x-axis direction) of the electronic device 500 within the housing 510. Bounding the support portion 515, a first space 511 and a second space 512 of the housing 510 may be separated.

According to one or more embodiments, the first thermal diffusion member 540 may be at least partially disposed in the support portion 515. According to one or more embodiments, a second diffusion portion 542 of the first thermal diffusion member 540 may be disposed in the support portion 515.

According to one or more embodiments, at least a portion of the second thermal diffusion member 570 may be disposed in an opposite direction of the first thermal diffusion member 540 relative to the printed circuit board 580. According to one or more embodiments, a portion of the first thermal diffusion member 540 may be disposed in one direction (e.g., a positive z-axis direction) of the printed circuit board 580, and a portion of the second thermal diffusion member 570 may be disposed in the other direction (e.g., a negative z-axis direction) of the printed circuit board 580.

According to one or more embodiments, the second thermal diffusion member 570 may be in contact with the first thermal diffusion member 540 at one end and with the camera module 590 at the other end, which is the opposite end of the one end.

According to one or more embodiments, the second thermal diffusion member 570 may be extended at least partially in the height direction of the electronic device 500 and may diffuse heat transferred from the first thermal diffusion member 540 in the height direction of the electronic device 500.

According to one or more embodiments, at least a portion of the support portion 515 may be formed in an open configuration. The second diffusion portion 542 of the first thermal diffusion member 540 may be in contact with the second thermal diffusion member 570 in the open portion of the support portion 515.

Figure 13:
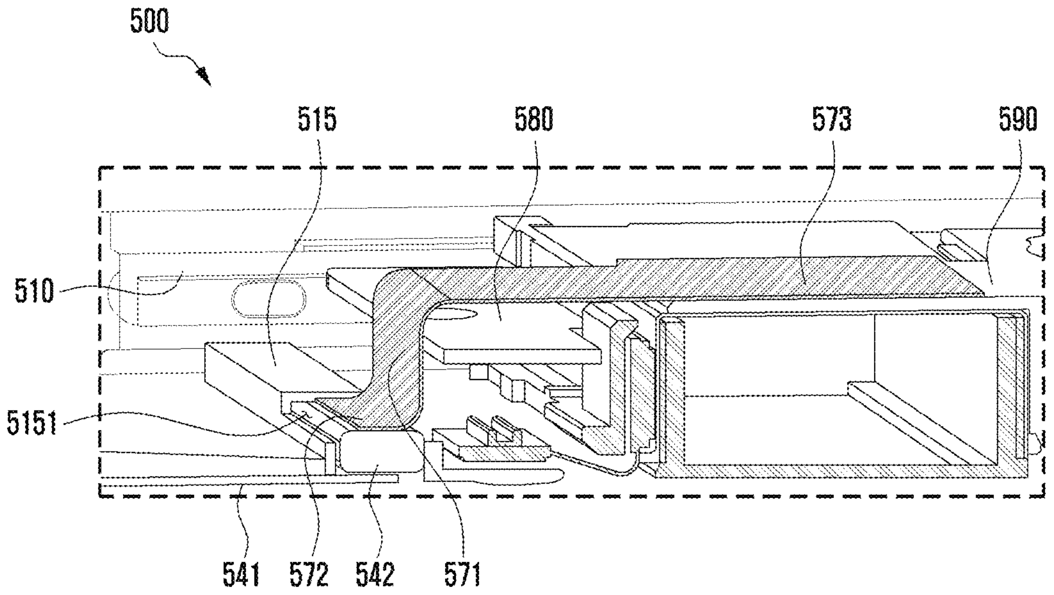
FIG. 13 is a cross-sectional perspective view of an electronic device according one or more embodiments.
Figure 13:
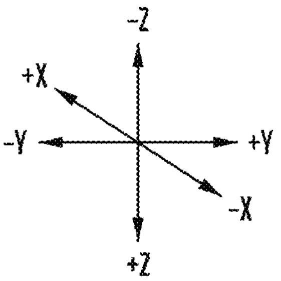

FIG. 13 is a cross-sectional perspective view of electronic device according to one or more embodiments.

FIG. 13 may be a cross-sectional perspective view of the electronic device 500 as viewed from the C-C' cross-section of FIG. 12.

According to one or more embodiments, the support portion 515 of the housing 510 may include a diffusion opening 5151 through which a portion of the support portion 515 is open. At the diffusion opening 5151, a second diffusion portion 542 of the first thermal diffusion member 540 may be exposed.

According to one or more embodiments, the second thermal diffusion member 570 may include an extended portion 571, a first contact portion 572, and a second contact portion 573.

According to one or more embodiments, the first contact portion 572 of the second thermal diffusion member 570 may be in contact with the first thermal diffusion member 540. According to one or more embodiments, the first contact portion 572 may be in contact with the second diffusion portion 542 of the first thermal diffusion member 540 located at the diffusion opening 5151.

According to one or more embodiments, the extended portion 571 may be extended in a height direction (e.g., a z-axis direction) of the electronic device 500. The extended portion 571 may connect with the first contact portion 572 at one end and with the second contact portion 573 at the other end.

According to one or more embodiments, a second contact portion 573 of the second thermal diffusion member 570 may be in contact with the camera module 590. The second thermal diffusion member 570 may diffuse heat transferred from the first thermal diffusion member 540 in the direction in which the camera module 590 is located.

With reference to FIG. 13, a second contact portion 573 of the second thermal diffusion member 570 according to one or more embodiments is shown to be disposed on the camera module 590, but the location where the second contact portion 573 is disposed may not be limited thereto. The second contact portion 573 may also be disposed to contact other configurations of the electronic device 500 than the camera module 590.

Figure 14A:
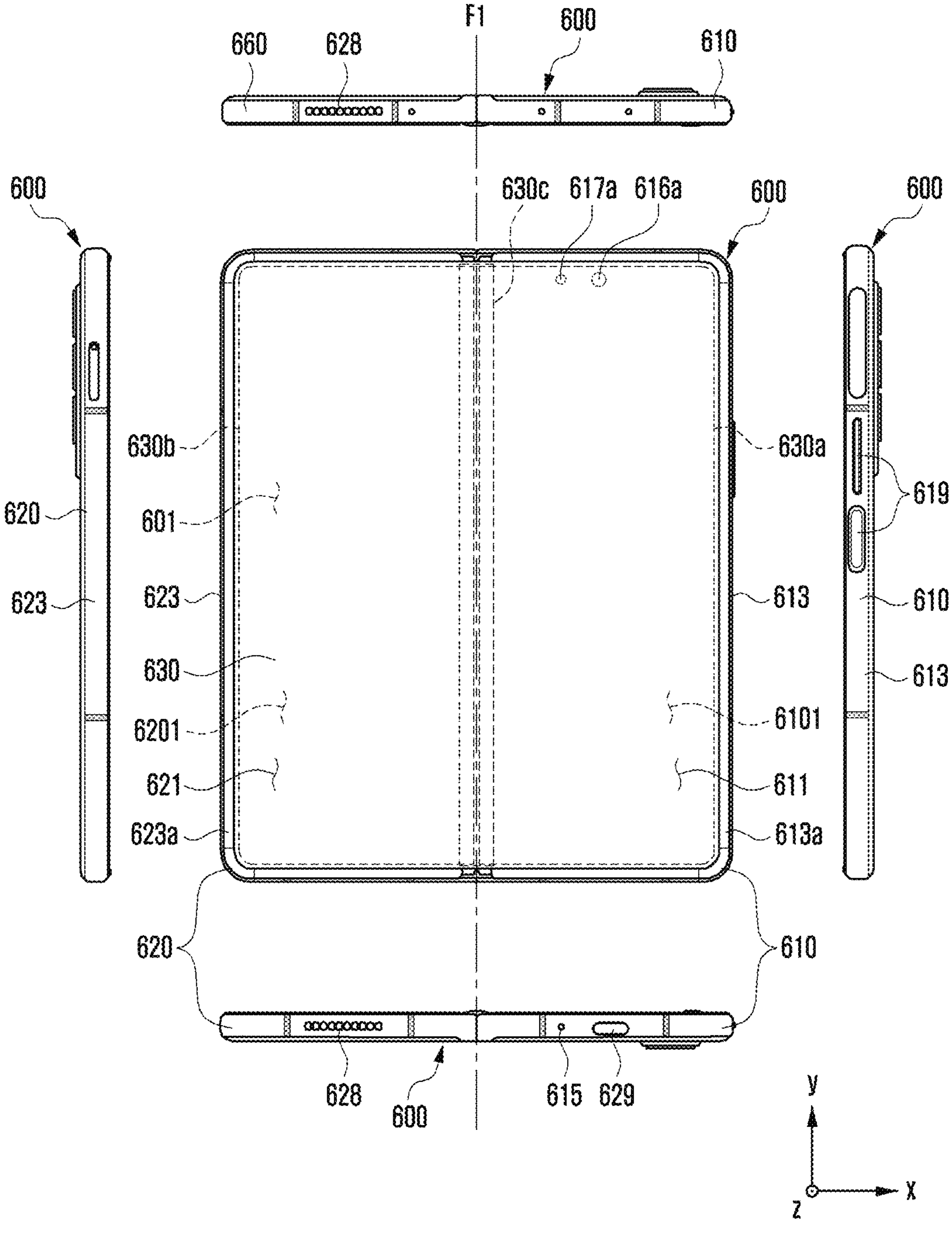
FIG. 14A is a front view and side views of an unfolded electronic device according to one or more embodiments.
Figure 14B:
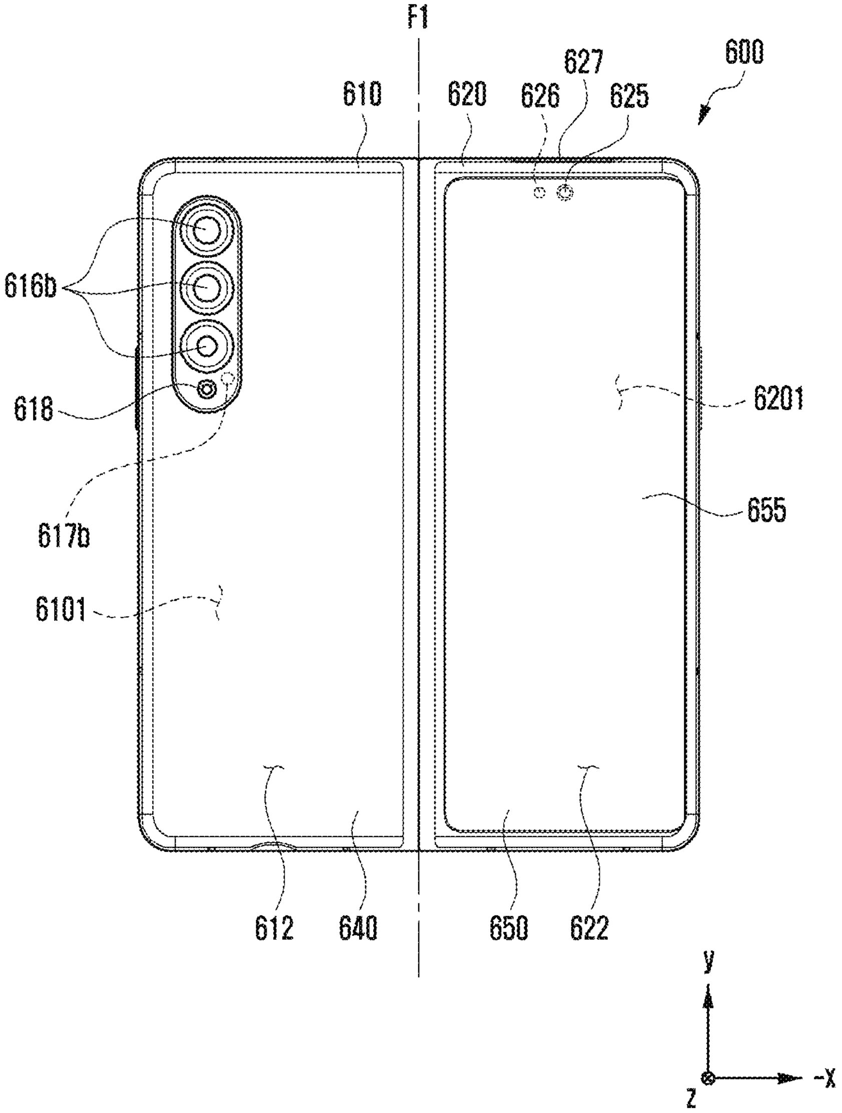
FIG. 14B is a rear view of an unfolded electronic device according to one or more embodiments.
Figure 15A:
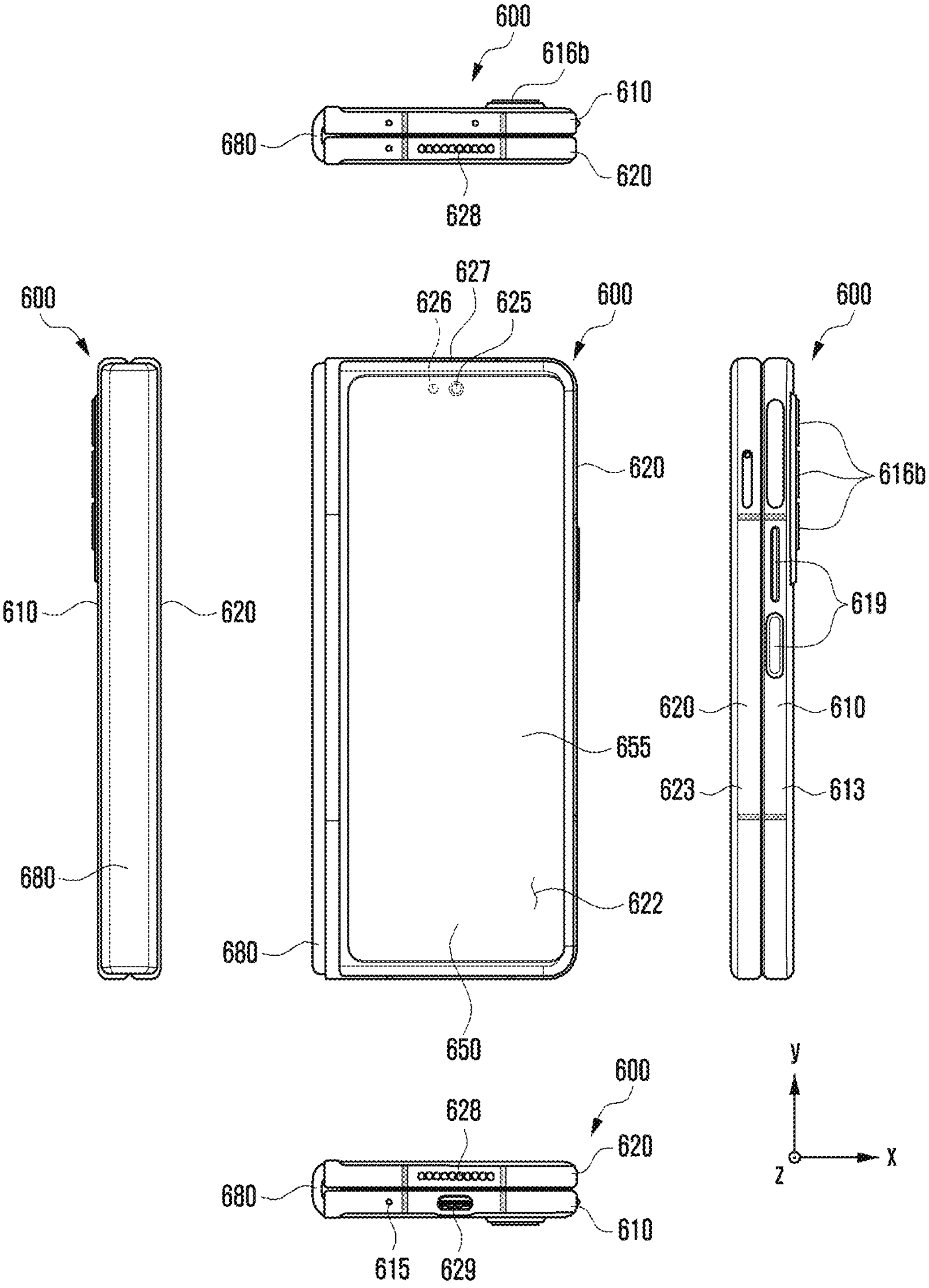
FIG. 15A is a front view and side views of a folded electronic device according to one or more embodiments.
Figure 15B:
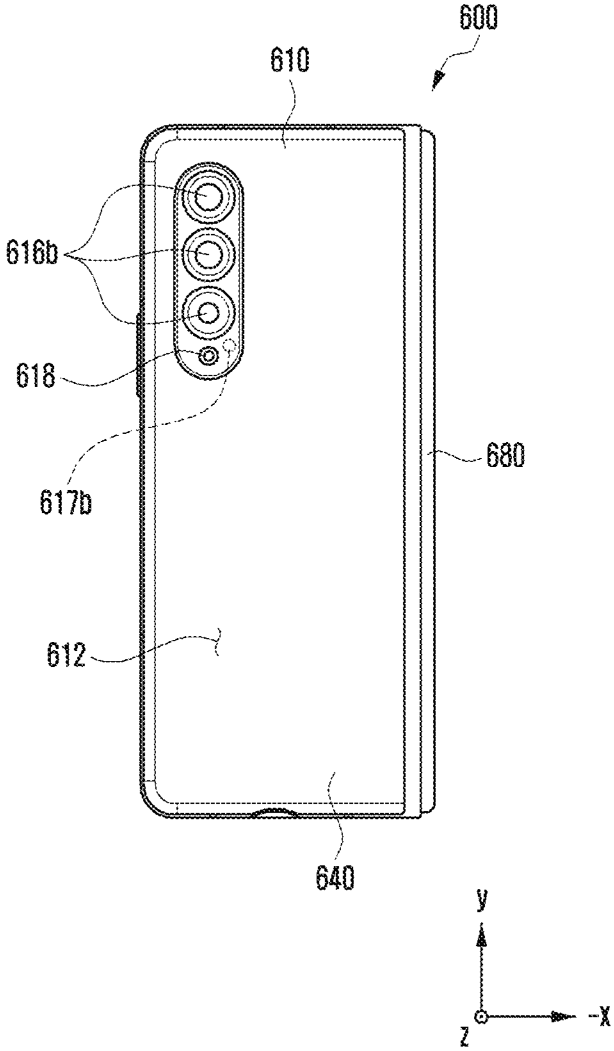
FIG. 15B is a rear view of the folded electronic device according to one or more embodiments.

FIGS. 14A and 14B are diagrams illustrating a front view and a rear view, respectively, of an unfolded state of an electronic device according to an embodiment. FIGS. 15A and 15B are diagrams illustrating a front view and a rear view, respectively, of a folded state of an electronic device according to an embodiment.

Referring to FIGS. 14A, 14B, 15A and 15B, an electronic device 600 may include a pair of housings 610 and 620 (e.g., a foldable housing structure) rotatably coupled to each other with reference to folding axis F1 through a hinge device (e.g., a hinge device 685 and 687 of FIG. 16) (e.g., a hinge module) so as to be folded with respect to each other, a first display 630 (e.g., a flexible display, a foldable display, or a main display) disposed through the pair of housings 610 and 620, and/or a second display 655 (e.g., a sub display) disposed through the second housing 620. According to one or more embodiments, at least a part of the hinge device (e.g., the hinge device 685 and 687 of FIG. 16) may be disposed so as not to be seen from the outside through the first housing 610 and the second housing 620, and may be disposed so as not to be seen from the outside through the hinge housing 680 covering a foldable portion. According to one or more embodiments, the hinge device may include a hinge module including a gear assembly including multiple gears and multiple hinge cams which are coupled to hinge shafts rotating through the gear assembly and perform a cam interlocking operation, and hinge plates for connecting the hinge model to the first housing 610 and the second housing 620. A surface in which the first display 630 is disposed may be defined as a front surface of the electronic device 600, and a surface opposite to the front surface may be defined as a rear surface of the electronic device 600. In addition, a surface surrounding a space between the front surface and the rear surface may be defined as a side surface of the electronic device 600.

Figure 16:
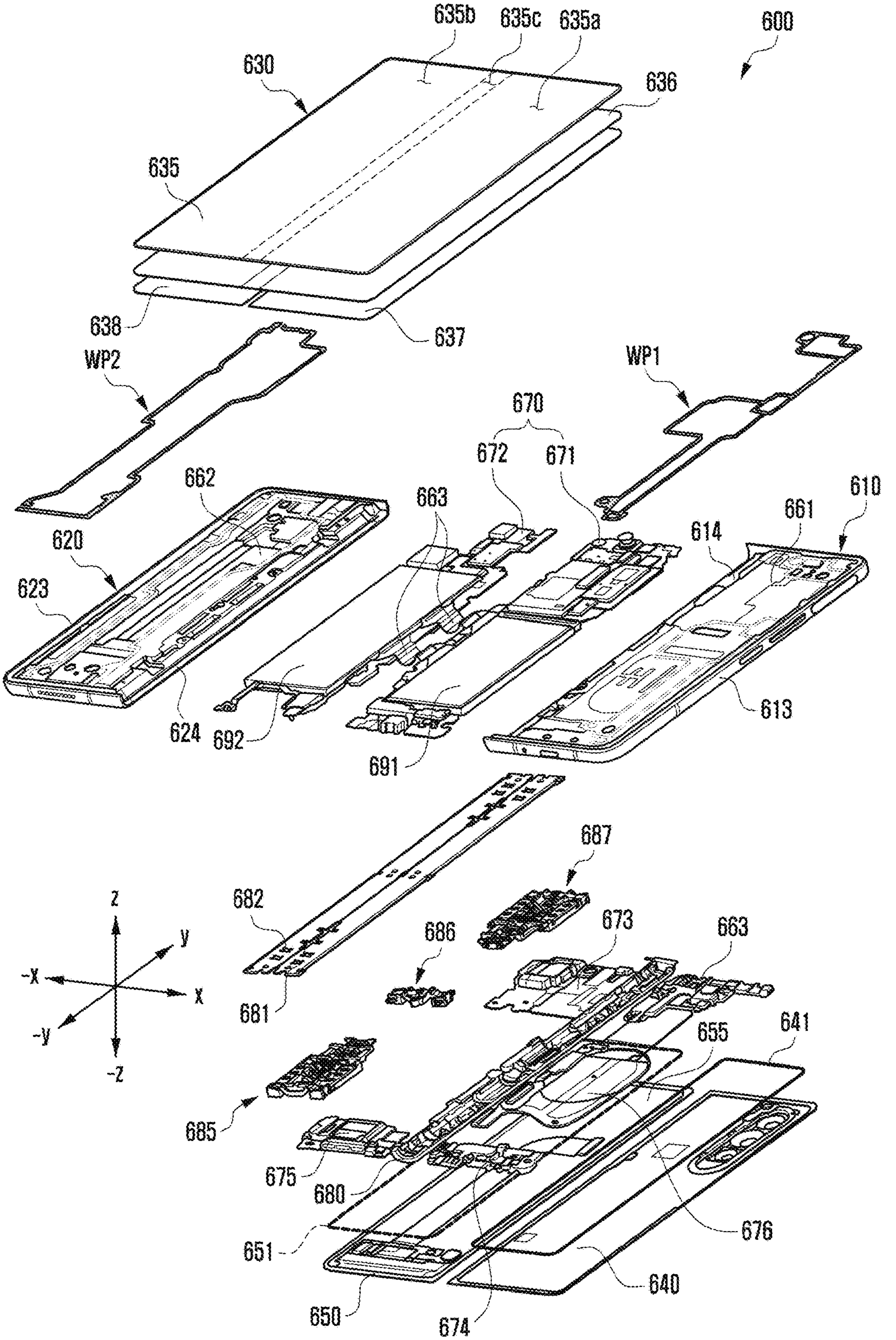
FIG. 16 is an exploded perspective view of an electronic device according to one or more embodiments.

According to one or more embodiments, the pair of housings 610 and 620 may include a first housing 610 and a second housing 620 foldably arranged with respect to each other through the hinge device (e.g., the hinge device 685 and 687 of FIG. 16). According to one or more embodiments, the shape and the coupling of the pair of housings 610 and 620 are not limited to those illustrated in FIGS. 14A to 15B, and the pair of housings 610 and 620 may be implemented by a combination and/or coupling of other shapes or components. According to one or more embodiments, the first housing 610 and the second housing 620 may be arranged on opposite sides with reference to the folding axis F1, and may have shapes that are entirely symmetric to each other with respect to the folding axis F1. According to one or more embodiments, the first housing 610 and the second housing 620 may be asymmetrically folded with reference to the folding axis F1. According to one or more embodiments, the angle or the distance between the first housing 610 and the second housing 620 may vary depending on whether the electronic device 600 is in an unfolded state, a folded state, or an intermediate state.

According to one or more embodiments, the first housing 610 may include, in the unfolded state of the electronic device 600, a first surface 611 connected to the hinge device (e.g., the hinge device 685 and 687 of FIG. 16) and disposed to be oriented to the front surface of the electronic device 600, a second surface 612 oriented in a direction opposite to the first surface 611, and/or a first side member 613 surrounding at least a part of a first space between the first surface 611 and the second surface 612. According to one or more embodiments, the second housing 620 may include, in the unfolded state of the electronic device 600, a third surface 621 connected to the hinge device (e.g., the hinge device 685 and 687 of FIG. 16) and disposed to be oriented to the front surface of the electronic device 600, a fourth surface 622 oriented in a direction opposite to the third surface 621, and/or a second side member 623 surrounding at least a part of a second space between the third surface 621 and the fourth surface 622. According to one or more embodiments, the first surface 611 and the third surface 621 may be oriented in substantially the same direction in the unfolded state, and the first surface 611 and the third surface 621 may at least partially face each other in the folded state. According to one or more embodiments, the electronic device 600 may include a recess 601 formed to receive the first display 630 through structural coupling of the first housing 610 and the second housing 620. According to one or more embodiments, the recess 601 may have substantially the same shape as the first display 630. According to one or more embodiments, the first housing 610 may include a first protection frame 613*a* (e.g., a first decoration member) which is, when seen from above the first display 630, coupled to the first side member 613, disposed to overlap with an edge of the first display 630, so as to cover the edge of the first display 630 to allow the same not to be seen from the outside. According to one or more embodiments, the first protection frame 613*a* may be integrally formed with the first side member 613. According to one or more embodiments, the second housing 620 may include a second protection frame 623*a* (e.g., a second decoration member) which is, when seen from above the first display 630, coupled to the second side member 623, disposed to overlap with an edge of the first display 630, so as to cover the edge of the first display 630 to allow the same not to be seen from the outside. According to one or more embodiments, the second protection frame 623*a* may be integrally formed with the first side member 623. According to one or more embodiments, the first protection frame 613*a* and the second protection frame 623*a* may be omitted.

According to one or more embodiments, the hinge housing 680 (e.g., a hinge cover) may be disposed between the first housing 610 and the second housing 620, and may be disposed to cover a part (e.g., at least one hinge module) of the hinge device (e.g., the hinge device 685 and 687 of FIG. 16) disposed on the hinge housing 680. According to one or more embodiments, the hinge housing 680 may be hidden or exposed from or to the outside by a part of the first housing 610 and the second housing 620 according to the unfolded state, the folded state, or the intermediate state of the electronic device 600. According to one or more embodiments, when the electronic device 600 is in the unfolded state, at least a part of the hinge housing 680 may be covered by the first housing 610 and the second housing 620 and not be substantially exposed. According to one or more embodiments, when the electronic device 600 is in the folded state, at least a part of the hinge housing 680 may be exposed to the outside between the first housing 610 and the second housing 620. According to one or more embodiments, in the intermediate state in which the first housing 610 and the second housing 620 are folded with each other by a predetermined angle (folded with a certain angle), the hinge housing 680 may be at least partially exposed to the outside of the electronic device 600 between the first housing 610 and the second housing 620. According to one or more embodiments, an area in which the hinge housing 680 is exposed to the outside, may be smaller than that in a case in which the electronic device 600 is completely folded. According to one or more embodiments, the hinge housing 680 may include a curved surface.

According to one or more embodiments, when the electronic device 600 is in the unfolded state (e.g., the states shown in FIGS. 14A and 14B), the first housing 610 and the second housing 620 may meet at an about 180-degree angle, and a first area 630*a*, a second area 630*b*, and a folding area 630*c* of the first display 630 may form the same plane and arranged to be oriented in substantially the same direction (e.g., a z-axis direction). According to one or more embodiments, when the electronic device 600 is in the unfolded state, the first housing 610 may rotate by an about 360-degree angle with respect to the second housing 620, and may be outwardly folded (an out-folding scheme) so that the second surface 612 and the fourth surface 622 face each other.

According to one or more embodiments, when the electronic device 600 is in the folded state (e.g., the states shown in FIGS. 15A and 15B), the first surface 611 of the first housing 610 and the third surface 621 of the second housing 620 may be arranged to face each other. In this case, the first area 630*a* and the second area 630*b* of the first display 630 may form a narrow angle (e.g., a range between 0 degrees to about 10 degrees) through the folding area 630*c*, and may be arranged to face each other. According to one or more embodiments, at least a part of the folding area 630*c* may be deformed into a curved shape having a predetermined curvature. According to one or more embodiments, when the electronic device 600 is in the intermediate state, the first housing 610 and the second housing 620 may be arranged at a predetermined angle (a certain angle). In this case, the first area 630*a* and the second area 630*b* of the first display 630 may form an angle that is greater than that in the folded state and smaller than that in the unfolded state, and the curvature of the folding area 630*c* may be lower than that in the folded state, and may be higher than that in the unfolded state. In one or more embodiments, the first housing 610 and the second housing 620 may form an angle which allows stopping at a designated folding angle between the folded state and the unfolded state (a free stop function), through the hinge device (e.g., the hinge device 685 and 687 of FIG. 16). In one or more embodiments, the first housing 610 and the second housing 620 may continuously operate while being pressed in an unfolding direction or a folding direction with reference to a designated inflection angle, through the hinge device (e.g., the hinge device 685 and 687 of FIG. 16).

According to one or more embodiments, the electronic device 600 may include at least one of at least one display 630 and 655 disposed on the first housing 610 and/or the second housing 620, an input device 615, sound output devices 627 and 628, sensor modules 617*a*, 617*b*, and 626, camera modules 616*a*, 616*b*, and 625, a key input device 619, an indicator, or a connector port 629. In one or more embodiments, the electronic device 600 may omit at least one of the elements, or may additionally include at least one another element.

According to one or more embodiments, the at least one display 630 and 655 may include a first display 630 (e.g., a flexible display) disposed to be supported by the third surface 621 of the second housing 620 from the first surface 611 of the first housing 610 through the hinge device (e.g., the hinge device 685 and 687 of FIG. 16), and a second display 655 disposed to be at least partially seen from the outside through the fourth surface 622 in a space in the second housing 620. In one or more embodiments, the second display 655 may be disposed to be seen from the outside through the second surface 612 in a space in the first housing 610. According to one or more embodiments, the first display 630 may be mainly used in the unfolded state of the electronic device 600, and the second display 655 may be mainly used in the folded state of the electronic device 600. According to one or more embodiments, the electronic device 600 may control, in the intermediate state, the first display 630 and/or the second display 655 to be used, based on a folding angle between the first housing 610 and the second housing 620.

According to one or more embodiments, the first display 630 may be disposed in a receiving space formed by the pair of housings 610 and 620. According to one or more embodiments, the first display 630 may be disposed in a recess 601 formed by the pair of housings 610 and 620, and may be disposed to occupy substantially the most of the front surface of the electronic device 600 in the unfolded state. According to one or more embodiments, the first display 630 may include a flexible display having at least one area which can be deformed into a plane or a curved surface. According to one or more embodiments, the first display 630 may include the first area 630*a* facing the first housing 610 and the second area 630*b* facing the second housing 620. According to one or more embodiments, the first display 630 may include the folding area 630*c* including a part of the first area 630*a* and a part of the second area 630*b* with respect to the folding axis F1. According to one or more embodiments, at least a part of the folding area 630*c* may include an area corresponding to the hinge device (e.g., the hinge device 685 and 687 of FIG. 16). According to one or more embodiments, a division of an area of the first display 630 merely corresponds to an example physical division by the pair of housings 610 and 620 and the hinge device (e.g., the hinge device 685 and 687 of FIG. 16), and the first display 630 may be substantially displayed as one seamless full screen through the pair of the housings 610 and 620 and the hinge device (e.g., the hinge device 685 and 687 of FIG. 16). According to one or more embodiments, the first area 630*a* and the second area 630*b* may have shapes that are entirely symmetric or partially asymmetric to each other with respect to the folding area 630*c*.

According to one or more embodiments, the electronic device 600 may include a first rear cover 640 disposed on the second surface 612 of the first housing 610 and a second rear cover 650 disposed on the fourth surface 622 of the second housing 620. In one or more embodiments, at least a part of the first rear cover 640 may be integrally formed with the first side member 613. In one or more embodiments, at least a part of the second rear cover 650 may be integrally formed with the second side member 623. According to one or more embodiments, at least one of the first rear cover 640 and the second rear cover 650 may be substantially formed of a transparent plate (e.g., a polymer plate or glass plate including various coding layers) or an opaque plate. According to one or more embodiments, the first rear cover 640 may be formed of an opaque plate such as coded or colored glass, ceramic, polymer, metal (e.g., aluminum, stainless steel (STS), or magnesium), or a combination of at least two of the materials above. According to one or more embodiments, the second rear cover 650 may be substantially formed of a transparent plate such as glass or polymer. Accordingly, the second display 655 may be disposed to be seen from the outside through the second rear cover 650 in a space in the second housing 620.

According to one or more embodiments, the input device 615 may include a microphone. In one or more embodiments, the input device 615 may include multiple microphones arranged to detect the direction of sound. According to one or more embodiments, the sound output devices 627 and 628 may include speakers. According to one or more embodiments, the sound output devices 627 and 628 may include a call receiver 627 disposed through the fourth surface 622 of the second housing 620 and an external speaker 628 disposed through at least a part of the second side member 623 of the second housing 620. In one or more embodiments, the input device 615, the sound output devices 627 and 628, and the connector 629 may be disposed in spaces of the first housing 610 and/or the second housing 620, and may be exposed to an external environment through at least one hole formed through the first housing 610 and/or the second housing 620. In one or more embodiments, holes formed through the first housing 610 and/or the second housing 620 may be commonly used for the input device 615 and the sound output devices 627 and 628. In one or more embodiments, the sound output devices 627 and 628 may include a speaker (e.g., a piezo speaker) operating without including a hole formed through the first housing 610 and/or the second housing 620.

According to one or more embodiments, the camera modules 616*a*, 616*b*, and 625 may include a first camera module 616*a* disposed on the first surface 611 of the first housing 610, a second camera module 616*b* disposed on the second surface 612 of the first housing 610, and/or a third camera module 625 disposed on the fourth surface 622 of the second housing 620. According to one or more embodiments, the electronic device 600 may include a flash 618 disposed around the second camera module 616*b*. According to one or more embodiments, the flash 618 may include a light-emitting diode or a xenon lamp. According to one or more embodiments, the camera modules 616*a*, 616*b*, and 625 may include one or multiple lenses, an image sensor, and/or an image signal processor. In one or more embodiments, at least one of the camera modules 616*a*, 616*b*, and 625 may include two or more lenses (e.g., wide-angle and telephoto lenses) and image sensors, and may be arranged together on one surface of the first housing 610 and/or the second housing 620.

According to one or more embodiments, the sensor modules 617*a*, 617*b*, and 626 may generate a data value or an electrical signal corresponding to an internal operational state or an external environmental state of the electronic device 600. According to one or more embodiments, the sensor modules 617*a*, 617*b*, and 626 may include a first sensor module 617*a* disposed on the first surface 611 of the first housing 610, a second sensor module 617*b* disposed on the second surface 612 of the first housing 610, and/or a third sensor module 626 disposed on the fourth surface 622 of the second housing 620. In one or more embodiments, the sensor modules 617*a*, 617*b*, and 626 may include at least one of a gesture sensor, a grip sensor, a color sensor, an infrared (IR) sensor, an illuminance sensor, an ultrasonic sensor, an iris recognition sensor, or a distance detection sensor (e.g., a time of flight (TOF) sensor or a light detection and ranging (LiDAR)).

According to one or more embodiments, the electronic device 600 may further include an unillustrated sensor module at least one of an atmospheric sensor, a magnetic sensor, a biometric sensor, a temperature sensor, a humidity sensor, or a fingerprint recognition sensor. In one or more embodiments, the fingerprint recognition sensor may be disposed through at least one of the first side member 613 of the first housing 610 and/or the second side member 623 of the second housing 620.

According to one or more embodiments, the key input device 619 may be disposed to be exposed to the outside through the first side member 613 of the first housing 610. In one or more embodiments, the key input device 619 may be disposed to be exposed to the outside through the second side member 623 of the second housing 620. In one or more embodiments, the electronic device 600 may not include some or all of the key input device 619, and the unincluded key input device 619 may be implemented in another shape such as a soft key on the least one display 630 and 655. In one or more embodiments, the key input device 619 may be implemented using a pressure sensor included in the at least one display 630 and 655.

According to one or more embodiments, the connector port 629 may include a connector (e.g., a USB connector or an IF module (an interface connector port module)) for transmitting or receiving data and/or power to and/or from an external electronic device. In one or more embodiments, the connector port 629 may perform a function of transmitting or receiving an audio signal to or from the external electronic device together, or may further include a separate connector port (e.g., an ear jack hole) for performing a function of transmitting or receiving an audio signal to or from the external electronic device.

According to one or more embodiments, at least one camera modules 616*a* and 625 of the camera modules 616*a*, 616*b*, and 625, at least one sensor module 617*a* and 626 of the sensor modules 617*a*, 617*b*, and 626, and/or an indicator may be arranged to be exposed through the at least one display 630 and 655. According to one or more embodiments, the at least one camera modules 616*a* and 625, the at least one sensor module 617*a* and 626, and/or the indicator may be arranged under an activated area (a display area) of the at least one display 630 and 655 in a space in the at least one housing 610 and 620, and may be arranged to come into contact with an external environment through a transparent area or an opening that is perforated to a cover member (e.g., a window layer of the first display 630 and/or the second rear cover 650). According to one or more embodiments, an area in which the at least one display 630 and 655 and the at least one camera module 616*a* and 625 face each other may be formed as a transmission area having a predetermined transmission ratio, as a part of an area in which a content is displayed. According to one or more embodiments, the transmission area may be formed to have a transmission ratio in the range of about 5% to about 20%. The transmission area may include an area overlapping with an effective area (e.g., an angle of view area) of the at least one camera module 616*a* and 625, wherein an image is formed on the image sensor in the effective area, and light for generating an image passes through the effective area. According to one or more embodiments, the transmission area of the display 630 and 655 may include an area in which the density of a pixel is lower than that in a surrounding area. According to one or more embodiments, the transmission area may be replaced with an opening. According to one or more embodiments, the at least one camera module 616*a* and 625 may include an under-display camera (UDC) or an under-panel camera (UPC). In one or more embodiments, some camera modules or sensor modules 617*a* and 626 may be arranged to perform functions thereof without being visually exposed through the display. According to one or more embodiments, an area facing the sensor module 617*a* and 626 and/or the camera module 616*a* and 625 arranged under the display 630 and 655 (e.g., a display panel) corresponds to an under-display camera (UDC) structure, and a perforated opening is not necessarily required.

FIG. 16 is an exploded perspective view of the electronic device 600 according to one or more embodiments of the disclosure.

Referring to FIG. 16, the electronic device 600 may include a first display 630 (e.g., a flexible display), a second display 655, at least one hinge device 685 and 687, and a pair of support members 661 and 662, at least one substrate 670 (e.g., a printed circuit board (PCB)), a first housing 610, a second housing 620, a first rear cover 640, and/or a second rear cover 650.

According to one or more embodiments, the first display 630 may include a display panel 635 (e.g., a flexible display panel) and a support plate 636 disposed under the display panel 635. According to one or more embodiments, the first display 630 may include a pair of reinforcing plates 637 and 638 disposed under the supporting plate 636. In some embodiments, the pair of reinforcing plates 637 and 638 may be omitted. According to one or more embodiments, the display panel 635 may include a first panel area 635*a* corresponding to a first area (e.g., the first area 630*a* in FIG. 14A) of the first display 630, a second panel area 635*b* extending from the first panel area 635*a* and corresponding to a second area (e.g., the second area 630*b* in FIG. 14A) of the first display 630, and a third panel area 635*c* connecting the first panel area 635*a* and the second panel area 635*b* and corresponding to a folding area (e.g., the folding area 630*c* in FIG. 14A) of the first display 630. According to one or more embodiments, the support plate 636 may be disposed between the display panel 635 and the pair of support members 661 and 662 and may be formed to have a material and shape for providing a planar support structure for the first panel area 635*a* and the second panel area 635*b*, and for providing a bendable structure for advantageously providing the flexibility to the third panel area 635*c*. According to one or more embodiments, the support plate 636 may be formed of a conductive material (e.g., metal) or a non-conductive material (e.g., a polymer or fiber reinforced plastic (FRP)). According to one or more embodiments, the pair of reinforcing plates 637 and 638 may be disposed between the support plate 636 and the pair of support members 661 and 662 and may include the first reinforcing plate 637 disposed to correspond to at least a part of the first panel area 635*a* and third area 635*c*, and the second reinforcing plate 638 disposed to correspond to at least a part of the second panel area 635*b* and the third panel area 635*c*. According to one or more embodiments, the pair of reinforcing plates 637 and 638 may be formed of a metal material (e.g., SUS) to advantageously reinforce a ground connection structure and rigidity for the first display 630.

According to one or more embodiments, the second display 655 may be disposed in a space between the second housing 620 and the second rear cover 650. According to one or more embodiments, the second display 655 may be visible from the outside through substantially the entire area of the second rear cover 650 while being in the space between the second housing 620 and the second rear cover 650.

According to one or more embodiments, at least a part of the first support member 661 may be foldably coupled to the second support member 662 through at least one hinge device 685 and 687. According to one embodiment, the electronic device 600 may include at least one wiring member 663 (e.g., a flexible printed circuit board (FPCB)) disposed from at least a part of the first support member 661 to a part of the second support member 662 across the at least one hinge device 685 and 687. According to one or more embodiments, the first support member 661 may extend from the first lateral member 613 or may be structurally combined with the first lateral member 613. According to one or more embodiments, the electronic device 600 may include a first space (e.g., the first space 6101 in FIG. 14A) provided through the first support member 661 and the first rear cover 640. According to one or more embodiments, the first housing 610 (e.g., the first housing structure) may be configured through a combination of the first lateral member 613, the first support member 661, and the first rear cover 640. According to one or more embodiments, the second support member 662 may extend from the second lateral member 623 or may be structurally combined with the second lateral member 623. According to one or more embodiments, the electronic device 600 may include a second space (e.g., the second space 6201 in FIG. 14A) provided through the second support member 662 and the second rear cover 650. According to one or more embodiments, the second housing 620 (e.g., the second housing structure) may be configured through a combination of the second lateral member 623, the second support member 662, and the second rear cover 650. According to one or more embodiments, at least a part of the at least one wiring member 663 and/or at least one hinge device 685 and 687 may be disposed to be supported through at least a part of the pair of support members 661 and 662. According to one or more embodiments, at least one wiring member 663 may be disposed in a direction (e.g., the x-axis direction) crossing the first support member 661 and the second support member 662. According to one or more embodiments, the at least one wiring member 663 may be arranged to have a length in a direction (e.g., the x-axis direction) substantially perpendicular to a folding axis (e.g., the y-axis or the folding axis F1 in FIG. 14A).

According to one or more embodiments, the at least one substrate 670 may include a first substrate 671 disposed in the first space 6101 and a second substrate 672 disposed in the second space 6201. According to one or more embodiments, the first substrate 671 and the second substrate 672 may include a plurality of electronic components arranged to implement various functions of the electronic device 600. According to one or more embodiments, the first substrate 671 and the second substrate 672 may be electrically connected through at least one wiring member 663.

According to one or more embodiments, the electronic device 600 may include at least one battery 691 and 692. According to one or more embodiments, the at least one battery 691 and 692 may include a first battery 691 disposed in the first space 6101 of the first housing 610 and electrically connected to the first substrate 671, and a second battery disposed in the second space 6201 of the second housing 620 and electrically connected to the second substrate 672. According to one or more embodiments, the first support member 661 and the second support member 662 may further include at least one swelling hole for the first battery 691 and the second battery 692.

According to one or more embodiments, the first housing 610 may include a first rotation support surface 614, and the second housing 620 may include a second rotation support surface 624 corresponding to the first rotation support surface 614. According to one or more embodiments, the first rotation support surface 614 and the second rotation support surface 624 may include a curved surface corresponding to (naturally connected to) the curved outer surface of the hinge housing 680. According to one or more embodiments, when the electronic device 600 is in an unfolded state, the first rotation support surface 614 and the second rotation support surface 624 may cover the hinge housing 680 to prevent the hinge housing 680 from being exposed from the rear surface of the electronic device 600 or to expose only a part of the hinge housing 680. According to one or more embodiments, when the electronic device 600 is in a folded state, the first rotation support surface 614 and the second rotation support surface 624 may rotate along the curved outer surface of the hinge housing 680 and at least partially expose the hinge housing 680 from the rear surface of the electronic device 600.

According to one or more embodiments, the electronic device 600 may include at least one antenna 676 disposed in the first space 6201. According to one or more embodiments, at least one antenna 676 may be disposed on the first battery 691 and the first rear cover 640 in the first space 6201. According to one or more embodiments, the at least one antenna 676 may include a near field communication (NFC) antenna, a wireless charging antenna, and/or a magnetic secure transmission (MST) antenna. According to one or more embodiments, the at least one antenna 676 may perform short-range communication with an external device or wirelessly transmit/receive power required for charging. In some embodiments, the antenna structure may be formed by at least a part of the first lateral member 613 or the second lateral member 623 and/or a part of the first support member 661 and the second support member 662 or a combination thereof.

According to one or more embodiments, the electronic device 600 may further include at least one electronic component assembly 674 and 675 and/or additional support members 663 and 673 disposed in the first space 6101 and/or the second space 6201. According to one or more embodiments, at least one electronic component assembly may include an interface connector port assembly 674 or a speaker assembly 675.

According to one or more embodiments, the electronic device 600 may include a first waterproof member (WP1) disposed between the first reinforcing plate 637 and the first support member 661 and a second waterproof member (WP2) disposed between the second reinforcing plate 638 and the second support member 662. According to one or more embodiments, the first waterproof member (WP1) may provide at least one first waterproof space while being disposed between the first reinforcing plate 637 and the first support member 661. According to one or more embodiments, at least one first waterproof space may accommodate an area corresponding to at least one electronic component (e.g., a camera module or a sensor module) disposed to be supported by the first support member 661. According to one or more embodiments, the second waterproof member (WP2) may provide a second waterproof space while being disposed between the second reinforcing plate 638 and the second support member 662. According to one or more embodiments, the second waterproof space may accommodate at least a part of the bending part which is folded toward the rear surface of the first display 630. According to one or more embodiments, the second waterproof space may extend from the display panel of the first display 630 and may be disposed to surround at least a part of the bending part which is folded toward the rear surface thereof. Therefore, a control circuit (e.g., a display driver IC (DDI)) and a plurality of electric elements disposed in the bending part may be disposed in the second waterproof space to be protected from external moisture and/or foreign substances.

According to one or more embodiments, the electronic device 600 may include a waterproof tape 641 disposed between the first rear cover 640 and the first housing 610. According to one or more embodiments, the electronic device 600 may include a bonding member 651 disposed between the second rear cover 650 and the second housing 620. In some embodiments, the bonding member 651 may be disposed between the second display 655 and the second housing 620. In some embodiments, the waterproof tape 641 may be replaced with the bonding member 651, and the bonding member 651 may be replaced with the waterproof tape 641.

According to one or more embodiments, at least one hinge device 685 and 687 may include a first hinge device 685 and a second hinge device 687 disposed at one end and the other end in a direction parallel to the folding axis (F), respectively. According to one or more embodiments, the first hinge device 685 and the second hinge device 687 may have substantially the same configuration. According to one or more embodiments, the electronic device 600 may include a connection module 686 disposed between the first hinge device 685 and the second hinge device 687. According to one or more embodiments, the connection module 686 may be arranged through a combination of one or more gears and/or a combination of one or more links. In some embodiments, the connection module 686 may be replaced with the first hinge device 685. In some embodiments, at least one hinge device 685 and 687 may be disposed at one location or three or more locations at designated intervals along a direction parallel to the folding axis (F). According to one or more embodiments, the electronic device 600 may include a first hinge plate 611 and a second hinge plate 612 connected through at least one hinge device 685 and 687. According to one or more embodiments, the first hinge plate 611 may form the same plane as the first housing 610 in an unfolded state, and the second hinge plate 612 may form the same plane as the second housing 620 in an unfolded state. According to one or more embodiments, in a folded state, the flexible display 630 maybe deformed into a water drop shape through at least one hinge device 685 and 687 and accommodated in the inner space of the electronic device 600. According to an embodiment, in the folded state, the first hinge plate 611 and the second hinge plate 612 may be moved to support at least a part of the folding area (e.g., the folding area 630*c* in FIG. 14A) of the flexible display 630, which is deformed into the water drop shape, and in the folded state, the first housing 610 and the second housing 620 may be moved to support substantially un-deformed flat parts (e.g., the first area 630*a* and the second area 630*b* in FIG. 14A) of the flexible display 630. Therefore, the first hinge plate 611 may not form the same plane as the first housing 610 in a folded state, and the second hinge plate 612 may not also form the same plane as the second housing 620.

The at least one hinge device 685 and 687 according to exemplary embodiments of the disclosure may be configured to induce the folding area 630*c* to be deformed into a designated shape (e.g., a water drop shape) in the folded state of the flexible display 630.

The electronic device 600 shown in FIGS. 14A, 14B, 15A, 15B, 16 may include at least some of the components of the electronic device 101 shown in FIG. 1.

The electronic device 600 shown in FIGS. 14A, 14B, 15A, 15B, 16 may include at least some of the components of the electronic device 300 shown in FIGS. 3, 4A, 4B, 4C, 4D, 5, 6A, and 6B.

The electronic device 600 shown in FIGS. 14A, 14B, 15A, 15B, 16 may include at least some of the components of the electronic device 400 shown in FIGS. 7, 8, 9, and 10.

The electronic device 600 shown in FIGS. 14A, 14B, 15A, 15B, 16 may include at least some of the components of the electronic device 500 shown in FIGS. 11, 12, and 13.

The thermal diffusion member 340, 440, or 540 according to one or more embodiments of the disclosure may be applied to the foldable electronic device 600. The electronic device 600 shown in FIGS. 14A, 14B, 15A, 15B, 16 may include thermal diffusion member 340, 440, or 540.

According to one or more embodiments, the thermal diffusion member 340, 440, or 540 may be disposed between the board 670 and the display 630 and between the battery 691, 692 and the display 630.

According to one or more embodiments, the thermal diffusion member 340, 440, or 540 may be disposed in at least one of the first housing 610 or the second housing 620. According to one or more embodiments, the thermal diffusion member 340, 440, or 540 may be disposed in the first housing 610. Alternatively, the thermal diffusion member 340, 440, or 540 may be disposed in the second housing 620. Alternatively, the thermal diffusion member 340, 440, or 540 may be disposed in the first housing 610 and the second housing 620, respectively.

According to one or more embodiments, at least one of the first housing 610 or the second housing 620 may include a structure that supports (or surrounds) at least a portion of the thermal diffusion member 340, 440, or 540. According to one or more embodiments, when the thermal diffusion member 340, 440, or 540 is disposed in the first housing 610, the first housing 610 may include the support area 315, 415, or 515 at least in part. When the thermal diffusion member 340, 440, or 540 is disposed in the second housing 620, the second housing 620 may include the support area 315, 415, or 515 at least in part. When the thermal diffusion member 340, 440, or 540 is respectively disposed in the first housing 610 and the second housing 620, the first housing 610 and the second housing 620 may each include the support area 315, 415, or 515 at least in part.

According to one or more embodiments, the thermal diffusion member 340, 440, or 540 may serve to diffuse heat generated from a heat source of the electronic device 600 to other areas of the electronic device 600. According to one or more embodiments, the thermal diffusion member 340, 440, or 540 may diffuse heat generated from the board 670 to other areas of the electronic device 600.

Figure 17A:
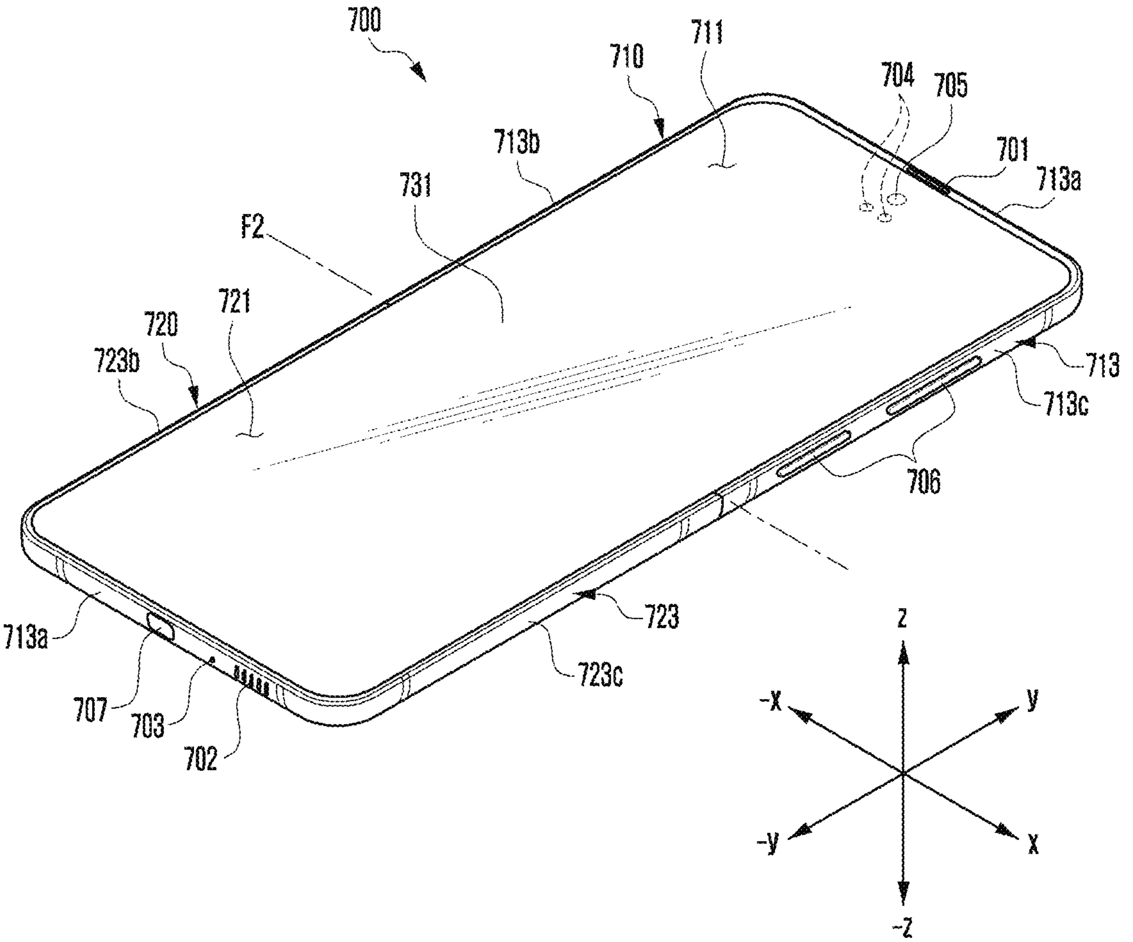
FIG. 17A is a diagram illustrating an unfolded state of an electronic device according to one or more embodiments.
Figure 17B:
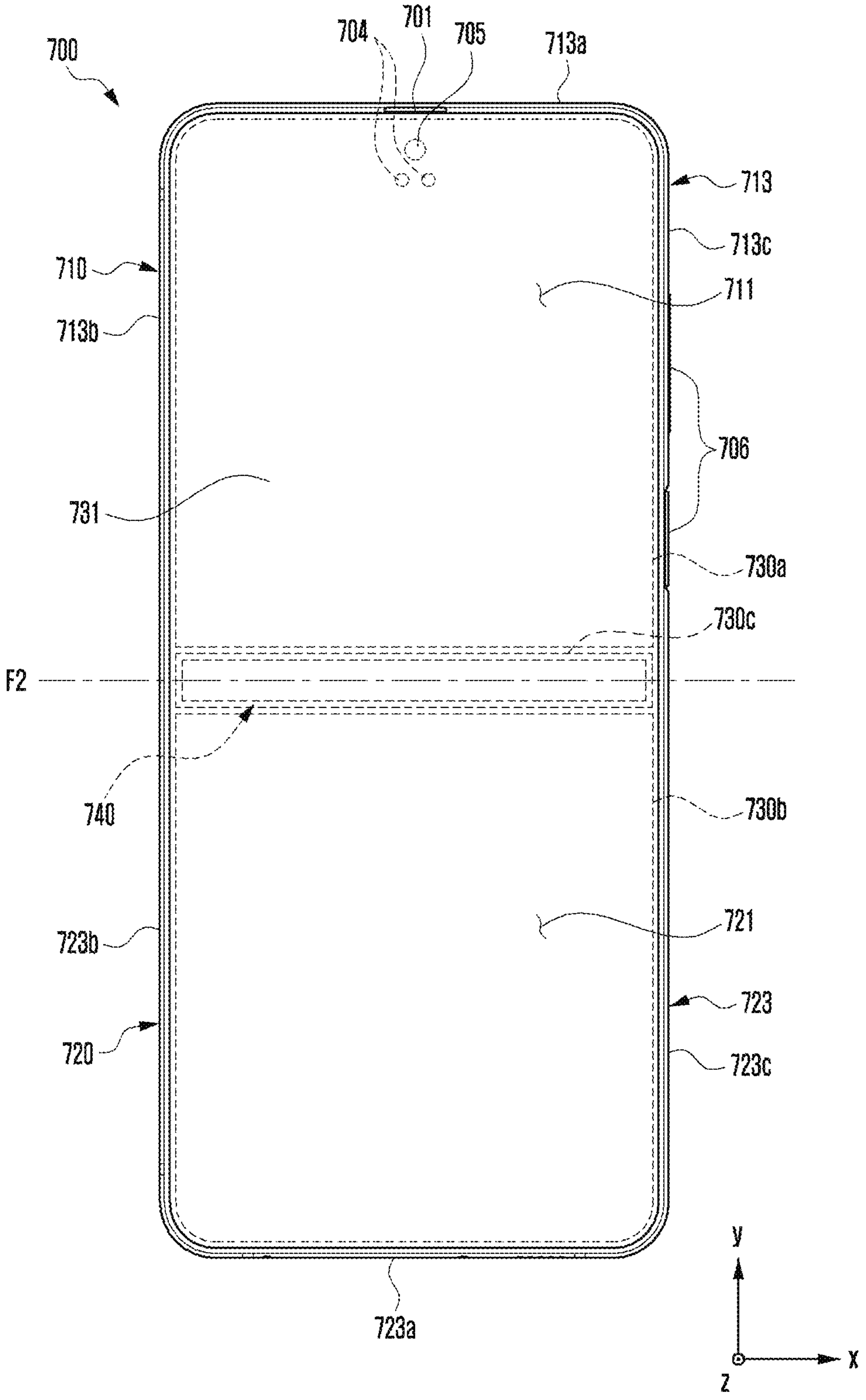
FIG. 17B is a diagram illustrating an unfolded state of an electronic device according to one or more embodiments.
Figure 17C:
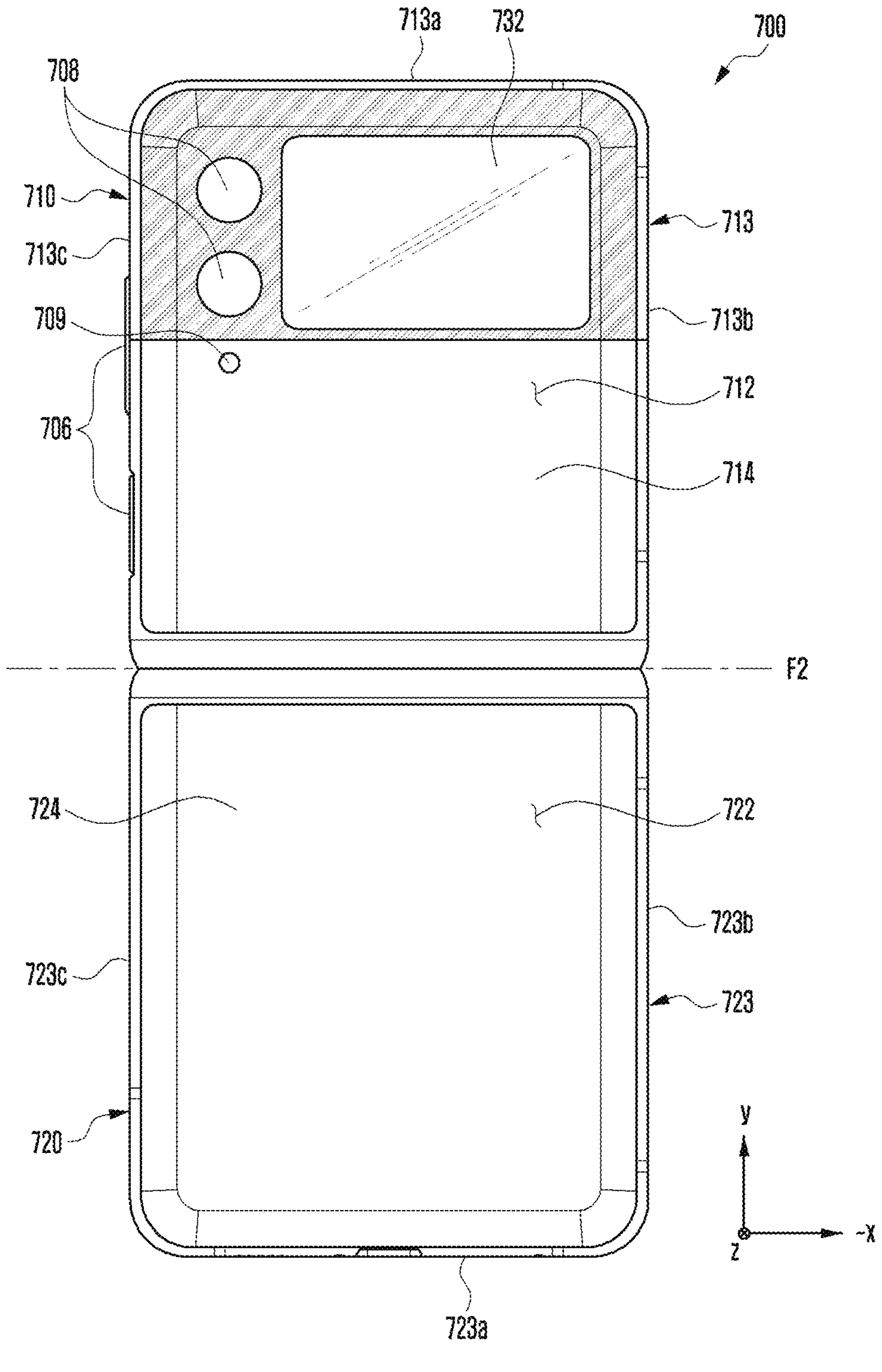
FIG. 17C is a diagram illustrating an unfolded state of an electronic device according to one or more embodiments.

FIG. 17A is a perspective view of an electronic device illustrating an unfolded state (or flat state) of the electronic device according to one or more embodiments of the disclosure. FIG. 17B is a plan view illustrating a front surface of an electronic device in an unfolded state of the electronic device according to one or more embodiments of the disclosure. FIG. 17C is a plan view illustrating a rear surface of an electronic device in an unfolded state according to one or more embodiments of the disclosure.

Figure 18A:
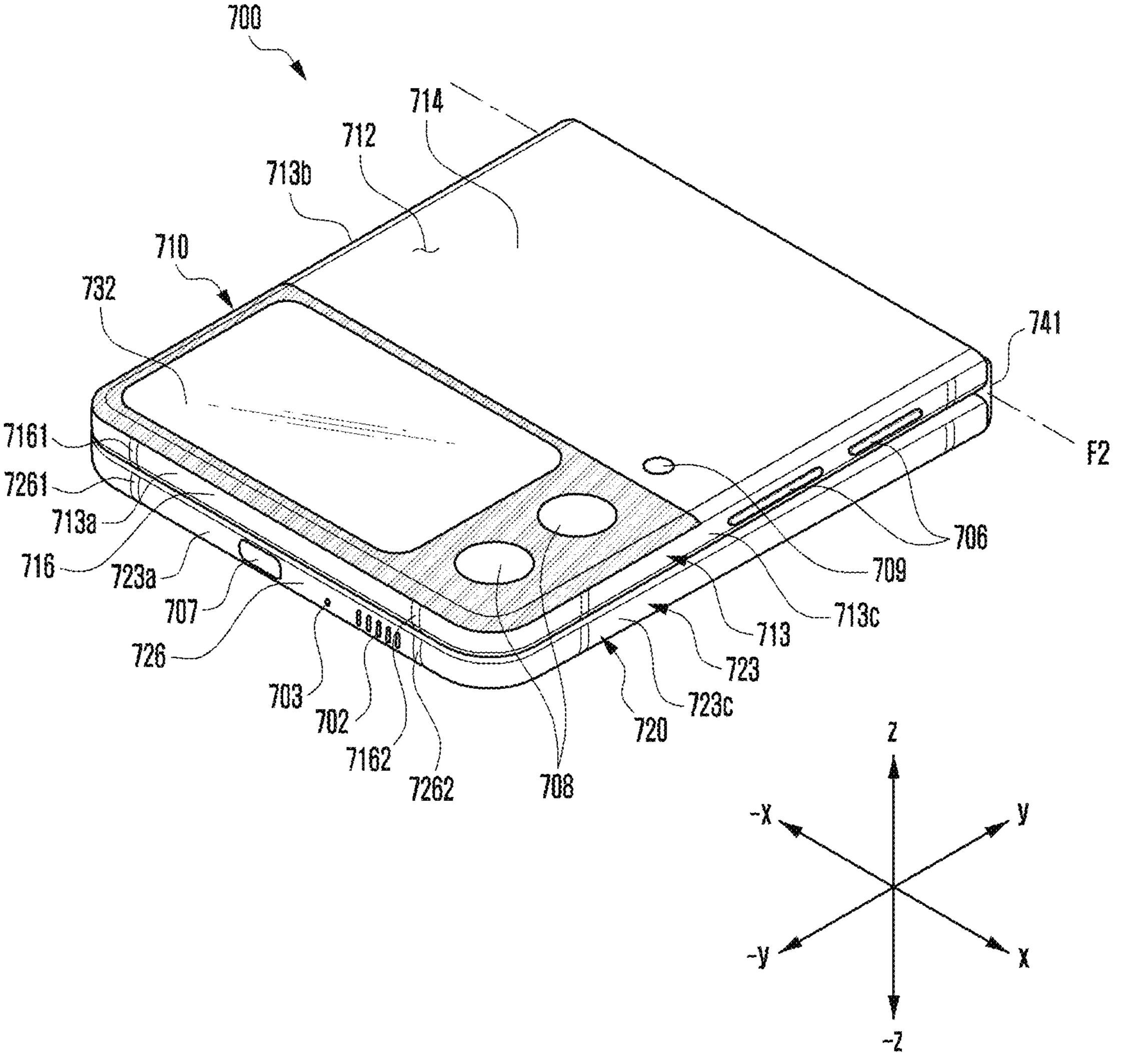
FIG. 18A is a perspective view of an electronic device illustrating a folded state according to one or more embodiments.
Figure 18B:
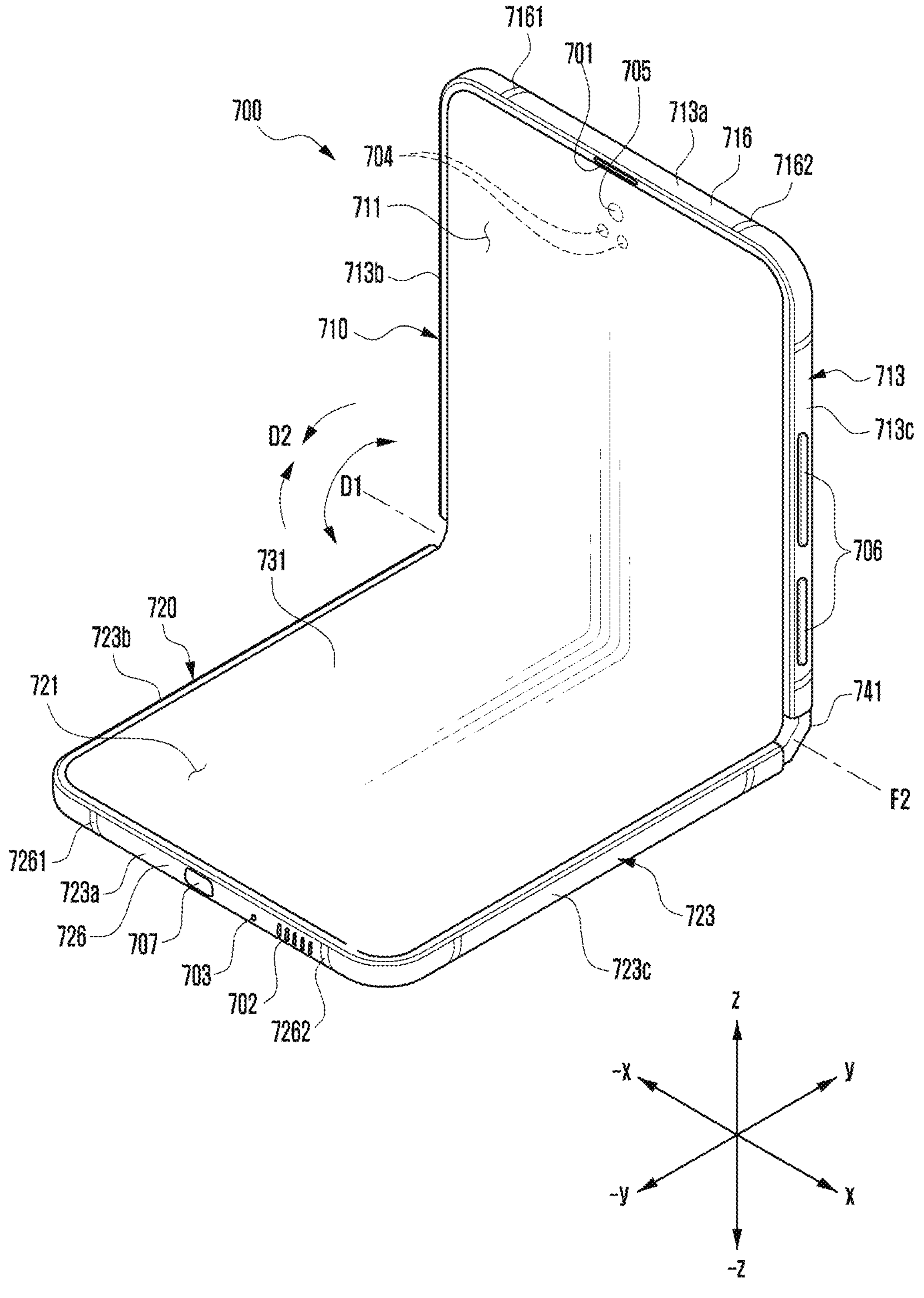
FIG. 18B is a perspective view of an electronic device illustrating an intermediate state of the electronic device according to one or more embodiments.

FIG. 18A is a perspective view of an electronic device illustrating a folded state of the electronic device according to one or more embodiments of the disclosure. FIG. 18B is a perspective view of an electronic device illustrating an intermediate state of the electronic device according to one or more embodiments of the disclosure.

With reference to FIGS. 17A to 18B, an electronic device 700 may include first and second housings 710 and 720 (e.g., foldable housing structure) combined with each other in a foldable manner based on a hinge device (e.g., hinge device 740 of FIG. 17B). In one or more embodiments, the hinge device (e.g., hinge device 740 of FIG. 17B) may be disposed in an X-axis direction or in a Y-axis direction. According to one or more embodiments, the electronic device 700 may include a first display 731 (e.g., flexible display, foldable display, or main display) disposed in an area (e.g., recess) formed by the first and second housings 710 and 720. According to one or more embodiments, the first housing 710 and the second housing 720 may be disposed on both sides around a folding axis F2, and may have a substantially symmetrical shape about the folding axis F2. According to one or more embodiments, an angle or a distance between the first housing 710 and the second housing 720 may differ depending on the state of the electronic device 700. According to one or more embodiments, depending on whether the electronic device is in an unfolded state (or flat state), in a folded state, or in an intermediate state, the angle or the distance between the first housing 710 and the second housing 720 may differ.

According to one or more embodiments, in the unfolded state of the electronic device 700, the first housing 710 may include a first surface 711 directed in a first direction (e.g., front direction) (z-axis direction), and a second surface 712 directed in a second direction (e.g., rear direction) (−z-axis direction) opposite to the first surface 711. According to one or more embodiments, in the unfolded state of the electronic device 700, the second housing 720 may include a third surface 721 directed in the first direction (z-axis direction), and a fourth surface 722 directed in the second direction (−z-axis direction). According to one or more embodiments, in the unfolded state of the electronic device 700, the first surface 711 of the first housing 710 and the third surface 721 of the second housing 720 may be directed in substantially the same first direction (z-axis direction). In one or more embodiments, in the folded state of the electronic device 700, the first surface 711 of the first housing 710 and the third surface 721 of the second housing 720 may face each other. According to one or more embodiments, in the unfolded state of the electronic device 700, the second surface 712 of the first housing 710 and the fourth surface 722 of the second housing 720 may be directed in substantially the same second direction (−z-axis direction). In one or more embodiments, in the folded state of the electronic device 700, the second surface 712 of the first housing and the fourth surface 722 of the second housing 720 may be directed in opposite directions. According to one or more embodiments, in the folded state of the electronic device 700, the second surface 712 may be directed in the first direction (z-axis direction), and the fourth surface 722 may be directed in the second direction (−z-axis direction). In this case, the first display 731 may not be viewed from outside (in-folding manner). In one or more embodiments, the electronic device 700 may be folded so that the second surface 712 of the first housing 710 and the fourth surface 722 of the second housing 720 face each other. In this case, the first display 731 may be disposed to be viewed from the outside (out-folding manner).

According to one or more embodiments, the first housing 710 (e.g., first housing structure) may include a first lateral member 713 forming the appearance of the electronic device 700, and a first rear cover 714 combined with the first lateral member 713, and forming at least a part of the second surface 712 of the electronic device 700. According to one or more embodiments, the first lateral member 713 may include a first side surface 713*a*, a second side surface 713*b* extending from one end of the first side surface 713*a*, and a third side surface 713*c* extending from the other end of the first side surface 713*a*. According to one or more embodiments, the first lateral member 713 may be formed in a quadrangular (e.g., square or rectangular) shape through the first side surface 713*a*, the second side surface 713*b*, and the third side surface 713*c*.

According to one or more embodiments, the second housing 720 (e.g., second housing structure) may include a second lateral member 723 forming the appearance of the electronic device 700 at least partly, and a second lateral cover 724 combined with the second lateral member 723, and forming at least a part of the fourth surface 722 of the electronic device 700. According to one or more embodiments, the second lateral member 723 may include a fourth side surface 723*a*, a fifth side surface 723*b* extending from one end of the fourth side surface 723*a*, and a sixth side surface 723*c* extending from the other end of the fourth side surface 723*a*. According to one or more embodiments, the second lateral member 723 may be formed in a quadrangular shape through the fourth side surface 723*a*, the fifth side surface 723*b*, and the sixth side surface 723*c*.

According to one or more embodiments, the first and second housings 710 and 720 are not limited to the illustrated shapes and combinations, but may be implemented by combinations and/or compositions of other shapes or components. In one or more embodiments, the first lateral member 713 may be integrally formed with the first rear cover 714, and the second lateral member 723 may be integrally formed with the second rear cover 724.

According to one or more embodiments, in the unfolded state of the electronic device 700, the second side surface 713*b* of the first lateral member 713 and the fifth side surface 723*b* of the second lateral member 723 may be connected to each other without a gap. According to one or more embodiments, in the unfolded state of the electronic device 700, the third side surface 713*c* of the first lateral member 713 and the sixth side surface 723*c* of the second lateral member 723 may be connected to each other without a gap. According to one or more embodiments, in the unfolded state of the electronic device 700, the sum of the lengths of the second side surface 713*b* and the fifth side surface 723*b* may be configured to be longer than the length of the first side surface 713*a* and/or the fourth side surface 723*a*. According to one or more embodiments, in the unfolded state of the electronic device 700, the sum of the lengths of the third side surface 713*c* and the sixth side surface 723*c* may be configured to be longer than the length of the first side surface 713*a* and/or the fourth side surface 723*a*.

With reference to FIGS. 18A and 18B, the first lateral member 713 and/or the second lateral member 723 may be formed of metal, or may further include polymer that is injected into metal. According to one or more embodiments, the first lateral member 713 and/or the second lateral member 723 may include at least one conductive part 716 and/or 726 electrically segmented through at least one segment part 7161, 7162 and/or 7261, 7262 formed of polymer. In this case, the at least one conductive part 716 and/or 726 may be electrically connected to a wireless communication circuit included in the electronic device 700, and thus may be used as at least a part of an antenna that operates in at least one designated band (e.g., legacy band).

According to one or more embodiments, the first rear cover 714 and/or the second rear cover 724 may be formed of at least one of coated or colored glass, ceramic, polymer, or metal (e.g., aluminum, stainless steel (STS), or magnesium) or a combination of at least two thereof.

According to one or more embodiments, the first display 731 may be disposed to extend from the first surface 711 of the first housing 710 to at least a part of the third surface 721 of the second housing 720 across the hinge device (e.g., hinge device 740 of FIG. 17B). In one or more embodiments, the first display 731 may include a first area 730*a* substantially corresponding to the first surface 711, a second area 730*b* corresponding to the second surface 721, and a third area 730*c* (e.g., flexible area or folding area) connecting the first area 730*a* and the second area 730*b* to each other. According to one or more embodiments, the third area 730*c* may be a part of the first area 720*a* and/or the second area 730*b*, and may be disposed at a location corresponding to the hinge device (e.g., hinge device 740 of FIG. 17B). According to one or more embodiments, the electronic device 700 may include a hinge housing 741 (e.g., hinge cover) supporting the hinge device (e.g., hinge device 740 of FIG. 17B). In one or more embodiments, the hinge housing 741 may be disposed to be exposed to outside when the electronic device 700 is in a folded state, and not to be viewed from the outside as being drawn into an inner space of the first housing 710 and an inner space of the second housing 720 when the electronic device 700 is in an unfolded state.

According to one or more embodiments, the electronic device 700 may include a second display 731 (e.g., sub-display) disposed separately from the first display 731. According to one or more embodiments, the second display 731 may be disposed to be exposed at least partly on the second surface 712 of the first housing 710. In one or more embodiments, when the electronic device 700 is in the folded state, the second display 732 may display at least a part of state information of the electronic device 700 in replacement of at least a part of a display function of the first display 731. According to one or more embodiments, the second display 732 may be disposed to be viewed from the outside through at least a partial area of the first rear cover 714. In one or more embodiments, the second display 732 may be disposed on the fourth surface 722 of the second housing 720. In this case, the second display 732 may be disposed to be viewed from the outside through at least a partial area of the second rear cover 724.

According to one or more embodiments, the electronic device 700 may include at least one of an input device 703 (e.g., microphone), sound output devices 701 and 702, a sensor module 704, camera devices 705 and 708, a key input device 706, or a connector port 707. In an illustrated embodiment, although the input device 703 (e.g., microphone), the sound output devices 701 and 702, the sensor module 704, the camera devices 705 and 708, the key input device 706, or the connector port 707 are illustrated as hole or circular shaped elements formed on the first housing 710 or the second housing 720, they are exemplarily illustrated for explanation, but are not limited thereto. According to one or more embodiments, the input device 703 may include at least one microphone 703 disposed on the second housing 720. In one or more embodiments, the input device 703 may include a plurality of microphones 703 disposed to sense the sound direction. In one or more embodiments, the plurality of microphone 703 may be disposed at proper locations on the first housing 710 and/or the second housing 720. According to one or more embodiments, the sound output devices 701 and 702 may include at least one speaker 701 and 702. According to one or more embodiments, the at least one speaker 701 and 702 may include a receiver 701 for call disposed on the first housing 710, and the speaker 702 disposed on the second housing 720. In one or more embodiments, the input device 703, the sound output devices 701 and 702, and the connector port 707 may be disposed in a space provided in the first housing 710 and/or the second housing 720 of the electronic device 700, and may be exposed to an external environment through at least one hole formed on the first housing 710 and/or the second housing 720. According to one or more embodiments, the at least one connector port 707 may be used to transmit and receive power and/or data to and from an external electronic device. In one or more embodiments, the at least one connector port (e.g., ear jack hole) may accommodate a connector (e.g., ear jack) for transmitting and receiving an audio signal to and from the external electronic device. In one or more embodiments, the hole formed on the first housing 710 and/or the second housing 720 may be commonly used for the input device 703 and the sound output devices 701 and 702. In one or more embodiments, the sound output devices 701 and 702 may include a speaker (e.g., piezo-electric speaker) that is not exposed through the hole formed on the first housing 710 and/or the second housing 720.

According to one or more embodiments, the sensor module 704 may generate an electrical signal or a data value corresponding to an internal operation state of the electronic device 700 or an external environment state. According to one or more embodiments, the sensor module 704 may detect the external environment through the first surface 711 of the first housing 710. In one or more embodiments, the electronic device 700 may further include at least one sensor module disposed to detect the external environment through the second surface 712 of the first housing 710. According to one or more embodiments, the sensor module 704 (e.g., illumination sensor) may be disposed to detect the external environment through the first display 731 under the first display 731. According to one or more embodiments, the sensor module 704 may include at least one of a gesture sensor, a gyro sensor, a barometric pressure sensor, a magnetic sensor, an acceleration sensor, a grip sensor, a color sensor, an infrared (IR) sensor, a biosensor, a temperature sensor, a humidity sensor, an illumination sensor, a proximity sensor, a biosensor, an ultrasonic sensor, or an illumination sensor 704.

According to one or more embodiments, the camera devices 705 and 708 may include the first camera device 705 (e.g., front camera device) disposed on the first surface 711 of the first housing 710, and the second camera device 708 disposed on the second surface 712 of the first housing 710. In one or more embodiments, the electronic device 700 may further include a flash 709 disposed near the second camera device 708. According to one or more embodiments, the camera devices 705 and 708 may include at least one lens, an image sensor, and/or an image signal processor. According to one or more embodiments, the camera devices 705 and 708 may be disposed so that two or more lenses (e.g., wide angle lens, ultra wide angle lens, or telephoto lens) and two or more image sensors are located on one surface (e.g., first surface 711, second surface 712, third surface 721, or fourth surface 722) of the electronic device 700. In one or more embodiments, the camera devices 705 and 708 may include lenses for time of flight (TOF) and/or image sensors.

According to one or more embodiments, the key input device 706 (e.g., key buttons) may be disposed on the third side surface 713*c* of the first lateral member 713 of the first housing 710. In one or more embodiments, the key input device 706 may be disposed on at least one side surface of other side surfaces 713*a* and 713*b* of the first housing 710 and/or side surfaces 723*a*, 723*b*, and 723*c* of the second housing 720. In one or more embodiments, the electronic device 700 may not include some or all of the key input devices 706, and the non-included key input device 706 may be implemented in another form, such as a soft key, on the first display 731. In one or more embodiments, the key input device 706 may be implemented by using the pressure sensor included in the first display 731.

According to one or more embodiments, one of the camera devices 705 and 708 (e.g., first camera device 705) or the sensor module 704 may be disposed to be exposed through the first display 731. According to one or more embodiments, the first camera device 705 or the sensor module 704 may be optically exposed to the outside through an opening (e.g., through-hole) formed at least partly on the first display 731 in the inner space of the electronic device 700. According to one or more embodiments, at least a part of the sensor module 704 may be disposed not to be visually exposed through the first display 731 in the inner space of the electronic device 700. With reference to FIG. 18B, the electronic device 700 may operate to maintain at least one designated folding angle in an intermediate state through the hinge device (e.g., hinge device 740 of FIG. 17B). In this case, the electronic device 700 may control the first display 731 so that different kinds of content are displayed on the display area corresponding to the first surface 711 and the display area corresponding to the third surface 721. According to one or more embodiments, the electronic device 700 may operate in substantially the unfolded state (e.g., unfolded state of FIG. 17A) and/or in substantially the folded state (e.g., folded state of FIG. 18A) based on a specific folding angle (e.g., angle between the first housing 710 and the second housing 720 when the electronic device 700 is in the intermediate state) through the hinge device (e.g., hinge device 740 of FIG. 17B). In one or more embodiments, if a pressing force is provided in an unfolding direction (direction D1) in a state where the electronic device 700 is unfolded at the specific folding angle through the hinge device (e.g., hinge device 740 of FIG. 17B), the electronic device 700 may operate to be transitioned to the unfolded state (e.g., unfolded state of FIG. 17A). In one or more embodiments, if the pressing force is provided in a folding direction (direction D2) in a state where the electronic device 700 is unfolded at the specific folding angle through the hinge device (e.g., hinge device 740 of FIG. 17B), the electronic device 700 may operate to be transitioned to the folded state (e.g., folded state of FIG. 18A). In one or more embodiments, the electronic device 700 may operate to maintain the unfolded state (not illustrated) at various angles through the hinge device (e.g., hinge device 740 of FIG. 17B) (free-stop function).

Figure 19:
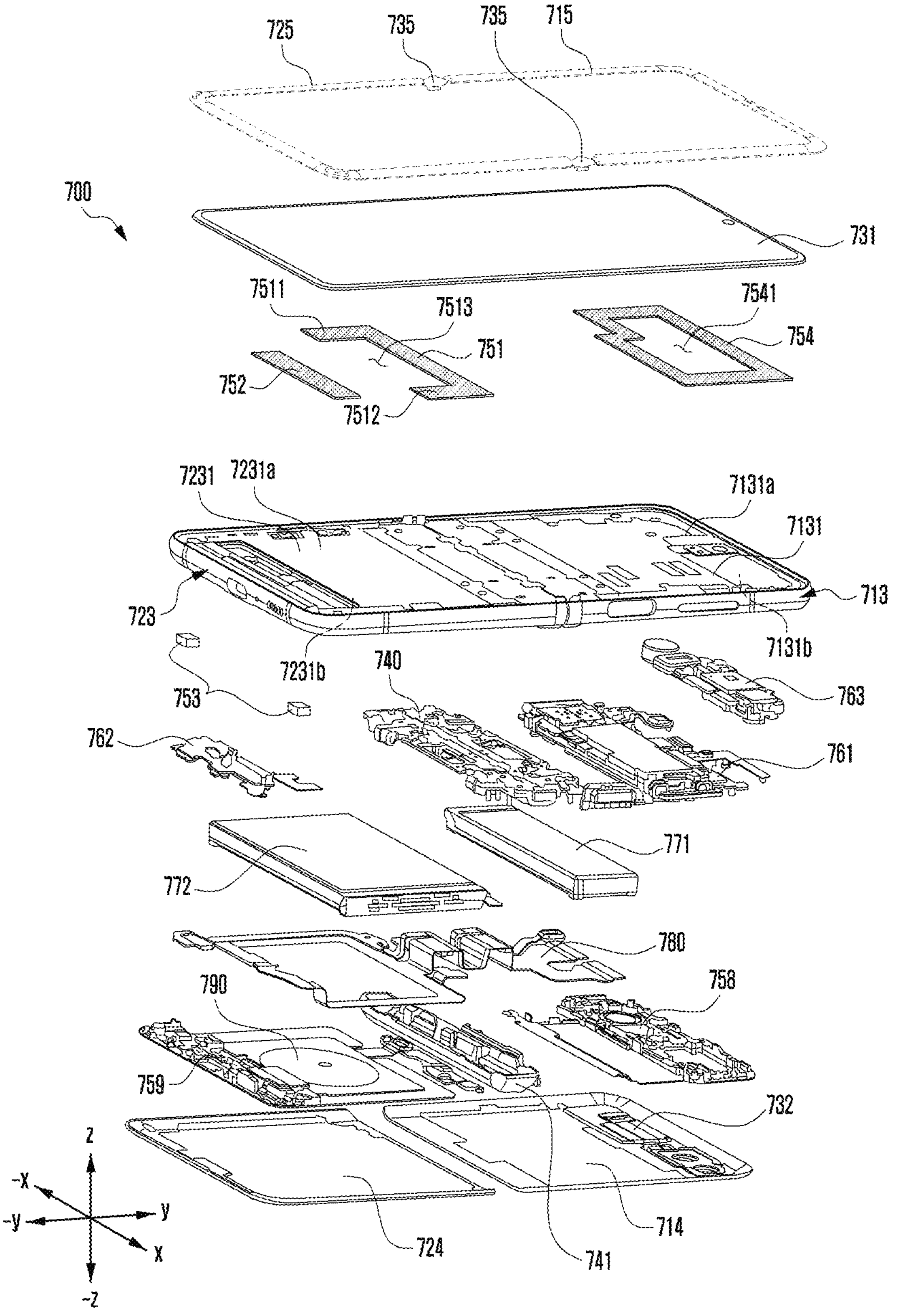
FIG. 19 is an exploded perspective view of an electronic device according to according to one or more embodiments.

FIG. 19 is an exploded perspective view of an electronic device according to one or more embodiments of the disclosure.

With reference to FIG. 19, the electronic device 700 may include the first lateral member 713 (e.g., first lateral frame), the second lateral member 723 (e.g., second lateral frame), and the hinge device 740 (e.g., hinge module or hinge structure) rotatably connecting the first lateral member 713 and the second lateral member 723 to each other. According to one or more embodiments, the electronic device 700 may include a first support member 7131 (e.g., first support plate) extending at least partly from the first lateral member 713, and a second support member 7231 (e.g., second support plate) extending at least partly from the second lateral member 723. According to one or more embodiments, the first support member 7131 may be integrally formed with the first lateral member 713, or may be structurally combined with the first lateral member 713. In one or more embodiments, the second support member 7231 may be integrally formed with the second lateral member 723, or may be structurally combined with the second lateral member 723. According to one or more embodiments, the first display 731 may be disposed to be supported by the first support member 7131 and the second support member 7231. According to one or more embodiments, the electronic device 700 may include the first rear cover 714 combined with the first lateral member 713, and providing a first space together with the first support member 7131, and the second rear cover 724 combined with the second lateral member 723 and providing a second space together with the second support member 7231. In one or more embodiments, the first lateral member 713 and the first rear cover 714 may be integrally formed with each other. In one or more embodiments, the second lateral member 723 and the second rear cover 724 may be integrally formed. According to one or more embodiments, the first housing 710 may include the first lateral member 713, the first support member 7131, and the first rear cover 714. According to one or more embodiments, the second housing 720 may include the second lateral member 723, the second support member 7231, and the second rear cover 724. According to one or more embodiments, the electronic device 700 may include the second display 732 disposed to be viewed from the outside through at least a partial area of the first rear cover 714.

According to one or more embodiments, the electronic device 700 may include a first board 761 (e.g., first board assembly or main printed circuit board) disposed in the first space between the first lateral member 713 and the first rear cover 714, a camera assembly 763, a first battery 771, or a first bracket 751. According to one or more embodiments, the camera assembly 763 may include a plurality of camera devices (e.g., camera devices 705 and 708 of FIGS. 17A and 18A), and may be electrically connected to the first board 761. According to one or more embodiments, the first bracket 758 may provide a support structure for supporting the first board 761 and/or the camera assembly 763 and improved stiffness. According to one or more embodiments, the electronic device 700 may include a second board 762 (e.g., second board assembly or sub-printed circuit board) disposed in the second space between the second lateral member 723 and the second rear cover 724, an antenna 790 (e.g., coil member), a second battery 772, or a second bracket 759. According to one or more embodiments, the electronic device 700 may include a plurality of electronic components (e.g., wiring member 780 (e.g., flexible printed circuit board (FPCB)) disposed to extend up to the second board 762, the second battery 772, or the antenna 790, and providing an electrical connection) disposed between the second lateral member 723 and the second rear cover 724 across the hinge device 740 from the first board 761. According to one or more embodiments, the antenna 790 may include a near field communication (NFC) antenna, a wireless charging antenna, and/or a magnetic secure transmission (MST) antenna.

According to one or more embodiments, the electronic device 700 may also include a first protection cover 715 (e.g., first protection frame or first decoration member)

combined along an edge of the first housing 710, and a second protection cover 725 (e.g., second protection frame or second decoration member) combined along an edge of the second housing 720. According to one or more embodiments, the first protection cover 715 and/or the second protection cover 725 may be formed of a metal or polymer material. According to one or more embodiments, the first protection cover 715 and/or the second protection cover 725 may be used as the decoration members. In this case, the first display 731 may be disposed so that the edge of the first area 730*a* is not viewed from the outside between the first housing 710 and the first protection cover 715. According to one or more embodiments, the first display 731 may be disposed so that the edge of the second area 730*b* is not viewed from the outside between the second housing 720 and the second protection cover 725.

According to one or more embodiments, the electronic device 700 may also include a protection cap 735 disposed to protect the edge of the third area (e.g., third area 730*c* of FIG. 17B) of the first display 731. In this case, the edge of the first display 731 can be protected through the protection cap 735 disposed at a location corresponding to the folding area (e.g., folding area 730*c* of FIG. 17B).

According to one or more embodiments, the first support member 7131 may include a first support surface 7131*a* directed in the first direction (z-axis direction), and a second support surface 7131*b* directed in the second direction (−z-axis direction) that is opposite to the first direction. According to one or more embodiments, the second support member 7231 may include a third support surface 7231*a* directed in the first direction and a fourth support surface 7231*b* directed in the second direction in the unfolded state of the electronic device 700. According to one or more embodiments, the first display 731 may be disposed to be supported by the first support surface 7131*a* of the first support member 7131 and the third support surface 7231*a* of the second support member 7231.

According to one or more embodiments, the electronic device 700 may include at least one waterproof member 751, 752, 753, and 754 disposed between the first display 731 and the second support member 7231 and between the first display 731 and the first support member 7131. According to one or more embodiments, some waterproof members 751, 752, and 753 of the at least one waterproof member 751, 752, 753, and 754 may include the first waterproof member 751 disposed between the first display 731 and the second support member 7231, the second waterproof member 752 connected to the first waterproof member 751, and the third waterproof member 753 that provides a first waterproof space 7513 by connecting one end 7511 of the first waterproof member 751 to one end of the second waterproof member 752 and by connecting the other end 7512 of the first waterproof member 751 to the other end of the second waterproof member 752. In one or more embodiments, the first waterproof member 751, the second waterproof member 752, and/or the third waterproof member 753 may be integrally formed. According to one or more embodiments, the waterproof member 754 of the at least one waterproof member 751, 752, 753, and 754 may include the fourth waterproof member 754 that provides a second waterproof space 7541 in the shape of a closed loop disposed between the first display 731 and the first support member 7131. According to one or more embodiments, a plurality of electronic elements including a control circuit (e.g., display driver IC (DDI)) of the first display 731 are disposed in the first sealed waterproof space 7513 formed through the first waterproof member 751, the second waterproof member 752, and the third waterproof member 753 between the first display 731 and the second support member 7231, and thus can be protected from external moisture and/or foreign substances. According to one or more embodiments, at least one electronic component (e.g., sensor module (e.g., sensor module 704 of FIG. 17A) and/or camera device (e.g., camera device 705 of FIG. 17A)) disposed through the first support member 7131 is disposed in a second waterproof space 7541 formed by the closed loop shape of the fourth waterproof member 754 between the first display 731 and the first support member 7131, and thus can be protected from the external moisture and/or foreign substances. The kinds of the constituent elements disposed in the first waterproof space 7513 and/or the second waterproof space 7541 according to one or more embodiments are not limited.

The electronic device 700 shown in FIGS. 17A, 17B, 17C, 18A, 18B, and 19 may include at least some of the components of the electronic device 101 shown in FIG. 1.

The electronic device 700 shown in FIGS. 17A, 17B, 17C, 18A, 18B, and 19 may include at least some of the components of the electronic device 300 shown in FIGS. 3, 4A, 4B, 4C, 4D, 5, 6A, and 6B.

The electronic device 700 shown in FIGS. 17A, 17B, 17C, 18A, 18B, and 19 may include at least some of the components of the electronic device 400 shown in FIGS. 7, 8, 9, and 10.

The electronic device 700 shown in FIGS. 17A, 17B, 17C, 18A, 18B, and 19 may include at least some of the components of the electronic device 500 shown in FIGS. 11, 12, and 13.

The thermal diffusion member 340, 440, or 540 according to one or more embodiments of the disclosure may be applied to the foldable electronic device 700. The electronic device 700 shown in FIGS. 17A, 17B, 17C, 18A, 18B, and 19 may include thermal diffusion member 340, 440, or 540.

According to one or more embodiments, the thermal diffusion member 340, 440, or 540 may be disposed between the board 761, 762 and the first display 731 and between the battery 771, 772 and the first display 731.

According to one or more embodiments, the thermal diffusion member 340, 440, or 540 may be disposed in at least one of the first housing 710 or the second housing 720. According to one or more embodiments, the thermal diffusion member 340, 440, or 540 may be disposed in the first housing 710. Alternatively, the thermal diffusion member 340, 440, or 540 may be disposed in the second housing 720. Alternatively, the thermal diffusion member 340, 440, or 540 may be disposed in the first housing 710 and the second housing 720, respectively.

According to one or more embodiments, at least one of the first housing 710 or the second housing 720 may include a structure that supports (or surrounds) at least a portion of the thermal diffusion member 340, 440, or 540. According to one or more embodiments, when the thermal diffusion member 340, 440, or 540 are disposed in the first housing 710, the first housing 710 may include the support area 315, 415, or 515 at least in part. When the thermal diffusion member 340, 440, or 540 are disposed in the second housing 720, the second housing 720 may include the support area 315, 415, or 515 at least in part. When the thermal diffusion member 340, 440, or 540 are respectively disposed in the first housing 710 and the second housing 720, the first housing 710 and the second housing 720 may each include the support area 315, 415, or 515 at least in part.

According to one or more embodiments, the thermal diffusion member 340, 440, or 540 may serve to diffuse heat generated from a heat source of the electronic device 700 to other areas of the electronic device 700. According to one or more embodiments, the thermal diffusion member 340, 440, or 540 may diffuse heat generated from the board 761, 762 to other areas of the electronic device 700.

An electronic device 300 according to one or more embodiments may include a housing 310; a display 320 disposed on one surface of the housing 310; a printed circuit board 380 disposed in an interior of the housing 310; a battery 330 disposed in one direction of the printed circuit board 380 in the interior of the housing 310 and including a first portion 331 and a second portion 332 having a thin thickness compared to the first portion 331 and formed at an end facing the printed circuit board 380; and a thermal diffusion member 340 disposed between the printed circuit board 380 and the display 320 and between the battery 330 and the display 320, wherein the thermal diffusion member 340 may include a first diffusion portion 341 at least a portion of which is disposed to be overlapped with the printed circuit board 380 and at least a portion of which is extended to be disposed in a first portion 331 of the battery 330; and a second diffusion portion 342 disposed between the second portion 332 of the battery 330 and the first diffusion portion 341 and extended to be overlapped with at least a portion of the second portion 332. According to one or more embodiments, the printed circuit board 380 may be at least partially disposed in an interior of the housing 310 at a first side facing a third direction between a first diffusion portion 341 of the thermal diffusion member 340 and the rear cover, the third direction being opposite to the second direction with respect to the first support portion 3151. At least a part of the first support portion 3151 may protrude in the third direction According to one or more embodiments, the first diffusion portion 341 may be extended along a length direction of the electronic device 300, and the second diffusion portion 342 may be extended along a width direction of the electronic device.

According to one or more embodiments, the housing 310 may include a support portion 315 on which a second diffusion portion 342 of the thermal diffusion member 340 is disposed, and the second portion 332 of the battery 330 may be disposed on one surface of the support portion 315, and the second diffusion portion 342 of the thermal diffusion member 340 may be disposed on the other surface of the support portion 315.

According to one or more embodiments, the support portion 315 may include a first support portion 3151 disposed between the second diffusion portion 342 of the thermal diffusion member 340 and the second portion 332 of the battery 330, and a pair of second support portions 3152-1 and 3152-2 connected perpendicularly to the first support portion 3151 and disposed on one side and the other side of the second diffusion portion 342.

According to one or more embodiments, the support portion 315 may include a third support portion 3153 that is extended in the opposite direction of the second support portion 3152 and faces the second portion 332 of the battery 330.

According to one or more embodiments, the electronic device 300 may further include at least one flexible printed circuit board 360 electrically connected between internal components of the electronic device 300, and at least one flexible printed circuit board 360 may be at least partially disposed in the second portion 332 of the battery 330.

According to one or more embodiments, at least one flexible printed circuit board 360 may be disposed in one direction of the second portion 332 of the battery 330, and the second diffusion portion 342 of the thermal diffusion member 340 may be disposed in a second direction that is opposite to the one direction of the second portion 332 of the battery 330.

According to one or more embodiments, at least one flexible printed circuit board 360 may include a flexible printed circuit board 360 electrically connecting the battery 330 and the printed circuit board 380.

According to one or more embodiments, the thermal diffusion member 440 may be integrally formed with a first diffusion portion 441 and a second diffusion portion 442.

According to one or more embodiments, the housing 310 may include a placement space 317 having a shape corresponding to at least a portion of the thermal diffusion member, and the thermal diffusion member 340 may be at least partially disposed in the placement space 317.

According to one or more embodiments, the thermal diffusion member 340 may be a first thermal diffusion member 540, and the first thermal diffusion member 540 may be disposed in one direction of the printed circuit board 580.

According to one or more embodiments, the electronic device 500 may further include a second thermal diffusion member 570 one end of which is in contact with the first thermal diffusion member 540 and the other end, the opposite end of the one end, of which is disposed in the other direction, the opposite direction to the one direction, of the printed circuit board 580.

According to one or more embodiments, the housing 510 may include a support portion 515 on which the second diffusion portion 542 of the first thermal diffusion member 540 is disposed, and the support portion 515 may include a diffusion opening 5151 formed at a location where the second thermal diffusion member 570 and the first thermal diffusion member 540 are in contact.

According to one or more embodiments, the second thermal diffusion member 570 may be extended at least partially in the height direction of the electronic device 500.

According to one or more embodiments, the second portion 332 of the battery 330 may be featured to be an portion where the protection circuit module (PCM) of the battery 330 is located.

An electronic device 400 according to one or more embodiments may include a housing 410; a display 320 disposed on one surface of the housing 410; a printed circuit board 380 disposed in an interior of the housing 410; a battery 330 disposed in one direction of the printed circuit board 380 in the interior of the housing 410 and including a first portion 331 and a second portion 332 formed at an end facing the printed circuit board 380 that has a thickness less than the thickness of the first portion 331; and a thermal diffusion member 440 disposed between the printed circuit board 380 and the display 320 and between the battery 330 and the display 320, wherein the thermal diffusion member 440 may include a first diffusion portion 441 at least a portion of which is disposed to be overlapped with the printed circuit board 380 and at least a portion of which is extended to be disposed in the first portion 331 of the battery 330; and a second diffusion portion 442 extended between the second portion 332 of the battery 330 and the first diffusion portion 441 in a direction perpendicular to the direction in which the first diffusion portion 441 is extended, and being overlapped with at least portion of the second portion 332. The battery 330 may be at least partially disposed a second side facing the second direction with respect to the first support portion 3151 between a second diffusion portion 442 of the thermal diffusion member 440 and the rear cover. The second battery portion 332 may be at least partially disposed between the second support portion 3152 and the rear cover. The second support portion 3152 may be at least partially disposed between the second diffusion portion 442 of the thermal diffusion member 440 and the second battery portion 332. The thermal diffusion member 440 may be at least partially overlapped with the first support portion 3151 and the second support portion 3152.

According to one or more embodiments, the thermal diffusion member may include a third diffusion portion. The third diffusion portion may be between the first diffusion portion 441 and the second diffusion portion 442 of the thermal diffusion member 440. The first support portion 3151 may be at least partially disposed between the third diffusion portion and the rear cover.

According to one or more embodiments, the housing 410 may include a support portion 415 on which a second diffusion portion 442 of the thermal diffusion member 440 is disposed, the second portion 332 of the battery 330 may be disposed on one surface of the support portion 415, and the second diffusion portion 442 of the thermal diffusion member 440 may be disposed on the other surface of the support portion 415.

According to one or more embodiments, the support portion 415 may include a first support portion 4151 disposed between the second diffusion portion 442 of the thermal diffusion member 440 and the second portion 332 of the battery 330, and a pair of second support portions 4152-1, 4152-2 connected perpendicularly to the first support portion 4151 and disposed on one side and the other side of the second diffusion portion 442.

According to one or more embodiments, the housing 410 may include a placement space 417 having a shape corresponding to at least a portion of the thermal diffusion member, and the thermal diffusion member 440 may be disposed in the placement space 417.

An electronic device 600 according to one or more embodiments may be a foldable electronic device.

According to one or more embodiments, the electronic devices 600 may include a first housing 610 and a second housing 620.

According to one or more embodiments, the first housing 610 and the second housing 620 may be foldable relative to each other. The first housing 610 and the second housing 620 may be foldably coupled to each other about the folding axes F1.

According to one or more embodiments, the placement space 317 or 417 may be disposed in at least one of the first housing 610 or the second housing 620.

According to one or more embodiments, the thermal diffusion member 340, 440, or 540 may be disposed in at least one of the first housing 610 or the second housing 620.

According to one or more embodiments, the support area 315, 415, or 515 may be disposed in at least one of the first housing 610 or the second housing 620.

An electronic device 700 according to one or more embodiments may be a foldable electronic device.

According to one or more embodiments, the electronic devices 700 may include a first housing 710 and a second housing 720.

According to one or more embodiments, the first housing 710 and the second housing 720 may be foldable relative to each other. The first housing 710 and the second housing 720 may be foldably coupled to each other about the folding axes F2.

According to one or more embodiments, the placement space 317 or 417 may be disposed in at least one of the first housing 710 or the second housing 720.

According to one or more embodiments, the thermal diffusion member 340, 440, or 540 may be disposed in at least one of the first housing 710 or the second housing 720.

According to one or more embodiments, the support area 315, 415, or 515 may be disposed in at least one of the first housing 710 or the second housing 720.

An electronic device according to one or more embodiments may include a display; a rear cover; a housing at least partially disposed between the display and the rear cover such that a first surface of the housing faces toward the display and a second surface opposite to the first surface of the housing faces toward the rear cover, the housing including a placement space formed therein and a support portion formed on the second surface, the support portion including a first support portion extended in a first direction substantially perpendicular to the second surface and a second support portion extended from the first support portion in a second direction substantially perpendicular to the first direction; a thermal diffusion member at least partially disposed in the placement space; a printed circuit board at least partially disposed at a first side facing in a third direction opposite to the second direction with respect to the first support portion between a first diffusion portion of the thermal diffusion member and the rear cover; and a battery at least partially disposed at a second side facing in the second direction with respect to the first support portion between a second diffusion portion of the thermal diffusion member and the rear cover, the battery including a first battery portion having a first thickness, and a second battery portion extended from the first battery portion in the third direction and having a second thickness thinner than the first battery portion, wherein the second battery portion may be at least partially disposed between the second support portion and the rear cover, and wherein the second support portion may be at least partially disposed between the second diffusion portion of the thermal diffusion member and the second battery portion.

According to one or more embodiments, when viewed in the first direction, the thermal diffusion member may be overlapped with the first battery portion, the second battery portion, the first support portion, the second support portion, and the printed circuit board.

According to one or more embodiments, the first support portion may be at least partially disposed between a third diffusion portion between the first and the second diffusion portion of the thermal diffusion member and the rear cover.

According to one or more embodiments, at least a part of the first support portion may be protruded in the third direction.

According to one or more embodiments, the thermal diffusion member may include a vapor chamber.

According to one or more embodiments, the second battery portion may include a protection circuit module (PCM) configured to protect the battery from overcharge, over-discharge, or overcurrent.

According to one or more embodiments, the first battery portion may include cells of the battery.

According to one or more embodiments, the electronic device may include a flexible printed circuit board electrically connected between the printed circuit board and the second battery portion, wherein the flexible printed circuit board is at least partially disposed between the support portion and the rear cover.

According to one or more embodiments, heat generated by the printed circuit board may be diffused to other areas of the electronic device via the first diffusion portion and the second diffusion portion.

An electronic device according to one or more embodiments may be one of various types of electronic devices. The electronic devices may include a portable communication device (e.g., a smartphone), a computer device, a portable multimedia device, a portable medical device, a camera, a wearable device, or a home appliance. However, the electronic device is not limited to any of those described above.

According to one or more embodiments and the terms used herein are not intended to limit the technological features set forth herein to particular embodiments and include various changes, equivalents, or replacements for a corresponding embodiment. With reference to the description of the diagrams, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). If an element (e.g., a first element) is referred to, with or without the term "operatively" or "communicatively," as "coupled with," "coupled to," "connected with," or "connected to" another element (e.g., a second element), it means that the element may be coupled with the other element directly (e.g., wiredly), wirelessly, or via a third element.

The term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. According to one or more embodiments, the module may be implemented in a form of an application-specific integrated circuit (ASIC).

An embodiment as set forth herein may be implemented as software (e.g., the program 140) including one or more instructions that are stored in a storage medium (e.g., an internal memory 136 or an external memory 138) that is readable by a machine (e.g., the electronic device 101). According to one or more embodiments, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to one or more embodiments may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PLAYSTORE™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

Each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. According to one or more embodiments, the integrated component may perform one or more functions of each of the plurality of components in the same or similar manner as they are performed by a corresponding one of the plurality of components before the integration.

According to one or more embodiments, operations performed by the module, the program, or another component may be carried out sequentially, in parallel, repeatedly, or heuristically, or one or more of the operations may be executed in a different order or omitted, or one or more other operations may be added.

While the disclosure has been illustrated and described with reference to one or more embodiments, it will be understood that the one or more embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiments described herein may be used in conjunction with any other embodiments described herein.

What is claimed is:

1. An electronic device comprising:

a housing;

a display disposed on one surface of the housing;

a printed circuit board disposed in an interior of the housing;

a battery disposed in one direction of the printed circuit board in an interior of the housing, the battery comprising a first portion and a second portion, the second portion having a thickness less than a thickness of the first portion and the second portion being located at an end of the battery which faces the printed circuit board; and a thermal diffusion member disposed between the printed circuit board and the display and between the battery and the display, wherein the thermal diffusion member comprises:

a first diffusion portion which at least a portion of overlaps with the printed circuit board and which at least a portion of extends to in the first portion of the battery; and a second diffusion portion disposed between the second portion of the battery and the first diffusion portion and extended to be overlapping with at least a portion of the second portion of the battery.

2. The electronic device of claim 1, wherein the first diffusion portion is extended in a length direction of the electronic device, and wherein the second diffusion portion is extended in a width direction of the electronic device.

3. The electronic device of claim 1, wherein the housing comprises a support portion in which the second diffusion portion of the thermal diffusion member is disposed therein, wherein the second portion of the battery is disposed on one surface of the support portion of the housing, and wherein the second diffusion portion of the thermal diffusion member is disposed on another surface of the support portion of the housing.

4. The electronic device of claim 3, wherein the support portion of the housing comprises:

a first support portion disposed between the second diffusion portion of the thermal diffusion member and the second portion of the battery; and a second support portion comprising a first-second support portion and a second-second support portion, both being connected perpendicularly to the first support portion, the first-second support portion being disposed on one side of the first support portion and the second diffusion portion, and the second-second support portion being disposed on another side of the first support portion and the second diffusion portion that is different from the side of which the first-second support portion is disposed.

5. The electronic device of claim 4, wherein the support portion of the housing further comprises a third support portion which is extended in a direction opposite of the second support portion and faces the second portion of the battery.

6. The electronic device of claim 1, further comprising at least one flexible printed circuit board disposed at least partially in the second portion of the battery.

7. The electronic device of claim 6, wherein the at least one flexible printed circuit board is disposed in one direction of the second portion of the battery, and wherein the second portion of the thermal diffusion member is disposed in a direction opposite to the direction of the second portion of the battery which the at least one flexible printed circuit board is disposed.

8. The electronic device of claim 6, wherein the at least one flexible printed circuit board comprises a flexible printed circuit board configured to electrically connect the battery and the printed circuit board.

9. The electronic device of claim 1, wherein the thermal diffusion member is integrally formed from the first diffusion portion and the second diffusion portion.

10. The electronic device of claim 9, wherein the housing further comprises a placement space having a shape corresponding to at least a portion of the thermal diffusion member, and wherein the portion of the thermal diffusion member is disposed in the placement space.

11. The electronic device of claim 1, wherein the thermal diffusion member is a first thermal diffusion member, wherein the first thermal diffusion member is disposed in the one direction of the printed circuit board, and wherein the thermal diffusion member further comprises a second thermal diffusion member, the second thermal diffusion member having a first end in contact with the first thermal diffusion member and a second end opposite of the first end and disposed in a direction opposite to the one direction of the printed circuit board.

12. An electronic device comprising:

a display;

a rear cover;

a housing at least partially disposed between the display and the rear cover such that a first surface of the housing faces the display and a second surface, opposite to the first surface, faces the rear cover, the housing comprising a placement space formed therein and a support portion formed on the second surface, the support portion comprising a first support portion extended in a first direction perpendicular to the second surface and a second support portion extended from the first support portion in a second direction perpendicular to the first direction;

a thermal diffusion member at least partially disposed in the placement space;

a printed circuit board at least partially disposed in an interior of the housing at a first side facing a third direction between a first diffusion portion of the thermal diffusion member and the rear cover, the third direction being opposite to the second direction with respect to the first support portion; and a battery at least partially disposed at a second side facing the second direction with respect to the first support portion between a second diffusion portion of the thermal diffusion member and the rear cover, the battery comprising a first battery portion having a first thickness and a second battery portion extended from the first battery portion in the third direction, the second battery portion having a second thickness less than the first thickness, wherein the second battery portion is at least partially disposed between the second support portion and the rear cover, and wherein the second support portion is at least partially disposed between the second diffusion portion of the thermal diffusion member and the second battery portion.

13. The electronic device of claim 12, wherein, when viewed in the first direction, the thermal diffusion member overlaps the first battery portion, the second battery portion, the first support portion, the second support portion, and the printed circuit board.

14. The electronic device of claim 12, wherein the first support portion is at least partially disposed between a third diffusion portion and the rear cover, the third diffusion portion being between the first diffusion portion and the second diffusion portion of the thermal diffusion member.

15. The electronic device of claim 12, wherein at least a part of the first support portion protrudes in the third direction.

16. The electronic device of claim 12, wherein the thermal diffusion member comprises a vapor chamber.

17. The electronic device of claim 12, wherein the second battery portion comprises a protection circuit module (PCM) configured to protect the battery from overcharge, overdischarge, and overcurrent.

18. The electronic device of claim 12, wherein the first battery portion comprises a plurality of cells.

19. The electronic device of claim 12, further comprising:

a flexible printed circuit board configured to electrically connect the printed circuit board and the second battery portion, wherein the flexible printed circuit board is at least partially disposed between the support portion and the rear cover.

20. The electronic device of claim 12, wherein the first diffusion portion and the second diffusion portion are configured to diffuse heat generated by the printed circuit board to other areas of the electronic device.

* * * * *